US011624107B2

(12) United States Patent
Lee et al.

(10) Patent No.: US 11,624,107 B2
(45) Date of Patent: Apr. 11, 2023

(54) THIN FILM DEPOSITION APPARATUS

(71) Applicant: Samsung Display Co., Ltd., Yongin-si (KR)

(72) Inventors: Choong-Ho Lee, Yongin-si (KR); Jung-Min Lee, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 159 days.

(21) Appl. No.: 16/907,695

(22) Filed: Jun. 22, 2020

(65) Prior Publication Data

US 2020/0318228 A1 Oct. 8, 2020

Related U.S. Application Data

(60) Continuation of application No. 15/857,365, filed on Dec. 28, 2017, now Pat. No. 10,689,746, which is a (Continued)

(30) Foreign Application Priority Data

May 22, 2009 (KR) .................. 10-2009-0045198
May 22, 2009 (KR) .................. 10-2009-0045200
(Continued)

(51) Int. Cl.
*C23C 14/04* (2006.01)
*C23C 16/04* (2006.01)
*C23C 14/24* (2006.01)

(52) U.S. Cl.
CPC .............. *C23C 14/04* (2013.01); *C23C 14/24* (2013.01); *C23C 14/243* (2013.01);
(Continued)

(58) Field of Classification Search
CPC ...... C23C 14/04; C23C 14/243; C23C 14/042
See application file for complete search history.

(56) References Cited

U.S. PATENT DOCUMENTS 4,416,217 A 11/1983 Nakamura et al.
4,687,939 A 8/1987 Miyauchi et al.
(Continued)

FOREIGN PATENT DOCUMENTS

CN 1358055 A 7/2002
CN 1489419 A 4/2004
(Continued)

OTHER PUBLICATIONS

European Search Report dated Sep. 6, 2010, issued in corresponding European Patent Application No. 10250962.7.
(Continued)

*Primary Examiner* — Joseph A Miller, Jr.
(74) *Attorney, Agent, or Firm* — Lewis Roca Rothgerber Christie LLP

(57) ABSTRACT

A thin film deposition apparatus used to produce large substrates on a mass scale and improve manufacturing yield. The thin film deposition apparatus includes a deposition source; a first nozzle disposed at a side of the deposition source and including a plurality of first slits arranged in a first direction; a second nozzle disposed opposite to the first nozzle and including a plurality of second slits arranged in the first direction; and a barrier wall assembly including a plurality of barrier walls arranged in the first direction so as to partition a space between the first nozzle and the second nozzle.

17 Claims, 33 Drawing Sheets

Related U.S. Application Data division of application No. 14/838,219, filed on Aug. 27, 2015, now Pat. No. 9,873,937, which is a division of application No. 12/784,804, filed on May 21, 2010, now Pat. No. 9,121,095.

(30) Foreign Application Priority Data

| | | |
|---|---|---|
| May 22, 2009 | (KR) | 10-2009-0045201 |
| Jun. 8, 2009 | (KR) | 10-2009-0050528 |
| Jun. 8, 2009 | (KR) | 10-2009-0050530 |
| Jun. 12, 2009 | (KR) | 10-2009-0052358 |
| Jun. 12, 2009 | (KR) | 10-2009-0052359 |
| Jun. 22, 2009 | (KR) | 10-2009-0055473 |

(52) U.S. Cl.
CPC ............ C23C 16/042 (2013.01); *C23C 16/04* (2013.01); *Y10T 29/49826* (2015.01); *Y10T 29/49828* (2015.01)

(56) References Cited

U.S. PATENT DOCUMENTS

| | | | |
|---|---|---|---|
| 4,792,378 | A | 12/1988 | Rose et al. |
| 4,901,667 | A | 2/1990 | Suzuki et al. |
| 5,184,319 | A | 2/1993 | Kramer |
| 5,742,129 | A | 4/1998 | Nagayama et al. |
| 6,045,671 | A | 4/2000 | Wu et al. |
| 6,091,195 | A | 7/2000 | Forrest et al. |
| 6,093,445 | A | 7/2000 | Nawate |
| 6,274,198 | B1 | 8/2001 | Dautartas |
| 6,280,821 | B1 | 8/2001 | Kadunce et al. |
| 6,371,451 | B1 | 4/2002 | Choi |
| 6,417,034 | B2 | 7/2002 | Kitazume et al. |
| 6,579,422 | B1 | 6/2003 | Kakinuma |
| 6,589,673 | B1 | 7/2003 | Kido et al. |
| 6,699,324 | B1 | 3/2004 | Berdin et al. |
| 6,749,906 | B2 | 6/2004 | Van Slyke |
| 6,837,939 | B1 | 1/2005 | Klug et al. |
| 6,878,209 | B2 | 4/2005 | Himeshima et al. |
| 6,946,783 | B2 | 9/2005 | Kim |
| 7,006,202 | B2 | 2/2006 | Byun et al. |
| RE39,024 | E | 3/2006 | Takahashi |
| 7,078,070 | B2 | 7/2006 | Peng |
| 8,137,466 | B2 | 3/2012 | Kang et al. |
| 8,158,189 | B2 | 4/2012 | Uetake |
| 8,177,912 | B2 | 5/2012 | Oda et al. |
| 8,188,476 | B2 | 5/2012 | Takagi et al. |
| 8,193,011 | B2 | 6/2012 | Kang et al. |
| 2001/0006827 | A1 | 7/2001 | Yamazaki et al. |
| 2001/0019807 | A1 | 9/2001 | Yamada et al. |
| 2001/0026638 | A1 | 10/2001 | Sangu et al. |
| 2001/0034175 | A1 | 10/2001 | Miyazaki et al. |
| 2002/0011785 | A1 | 1/2002 | Tang et al. |
| 2002/0017245 | A1 | 2/2002 | Tsubaki et al. |
| 2002/0036759 | A1 | 3/2002 | Ise et al. |
| 2002/0050061 | A1 | 5/2002 | Komyoji et al. |
| 2002/0076847 | A1 | 6/2002 | Yamada et al. |
| 2002/0168577 | A1 | 11/2002 | Yoon |
| 2002/0179013 | A1 | 12/2002 | Kido et al. |
| 2002/0187253 | A1 | 12/2002 | Marcus et al. |
| 2002/0197393 | A1 | 12/2002 | Kuwabara |
| 2003/0021886 | A1 | 1/2003 | Baele |
| 2003/0101932 | A1 | 6/2003 | Kang |
| 2003/0101937 | A1 | 6/2003 | Van Slyke et al. |
| 2003/0117602 | A1 | 6/2003 | Kobayashi et al. |
| 2003/0118950 | A1 | 6/2003 | Chao et al. |
| 2003/0168013 | A1 | 9/2003 | Freeman et al. |
| 2003/0221614 | A1 | 12/2003 | Kang et al. |
| 2003/0221620 | A1 | 12/2003 | Yamazaki |
| 2003/0232563 | A1 | 12/2003 | Kamiyama et al. |
| 2004/0029028 | A1 | 2/2004 | Shimizu |
| 2004/0056244 | A1 | 3/2004 | Marcus et al. |
| 2004/0086639 | A1 | 5/2004 | Grantham et al. |
| 2004/0096771 | A1 | 5/2004 | Kashiwagi et al. |
| 2004/0115338 | A1 | 6/2004 | Yoneda |
| 2004/0115342 | A1 | 6/2004 | Shigemura |
| 2004/0127066 | A1 | 7/2004 | Jung |
| 2004/0134428 | A1 | 7/2004 | Sasaki et al. |
| 2004/0142108 | A1 | 7/2004 | Atobe et al. |
| 2004/0144321 | A1 | 7/2004 | Grace et al. |
| 2004/0157167 | A1 | 8/2004 | Morii |
| 2004/0183435 | A1 | 9/2004 | Ohshita |
| 2004/0194702 | A1 | 10/2004 | Sasaki et al. |
| 2004/0195530 | A1 | 10/2004 | Kwak et al. |
| 2004/0216673 | A1 | 11/2004 | Sakata et al. |
| 2004/0255857 | A1 | 12/2004 | Chow et al. |
| 2005/0016461 | A1 | 1/2005 | Klug et al. |
| 2005/0031836 | A1 | 2/2005 | Hirai |
| 2005/0037136 | A1 | 2/2005 | Yamamoto |
| 2005/0072359 | A1 | 4/2005 | Kim |
| 2005/0072361 | A1* | 4/2005 | Yang ................... C23C 14/246 427/248.1 |
| 2005/0079418 | A1 | 4/2005 | Kelley et al. |
| 2005/0110400 | A1 | 5/2005 | Nakamura |
| 2005/0129489 | A1 | 6/2005 | Quan et al. |
| 2005/0153472 | A1 | 7/2005 | Yotsuya |
| 2005/0166842 | A1 | 8/2005 | Sakamoto |
| 2005/0166844 | A1 | 8/2005 | Gralenski |
| 2005/0183670 | A1 | 8/2005 | Grantham et al. |
| 2005/0213021 | A1 | 9/2005 | Myoung |
| 2005/0229848 | A1 | 10/2005 | Shinriki et al. |
| 2005/0244580 | A1 | 11/2005 | Cok et al. |
| 2005/0263074 | A1 | 12/2005 | Masuda et al. |
| 2005/0280792 | A1 | 12/2005 | Meyer |
| 2006/0011136 | A1 | 1/2006 | Yamazaki et al. |
| 2006/0022590 | A1 | 2/2006 | Aziz et al. |
| 2006/0040132 | A1 | 2/2006 | Liao et al. |
| 2006/0045958 | A1 | 3/2006 | Abiko et al. |
| 2006/0090705 | A1 | 5/2006 | Kim |
| 2006/0110544 | A1 | 5/2006 | Kim et al. |
| 2006/0113907 | A1 | 6/2006 | Im et al. |
| 2006/0130766 | A1 | 6/2006 | Kim et al. |
| 2006/0144325 | A1 | 7/2006 | Jung et al. |
| 2006/0152641 | A1 | 7/2006 | Brody |
| 2006/0162662 | A1 | 7/2006 | Sato et al. |
| 2006/0169211 | A1 | 8/2006 | Kim et al. |
| 2006/0174829 | A1 | 8/2006 | An et al. |
| 2006/0205101 | A1 | 9/2006 | Lee et al. |
| 2006/0269671 | A1 | 11/2006 | Kim et al. |
| 2006/0272572 | A1 | 12/2006 | Uematsu et al. |
| 2006/0280588 | A1 | 12/2006 | Blonigan et al. |
| 2007/0009552 | A1 | 1/2007 | Whitehead et al. |
| 2007/0017445 | A1 | 1/2007 | Takehara et al. |
| 2007/0022955 | A1 | 2/2007 | Bender et al. |
| 2007/0029558 | A1 | 2/2007 | Nishizono |
| 2007/0046185 | A1 | 3/2007 | Kim |
| 2007/0054044 | A1 | 3/2007 | Shimosaki et al. |
| 2007/0077358 | A1 | 4/2007 | Jeong et al. |
| 2007/0148337 | A1 | 6/2007 | Nichols et al. |
| 2007/0157879 | A1 | 7/2007 | Yotsuya |
| 2007/0158471 | A1 | 7/2007 | Park et al. |
| 2007/0163497 | A1 | 7/2007 | Grace et al. |
| 2007/0178708 | A1 | 8/2007 | Ukigaya |
| 2007/0190235 | A1 | 8/2007 | Yamazaki et al. |
| 2007/0231460 | A1 | 10/2007 | Ukigaya |
| 2008/0018236 | A1 | 1/2008 | Arai et al. |
| 2008/0100201 | A1 | 5/2008 | Wei et al. |
| 2008/0100204 | A1 | 5/2008 | Kim |
| 2008/0115729 | A1 | 5/2008 | Oda et al. |
| 2008/0118743 | A1 | 5/2008 | Lee et al. |
| 2008/0129194 | A1 | 6/2008 | Abe et al. |
| 2008/0131587 | A1 | 6/2008 | Boroson et al. |
| 2008/0145521 | A1 | 6/2008 | Guo et al. |
| 2008/0174235 | A1 | 7/2008 | Kim et al. |
| 2008/0216741 | A1 | 9/2008 | Ling et al. |
| 2008/0238294 | A1 | 10/2008 | Xu et al. |
| 2008/0261047 | A1 | 10/2008 | Shibata |
| 2008/0309718 | A1 | 12/2008 | Oya et al. |
| 2009/0017192 | A1 | 1/2009 | Matsuura |
| 2009/0074966 | A1 | 3/2009 | Henderson et al. |
| 2009/0165713 | A1 | 7/2009 | Kim et al. |

(56) References Cited

U.S. PATENT DOCUMENTS

| | | |
|---|---|---|
| 2009/0208754 A1 | 8/2009 | Chu et al. |
| 2009/0220691 A1 | 9/2009 | Kim |
| 2009/0229524 A1 | 9/2009 | Kim et al. |
| 2009/0232976 A1 | 9/2009 | Yoon et al. |
| 2009/0277386 A1 | 11/2009 | Takagi et al. |
| 2009/0279173 A1 | 11/2009 | Chui et al. |
| 2009/0304906 A1 | 12/2009 | Suduo et al. |
| 2010/0001301 A1 | 1/2010 | Karg et al. |
| 2010/0055810 A1 | 3/2010 | Sung et al. |
| 2010/0086672 A1 | 4/2010 | Von Drasek et al. |
| 2010/0165454 A1 | 7/2010 | Suetsugu et al. |
| 2010/0192856 A1 | 8/2010 | Sung et al. |
| 2010/0196607 A1 | 8/2010 | Carlson et al. |
| 2010/0271602 A1 | 10/2010 | Hanazaki |
| 2010/0297348 A1 | 11/2010 | Lee et al. |
| 2010/0297349 A1 | 11/2010 | Lee et al. |
| 2010/0310768 A1 | 12/2010 | Lee et al. |
| 2010/0330265 A1 | 12/2010 | Lee et al. |
| 2010/0330712 A1 | 12/2010 | Lee et al. |
| 2011/0033619 A1 | 2/2011 | Lee et al. |
| 2011/0033621 A1 | 2/2011 | Lee et al. |
| 2011/0045617 A1 | 2/2011 | Kang et al. |
| 2011/0048320 A1 | 3/2011 | Choi et al. |
| 2011/0052791 A1 | 3/2011 | Jo et al. |
| 2011/0052795 A1 | 3/2011 | Choi et al. |
| 2011/0053296 A1 | 3/2011 | Lee et al. |
| 2011/0123707 A1 | 5/2011 | Lee et al. |
| 2011/0220019 A1 | 9/2011 | Lee et al. |
| 2011/0262625 A1 | 10/2011 | Park et al. |
| 2012/0009328 A1 | 1/2012 | Ryu et al. |
| 2012/0009706 A1 | 1/2012 | Choi et al. |
| 2012/0083061 A1 | 4/2012 | Kang et al. |
| 2012/0145077 A1 | 6/2012 | Chang et al. |
| 2012/0313251 A1 | 12/2012 | Kato |

FOREIGN PATENT DOCUMENTS

| | | |
|---|---|---|
| CN | 1500904 A | 6/2004 |
| CN | 1556872 A | 12/2004 |
| CN | 1607868 A | 4/2005 |
| CN | 1704501 A | 12/2005 |
| CN | 1814854 A | 8/2006 |
| EP | 1 413 644 | 4/2004 |
| EP | 1 418 250 A2 | 5/2004 |
| EP | 1418250 * | 12/2004 |
| EP | 1 518 940 | 3/2005 |
| JP | 57-194252 | 11/1982 |
| JP | 2-247372 | 10/1990 |
| JP | 4-272170 | 8/1992 |
| JP | 5-230628 | 9/1993 |
| JP | 8-27568 | 1/1996 |
| JP | 09-095776 | 4/1997 |
| JP | 10-050478 | 2/1998 |
| JP | 2000-68054 | 3/2000 |
| JP | 2000-173769 A | 6/2000 |
| JP | 2001-52862 | 2/2001 |
| JP | 2001-93667 | 4/2001 |
| JP | 2002-75638 | 3/2002 |
| JP | 2002-175878 | 6/2002 |
| JP | 2002-348659 | 12/2002 |
| JP | 2003-3250 | 1/2003 |
| JP | 2003-77662 | 3/2003 |
| JP | 2003-157973 | 5/2003 |
| JP | 2003-197531 | 7/2003 |
| JP | 2003-293120 A | 10/2003 |
| JP | 2003-297562 | 10/2003 |
| JP | 2003-321767 | 11/2003 |
| JP | 2004-035964 | 2/2004 |
| JP | 2004-43898 | 2/2004 |
| JP | 2004-076150 | 3/2004 |
| JP | 2004-103269 | 4/2004 |
| JP | 2004-103341 | 4/2004 |
| JP | 2004-137583 | 5/2004 |
| JP | 2004-143521 | 5/2004 |
| JP | 2004-169169 | 6/2004 |
| JP | 2004-199919 | 7/2004 |
| JP | 2004-349101 | 12/2004 |
| JP | 2004-355975 | 12/2004 |
| JP | 2005-44592 | 2/2005 |
| JP | 2005-122980 | 5/2005 |
| JP | 2005-165015 | 6/2005 |
| JP | 2005-174843 | 6/2005 |
| JP | 2005-206939 | 8/2005 |
| JP | 2005-235568 | 9/2005 |
| JP | 2005-293968 | 10/2005 |
| JP | 2005-296797 | 10/2005 |
| JP | 2005-344146 A | 12/2005 |
| JP | 2006-28583 | 2/2006 |
| JP | 2006-172930 | 6/2006 |
| JP | 2006-176809 | 7/2006 |
| JP | 2006-210038 | 8/2006 |
| JP | 2006-225757 A | 8/2006 |
| JP | 2006-275433 | 10/2006 |
| JP | 2006-292955 | 10/2006 |
| JP | 2007-47293 | 2/2007 |
| JP | 2007-66862 | 3/2007 |
| JP | 2007-507601 A | 3/2007 |
| JP | 2007-146219 | 6/2007 |
| JP | 2007-186740 | 7/2007 |
| JP | 2007-227359 A | 9/2007 |
| JP | 2007-291506 | 11/2007 |
| JP | 2008-088490 A | 4/2008 |
| JP | 2008-108628 | 5/2008 |
| JP | 2008-121098 | 5/2008 |
| JP | 2008-121098 A | 5/2008 |
| JP | 2008-521165 | 6/2008 |
| JP | 2008-248301 A | 10/2008 |
| JP | 2008-300056 | 11/2008 |
| JP | 2009-19243 | 1/2009 |
| JP | 2009-24208 | 2/2009 |
| JP | 2009-049223 | 3/2009 |
| JP | 2009-81165 | 4/2009 |
| JP | 2009-87910 | 4/2009 |
| JP | 2009-170200 A | 7/2009 |
| JP | 2010-261081 | 11/2010 |
| KR | 10-0257219 | 2/2000 |
| KR | 10-2000-0019254 | 4/2000 |
| KR | 10-2000-0023929 | 5/2000 |
| KR | 2001-0024652 | 3/2001 |
| KR | 10-2001-0059939 | 7/2001 |
| KR | 10-2001-0092914 | 10/2001 |
| KR | 2001-0093666 | 10/2001 |
| KR | 20-0257218 | 12/2001 |
| KR | 10-2002-0000201 | 1/2002 |
| KR | 10-2002-0001555 | 1/2002 |
| KR | 10-2002-0050922 | 6/2002 |
| KR | 10-2002-0090934 | 12/2002 |
| KR | 2003-0001745 | 1/2003 |
| KR | 2003-0034730 | 5/2003 |
| KR | 2003-0046090 | 6/2003 |
| KR | 2003-0069684 | 8/2003 |
| KR | 10-0405080 | 11/2003 |
| KR | 10-2003-0091947 | 12/2003 |
| KR | 10-2003-0093959 | 12/2003 |
| KR | 2003-0094003 | 12/2003 |
| KR | 10-20040014258 | 2/2004 |
| KR | 10-2004-0034537 | 4/2004 |
| KR | 10-2004-0050045 | 6/2004 |
| KR | 10-2004-0069281 | 8/2004 |
| KR | 10-2004-0084747 | 10/2004 |
| KR | 10-2004-0087142 | 10/2004 |
| KR | 10-0463212 | 12/2004 |
| KR | 10-0483487 B1 | 4/2005 |
| KR | 10-2005-0062853 | 6/2005 |
| KR | 10-0520159 | 10/2005 |
| KR | 10-2006-0008602 | 1/2006 |
| KR | 10-2006-0018745 | 3/2006 |
| KR | 10-2006-0020050 | 3/2006 |
| KR | 10-2006-0049050 | 5/2006 |
| KR | 10-2006-0056706 | 5/2006 |
| KR | 10-2006-0058459 | 5/2006 |
| KR | 10-2006-0059068 | 6/2006 |
| KR | 10-2006-0060994 | 6/2006 |
| KR | 10-2006-0065978 | 6/2006 |

(56) References Cited

FOREIGN PATENT DOCUMENTS

| KR | 10-2006-0073367 | 6/2006 |
|---|---|---|
| KR | 10-2006-0080475 | 7/2006 |
| KR | 10-2006-0080481 | 7/2006 |
| KR | 10-2006-0080482 | 7/2006 |
| KR | 10-2006-0083510 | 7/2006 |
| KR | 10-2006-0098755 | 9/2006 |
| KR | 10-2006-0104288 | 10/2006 |
| KR | 10-2006-0104675 | 10/2006 |
| KR | 10-2006-0104677 | 10/2006 |
| KR | 10-2006-0109627 | 10/2006 |
| KR | 10-0635903 B1 | 10/2006 |
| KR | 10-2006-0114462 | 11/2006 |
| KR | 10-0645719 | 11/2006 |
| KR | 10-0646160 | 11/2006 |
| KR | 10-2006-0123944 | 12/2006 |
| KR | 10-0687007 | 2/2007 |
| KR | 10-2007-0025164 | 3/2007 |
| KR | 10-0696547 | 3/2007 |
| KR | 10-0696550 | 3/2007 |
| KR | 10-0697663 B1 | 3/2007 |
| KR | 10-0698033 | 3/2007 |
| KR | 10-0700466 | 3/2007 |
| KR | 10-2007-0035796 | 4/2007 |
| KR | 10-0711885 | 4/2007 |
| KR | 10-2007-0050793 | 5/2007 |
| KR | 10-0723627 | 5/2007 |
| KR | 10-0726132 | 6/2007 |
| KR | 10-2007-0078713 | 8/2007 |
| KR | 10-2007-0080635 | 8/2007 |
| KR | 10-2006-0028115 | 10/2007 |
| KR | 10-2007-0097218 | 10/2007 |
| KR | 10-2007-0101842 | 10/2007 |
| KR | 10-2007-0105595 | 10/2007 |
| KR | 10-0770653 | 10/2007 |
| KR | 10-2007-0112668 | 11/2007 |
| KR | 10-0739309 | 12/2007 |
| KR | 10-0787457 | 12/2007 |
| KR | 10-2008-0001184 | 1/2008 |
| KR | 10-2008-003720 | 1/2008 |
| KR | 10-0797787 | 1/2008 |
| KR | 10-0800125 | 1/2008 |
| KR | 10-0815265 | 3/2008 |
| KR | 10-2008-0036983 | 4/2008 |
| KR | 10-0823508 | 4/2008 |
| KR | 10-2008-0044775 | 5/2008 |
| KR | 10-0827760 | 5/2008 |
| KR | 10-2008-0048653 | 6/2008 |
| KR | 10-2008-0055124 | 6/2008 |
| KR | 10-0839380 | 6/2008 |
| KR | 10-2008-0060400 | 7/2008 |
| KR | 10-2008-0061132 | 7/2008 |
| KR | 10-2008-0061666 | 7/2008 |
| KR | 10-2008-0061774 | 7/2008 |
| KR | 10-2008-0062212 | 7/2008 |
| KR | 10-2008-0109559 | 12/2008 |
| KR | 10-0889872 | 3/2009 |
| KR | 10-2009-0038733 | 4/2009 |
| KR | 10-2009-0040618 | 4/2009 |
| KR | 10-2009-0052155 | 5/2009 |
| KR | 10-2009-0053417 | 5/2009 |
| KR | 10-2009-0066996 | 6/2009 |
| KR | 10-2009-0079765 | 7/2009 |
| KR | 10-0908232 | 7/2009 |
| KR | 10-2009-0093161 | 9/2009 |
| KR | 10-2009-0097453 | 9/2009 |
| KR | 10-2009-0098186 | 9/2009 |
| KR | 10-2010-0000128 | 1/2010 |
| KR | 10-2010-0000129 | 1/2010 |
| KR | 10-2010-0002381 | 1/2010 |
| KR | 10-2010-0026655 | 3/2010 |
| KR | 10-2010-0047796 | 5/2010 |
| KR | 10-2010-0090070 | 8/2010 |
| KR | 10-2010-0099806 | 9/2010 |
| KR | 10-2010-0126125 | 12/2010 |
| KR | 10-2011-0101767 | 9/2011 |
| KR | 10-2012-006324 | 1/2012 |
| KR | 10-2012-0065789 | 6/2012 |
| WO | WO 99/25894 | 5/1999 |
| WO | WO2008/004792 | 1/2008 |

OTHER PUBLICATIONS

European Search Report dated May 20, 2011, for European Patent application 10251404.9, noting Category X reference 2005/0263074, listed in this IDS, 12 pages.

European Search Report dated May 13, 2011, for European Patent application 11250019.4, noting Category X reference EP 1 413 644, 6 pages.

European Search Report dated Sep. 6, 2010 for European Application No. 10250962.7 (5 pages).

Japanese Office action dated Aug. 21, 2012, issued to JP Application No. 2010-145075 (5 pages).

Japanese Office action dated Feb. 25, 2014, for corresponding Japanese Patent application 2013-128405 (3 pages).

Japanese Office action dated Jan. 22, 2013, for corresponding Japanese Patent application 2010-116470 (3 pages).

Japanese Office action dated Jan. 28, 2014, for corresponding Japanese Patent application 2011-097909 (4 pages).

Japanese Office action dated Jan. 8, 2013, for Japanese Patent application 2011-000180, (3 pages).

Japanese Office action dated Mar. 19, 2013, for Japanese Patent application 2011-097909, (3 pages).

Japanese Office action dated Sep. 4, 2012, issued to JP Application No. 2010-152846 (4 pages).

KIPO Notice of Allowance dated Apr. 30, 2012, issued to KR 10-2010-0066992 (5 pages).

KIPO Notice of Allowance dated Jul. 20, 2012, issued to KR 10-2010-0003545 (5 pages).

KIPO Notice of Allowance dated Oct. 27, 2011 for Korean Application No. 10-2010-0002381 (5 pages).

KIPO Notice of Allowance dated Sep. 1, 2012, issued to KR 10-2010-0009160 (5 pages).

KIPO Notice of Allowance dated Sep. 1, 2012, issued to KR 10-2010-0013848 (5 pages).

KIPO Notice of Allowance dated Sep. 23, 2011 for Korean Application No. 10-2009-0055473 (5 pages).

KIPO Notice of Allowance dated Sep. 28, 2011 for Korean Application No. 10-2009-0045201 (5 pages).

KIPO Notice of Allowance dated Sep. 28, 2011 for Korean Application No. 10-2009-0052359 (5 pages).

KIPO Notice of Allowance, dated Nov. 25, 2011, issued to KR 10-2010-0014277 (5 pages).

KIPO Notice of Allowance, dated Sep. 1, 2012, issued to KR 10-2010-0014276 (5 pages).

KIPO Notice of Allowance, dated Sep. 28, 2011 issued to KR 10-2009-0052357 (5 pages).

KIPO Office action dated Apr. 2, 2012, issued to KR 10-2010-0066993 (4 pages).

KIPO Office action dated Aug. 1, 2011, issued to KR 10-2009-0074001 (3 pages).

KIPO Office action dated Aug. 28, 2012, issued to KR 10-2010-0014274 (5 pages).

KIPO Office action dated Feb. 1, 2012, issued to KR 10-2010-0011196 (4 pages).

KIPO Office action dated Feb. 1, 2012, issued to KR 10-2010-0013848 (4 pages).

KIPO Office action dated Feb. 1, 2012, issued to KR 10-2010-0014272 (4 pages).

KIPO Office Action dated Feb. 6, 2012, issued to KR 10-2010-0014274 (9 pages).

KIPO Office Action dated Feb. 6, 2012, issued to KR 10-2010-0021835 (4 pages).

KIPO Office action dated Jan. 13, 2012, issued to KR 10-2009-0056529 (5 pages).

KIPO Office action dated Jul. 1, 2011 for corresponding Korean Patent application 10-2009-0072111, 4 pages.

(56) References Cited

OTHER PUBLICATIONS

KIPO Office action dated Jul. 1, 2011, issued to KR Application No. 10-2009-0072111 (4 pages).
KIPO Office action dated Jun. 1, 2011 for Korean priority Patent application 10-2009-0050528, 4 pages.
KIPO Office action dated Jun. 1, 2011, issued to KR Application No. 10-2009-0050528 (4 pages).
KIPO Office action dated Sep. 1, 2012, issued to KR 10-2010-0010136 (5 pages).
KIPO Registration Determination Certificate dated Oct. 27, 2011, for Korean priority Patent application 10-2010-0002381, corresponding to cross reference U.S. Appl. No. 12/979,656, 5 pages.
KIPO Registration Determination Certificate dated Sep. 23, 2011, for Korean priority Patent application 10-2009-0055473, 5 pages.
KIPO Registration Determination Certificate dated Sep. 28, 2011, for Korean priority Patent application 10-2009-0052359, 5 pages.
KIPO Registration Determination Certificate dated Sep. 28, 2011, for Korean priority Patent application 10-2009-0045200, 5 pages.
KIPO Registration Determination Certificate dated Sep. 28, 2011, for Korean priority Patent application 10-2009-0045201, 5 pages.
Korean Registration Certificate dated Sep. 28, 2011 for Korean Application No. 10-2009-0045200 (5 pages).
Patent Abstracts of Japan, and English machine translation of Japanese Publication 2004-349101 listed above (11 pages).
SIPO Certificate of Patent dated Jul. 31, 2013, corresponding to Chinese Patent application 201110029291.3, (31 pages).
SIPO Office action dated Feb. 14, 2014, for corresponding Chinese Patent Application No. 201010189614.0, (16 pages).
SIPO Office action dated Feb. 14, 2014, for corresponding Chinese Patent application 201010189614.0 (16 pages).
SIPO Office action dated Mar. 11, 2014, for corresponding Chinese Patent application 201010189581.X (9 pages).
SIPO Office Action dated May 29, 2013, for Chinese Application No. 201010189614.0 (12 pages).
SIPO Office action dated May 29, 2013, for corresponding Chinese Patent application 201010189614.0, (12 pages).
SIPO Office Action dated Nov. 28, 2012 for Chinese Application No. 201110029291.3 (11 pages).
SIPO Office action dated Nov. 28, 2012, for Chinese Patent application 201110029291.3, (11 pages).
Taiwanese Office action dated Dec. 20, 2013, for corresponding Taiwan Patent application 099116077, (8 pages).
Taiwanese Office action dated Dec. 20, 2013, for Taiwanese Patent application 099116077 (8 pages).
U.S. Interview Summary dated Mar. 11, 2014 for U.S. Appl. No. 12/813,786 (4 pages).
U.S. Notice of Allowance dated Jan. 27, 2014 for U.S. Appl. No. 12/987,569 (9 pages).
U.S. Office action dated Apr. 1, 2013, issued to U.S. Appl. No. 12/784,774 (44 pages).
U.S. Office action dated Aug. 13, 2013, issued to U.S. Appl. No. 13/194,759, (28 pages).
U.S. Office action dated Aug. 7, 2013, issued to U.S. Appl. No. 13/015,357, (30 pages).
U.S. Office action dated Aug. 8, 2013, for cross reference U.S. Appl. No. 13/093,707, (7 pages).
U.S. Office Action dated Dec. 13, 2011 for U.S. Appl. No. 12/849,193 (30 pages).
U.S. Office action dated Dec. 13, 2011, for cross-reference U.S. Appl. No. 12/849,193, 30 pages.
U.S. Office action dated Dec. 16, 2013 for U.S. Appl. No. 14/054,536 (35 pages).
U.S. Office action dated Dec. 17, 2012, issued to U.S. Appl. No. 12/873,556 (37 pages).
U.S. Office action dated Dec. 26, 2012, issued to U.S. Appl. No. 12/815,673 (21 pages).
U.S. Office action dated Jul. 15, 2013, for cross reference U.S. Appl. No. 12/784,774, (30 pages).
U.S. Office action dated Jun. 11, 2013, for cross reference U.S. Appl. No. 12/979,656, (50 pages).
U.S. Office action dated Mar. 23, 2012, for cross reference U.S. Appl. No. 12/849,193, 17 pages.
U.S. Office action dated Nov. 22, 2013, for cross reference U.S. Appl. No. 12/784,774, (25 pages).
KIPO Office action dated Apr. 30, 2012, issued to KR-10-2010-0066992 (5 pages).
U.S. Office action dated Feb. 11, 2014, for cross reference U.S. Appl. No. 13/178,472 (8 pages).
U.S. Office action dated Feb. 26, 2013, issued to U.S. Appl. No. 12/794,093 (31 pages).
U.S. Office action dated Feb. 6, 2014, for U.S. Appl. No. 12/984,231 (16 pages).
U.S. Office action dated Jan. 25, 2013, issued to U.S. Appl. No. 13/015,357 (21 pages).
U.S. Office action dated Jul. 11, 2013 for U.S. Appl. No. 13/461,669 (27 pages).
U.S. Office action dated Jul. 17, 2013, issued to U.S. Appl. No. 12/984,231, (18 pages).
U.S. Office action dated Jul. 24, 2013, issued to U.S. Appl. No. 12/784,804, (52 pages).
U.S. Office action dated Jul. 3, 2013 in U.S. Appl. No. 12/873,689 (48 pages).
U.S. Office action dated Jul. 5, 2013, issued to U.S. Appl. No. 12/873,556, (17 pages).
U.S. Office Action dated Jun. 11, 2013 for U.S. Appl. No. 12/979,656 (50 pages).
U.S. Office action dated Jun. 11, 2013, issued to U.S. Appl. No. 12/862,125 (37 pages).
U.S. Office action dated Jun. 26, 2013, issued to U.S. Appl. No. 12/794,093 (20 pages).
U.S. Office action dated Mar. 15, 2013, issued to U.S. Appl. No. 12/813,786 (33 pages).
U.S. Office action dated Mar. 18, 2013, issued to U.S. Appl. No. 12/984,231 (29 pages).
U.S. Office action dated Mar. 19, 2013, issued to U.S. Appl. No. 13/194,759 (36 pages).
U.S. Office action dated Mar. 22, 2013, issued to U.S. Appl. No. 12/987,569 (12 pages).
U.S. Office action dated May 24, 2013, issued to U.S. Appl. No. 12/849,092 (31 pages).
U.S. Office Action dated May 7, 2013, issued in U.S. Appl. No. 12/820,270 (37 pages).
U.S. Office action dated Nov. 22, 2013, issued to U.S. Appl. No. 13/198,591, (28 pages).
U.S. Office action dated Nov. 25, 2013, issued to U.S. Appl. No. 13/176,701, (49 pages).
U.S. Office action dated Oct. 1, 2013, issued to U.S. Appl. No. 12/849,092, (13 pages).
U.S. Office action dated Oct. 11, 2013, issued to U.S. Appl. No. 12/907,396, (44 pages).
U.S. Office action dated Oct. 21, 2013, issued to U.S. Appl. No. 12/987,569, (14 pages).
U.S. Office action dated Sep. 20, 2013, issued to U.S. Appl. No. 13/014,225, (33 pages).
U.S. Notice of Allowance, dated Mar. 18, 2013, issued to U.S. Appl. No. 12/795,001 (29 pages).
U.S. Office action dated Dec. 20, 2012, issued to U.S. Appl. No. 12/984,289 (20 pages).
U.S. Office action dated Sep. 12, 2012, in U.S. Appl. No. 12/815,673 (26 pages).
U.S. Office action dated Dec. 30, 2016, in U.S. Appl. No. 14/838,219 (11 pages).
U.S. Final Office action dated May 4, 2017, in U.S. Appl. No. 14/838,219 (11 pages).
U.S. Advisory Action and Interview Summary dated Aug. 2, 2017, in U.S. Appl. No. 14/838,219 (5 pages).
U.S. NOA dated Sep. 8, 2017, in U.S. Appl. No. 14/838,219 (10 pages).

* cited by examiner

THIN FILM DEPOSITION APPARATUS

CROSS-REFERENCE TO RELATED APPLICATIONS

This application is a continuation of U.S. patent application Ser. No. 15/857,365, filed Dec. 28, 2017, which is a divisional of U.S. patent application Ser. No. 14/838,219, filed Aug. 27, 2015, now U.S. Pat. No. 9,873,937, which is a divisional of U.S. patent application Ser. No. 12/784,804, filed on May 21, 2010, now U.S. Pat. No. 9,121,095, which claims the benefit of and priority to each of Korean Application Nos. 10-2009-0045198, filed May 22, 2009, No. 10-2009-0045200, filed May 22, 2009, No. 10-2009-0045201, filed May 22, 2009, No. 10-2009-0050528, filed Jun. 8, 2009, No. 10-2009-0050530, filed Jun. 8, 2009, No. 10-2009-0052358, filed Jun. 12, 2009, No. 10-2009-0052359, filed Jun. 12, 2009, and No. 10-2009-0055473, filed Jun. 22, 2009, in the Korean Intellectual Property Office, the disclosures of each of which are incorporated herein in their entirety by reference.

BACKGROUND OF THE INVENTION

1. Field of the Invention

Aspects of the present invention relate to a thin film deposition apparatus, and more particularly, to an apparatus to deposit a thin film on a substrate.

2. Description of the Related Art

Organic light-emitting display devices have a larger viewing angle, better contrast characteristics, and a faster response rate than other display devices, and thus have drawn attention as a next-generation display device. Organic light-emitting display devices generally have a stacked structure including an anode, a cathode, and an emission layer interposed between the anode and the cathode. Organic light-emitting display devices display images in color when holes and electrons, injected respectively from the anode and the cathode, recombine in the emission layer, thereby emitting light. However, it is difficult to achieve high light-emission efficiency with such a structure, and thus intermediate layers, including an electron injection layer, an electron transport layer, a hole transport layer, a hole injection layer, and the like, are optionally additionally interposed between the emission layer and each of the electrodes.

An organic light-emitting display device includes intermediate layers, including an emission layer disposed between a first electrode and a second electrode that are arranged opposite to each other. The electrodes and the intermediate layers may be formed via various methods, one of which is a deposition method. When an organic light-emitting display device is manufactured via the deposition method, a fine metal mask (FMM) having the same pattern as a thin film to be formed is disposed to closely contact a substrate, and a thin film material is deposited over the FMM in order to form the thin film having the desired pattern.

SUMMARY OF THE INVENTION

Aspects of the present invention provide a thin film deposition apparatus that may be easily manufactured, that may be easily used to produce large substrates on a mass scale, that improves manufacturing yield and deposition efficiency, and that allows deposited materials to be reused.

According to an aspect of the present invention, a thin film deposition apparatus to form a thin film on a substrate is provided. The thin film deposition apparatus includes a deposition source to discharge a deposition material, a first nozzle disposed at a side of the deposition source and including a plurality of first slits arranged in a first direction, a second nozzle disposed opposite to the first nozzle and including a plurality of second slits arranged in the first direction, and a barrier wall assembly including a plurality of barrier walls arranged in the first direction between the first nozzle and the second nozzle so as to partition a space between the first nozzle and the second nozzle into a plurality of sub-deposition spaces.

Each of the barrier walls may extend in a second direction substantially perpendicular to the first direction, so as to partition the space between the first and second nozzles into the sub-deposition spaces.

At least one of the first slits may be located between each two adjacent barrier walls. At least two of the second slits may be located between each two adjacent barrier walls.

The number of the second slits disposed between each two adjacent barrier walls may be greater than the number of the first slits disposed between each two adjacent barrier walls. The total number of the second slits may be greater than the total number of the first slits.

The barrier walls may be arranged at equal intervals. The barrier walls may be separated from the second nozzle by a predetermined distance.

The barrier wall assembly may further include a cooling member.

The cooling member may include a cooling fin formed to protrude from an outer surface of the barrier wall assembly.

The thin film deposition apparatus may further include a second nozzle frame bound to the second nozzle and supporting the second nozzle.

The second nozzle frame may exert a tensile force on the second nozzle.

The second nozzle may be bound to the second nozzle frame in a state where an initial tensile force is applied to the second nozzle and a compression force is applied to the second nozzle frame, the initial tensile force being in equilibrium with the compression force, and then the second nozzle and the second nozzle frame may be relieved from the initial tensile force and the compression force, so that the tensile force is exerted on the second nozzle.

A temperature of the second nozzle frame may be maintained substantially constant during a deposition process.

The second nozzle frame may further include a radiation fin.

The thin film deposition apparatus may further include a thermal shield disposed between the deposition source and the second nozzle frame.

The barrier wall assembly may be detachable from the thin film deposition apparatus.

The thin film deposition apparatus may be disposed in a vacuum chamber.

The second nozzle may be separated by a predetermined distance from the substrate.

The deposition source, the first nozzle, the second nozzle, and the barrier wall assembly may be movable relative to the substrate.

The deposition material may be deposited on the substrate while the deposition source, the first nozzle, the second nozzle, and the barrier wall assembly are moved relative to the substrate.

The deposition source, the first nozzle, the second nozzle, and the barrier wall assembly may be moved relative to the substrate along a plane parallel to a surface of the substrate.

The deposition material vaporized in the deposition source may pass through the first nozzle and the second nozzle and may then be deposited on the substrate.

The thin film deposition apparatus may further include a pluraltiy of calibration plates disposed between the first nozzle and the second nozzle and blocking at least one portion of the deposition material discharged from the deposition source.

The calibration plates may be disposed in such a manner that portions of the thin film defined by the sub-deposition spaces, respectively, have identical thicknesses.

Each of the calibration plates may be formed to be lower in height the further away from a center of each of the sub-deposition spaces.

Each of the calibration plates may have a circular arc or cosine curve shape.

A height of each of the calibration plates may be less at the center of each of the sub-deposition spaces than at both ends of each of the sub-deposition spaces.

The calibration plates may be disposed in such a manner that the deposition material is blocked more at the center of each of the sub-deposition spaces than at the ends of each of the sub-deposition spaces.

Each of the calibration plates may be disposed between two adjacent barrier walls.

The calibration plates may be formed in the sub-deposition spaces, respectively, and a size or shape of the calibration plate disposed in each of the sub-deposition spaces may be changeable according to the characteristics of the deposition material discharged through the at least one first slit arranged in each of the sub-deposition spaces.

The size or shape of the calibration plate disposed in each of the sub-deposition spaces may be changeable so that portions of the thin film respectively defined by the sub-deposition spaces have identical thicknesses.

Deposition may be performed while the deposition source, the first nozzle, the second nozzle, and the barrier wall assembly are moved relative to the substrate. The barrier walls may be arranged to be inclined with respect to a moving direction of the thin film deposition apparatus.

The barrier walls may be arranged to be inclined at an acute angle with respect to the moving direction.

The barrier walls may be arranged to be inclined by about 1° to 10° with respect to the moving direction. The barrier walls may be arranged to be inclined with respect to the first direction.

A direction in which a longitudinal cross-section of each of the barrier walls extends may not be perpendicular to the first direction.

An angle between a direction in which a longitudinal cross-section of each of the barrier walls extends and the first direction may be an acute angle. An angle between a direction in which a longitudinal cross-section of each of the barrier walls extends and the first direction may be about 80° to 89°.

The thin film deposition apparatus may further include a plurality of radiation members to cool the barrier walls.

The radiation members may be disposed on external surfaces of the barrier walls.

Each of the barrier walls may include a cavity formed therein.

The radiation members may be disposed within the cavities of the barrier walls. The radiation members may contact internal surface of the cavities. The radiation members may be disposed on external and internal surfaces of the barrier walls.

The radiation members may include cooling pipes.

The deposition source may include a first deposition source to discharge a host material; and a second deposition source disposed parallel to the first deposition source to discharge a dopant material.

The at least one portion of the host material discharged from the first deposition source may be mixed with at least one portion of the dopant material discharged from the second deposition source.

The thin film deposition apparatus may further include a separation member disposed between the first deposition source and the second deposition source, and limiting the range of the host material discharged from the first deposition source and the dopant material discharged from the second deposition source.

Mixing amounts of the host material discharged from the first deposition source and the dopant material discharged from the second deposition source may be controlled by controlling a length of the separation member.

The substrate may include a host deposition region in which only the host material is deposited; an overlap region in which the host material and the dopant material are mixed; and a dopant deposition region in which only the dopant material is deposited.

A first thin film, a second thin film, and a third thin film may be stacked on the substrate while the first deposition source and the second deposition source are moved relative to the substrate, where the first thin film is formed of only the host material, the second thin film is formed as a mixture layer of the host material and the dopant material, and the third thin film is formed of only the dopant material.

The first nozzle may include two rows of a plurality of first slits arranged in the first direction.

The barrier wall assembly may include a first barrier wall assembly including a plurality of first barrier walls; and a second barrier wall assembly including a plurality of second barrier walls.

The first barrier walls and the second barrier walls may extend in the second direction substantially perpendicular to the first direction, as order to partition the space between the first nozzle and the second nozzle into the plurality of sub-deposition spaces.

The first barrier walls may be arranged to correspond to the second barrier walls, respectively.

Each pair of the corresponding first and second barrier walls may be arranged on substantially the same plane.

According to another aspect of the present invention, a thin film deposition apparatus to form a thin film on a substrate is provided. The thin film deposition apparatus includes a deposition source; a first nozzle and a second nozzle disposed at a side of the deposition source to face each other, where a plurality of slits are formed in the first and second nozzles in a first direction; a first barrier wall assembly including a plurality of first barrier walls arranged between the first nozzle and the second nozzle; and a second barrier wall assembly including a plurality of second barrier walls arranged between the first barrier walls and the second nozzle. The second nozzle is separated from the substrate by a predetermined distance, and the deposition source, the first nozzle, the second nozzle, and the first and second barrier wall assemblies are movable relative to the substrate.

The first barrier walls and the second barrier walls may extend in a second direction substantially perpendicular to the first direction, so as to partition a space between the first nozzle and the second nozzle.

The first barrier walls may be arranged to correspond to the second barrier walls, respectively.

Each pair of corresponding first and second barrier walls may be arranged on substantially the same plane.

The first barrier walls and the second barrier walls may be respectively arranged at equal intervals.

The first barrier walls may be separated from the second barrier walls by a predetermined distance.

The second barrier walls may be separated from the second nozzle by a predetermined distance.

The first nozzle may include a plurality of first slits arranged in the first direction, and the second nozzle may include a plurality of second slits arranged in the first direction.

The first barrier walls and the second barrier walls may be arranged in the first direction so as to partition a space between the first nozzle and the second nozzle.

A deposition material may be deposited on the substrate while the deposition source, the first nozzle, the second nozzle, the first barrier wall assembly, and the second barrier wall assembly are moved relative to the substrate.

The deposition source, the first nozzle, the second nozzle, the first barrier wall assembly, and the second barrier wall assembly may be moved relative to the substrate along a plane parallel to a surface of the substrate.

A thickness of the first barrier walls in the first direction may be greater than a thickness of the second barrier walls in the first direction.

A width of the second barrier walls in the first direction may be less than an interval between two adjacent second slits.

An interval between two adjacent second slits may be greater than a width of the second barrier walls in the first direction and may be less than a width of the first barrier walls in the first direction.

Each of the second barrier walls is located between two adjacent second slits.

Each of the second barrier walls may be located at a midpoint between two adjacent second slits.

The thin film deposition apparatus may further include a plurality of barriers disposed between the first barrier walls and the second barrier walls in the first direction.

The barriers may be disposed at end portions of the first barrier walls opposite to the second barrier walls.

A width of the barriers is in proportion to the thickness of the first barrier walls.

The barriers may be separated from the first barrier walls and the second barrier walls by a predetermined distance.

A width of the barriers may be in proportion to the distance between the first barrier walls and the second barrier walls.

The barriers may be disposed substantially perpendicular to the first barrier walls. The barriers may be formed integrally with the first barrier walls.

Additional aspects and/or advantages of the invention will be set forth in part in the description which follows and, in part, will be obvious from the description, or may be learned by practice of the invention.

BRIEF DESCRIPTION OF THE DRAWINGS

These and/or other aspects and advantages of the invention will become apparent and more readily appreciated from the following description of the embodiments, taken in conjunction with the accompanying drawings of which.

DETAILED DESCRIPTION OF THE EMBODIMENTS

Figure 1:
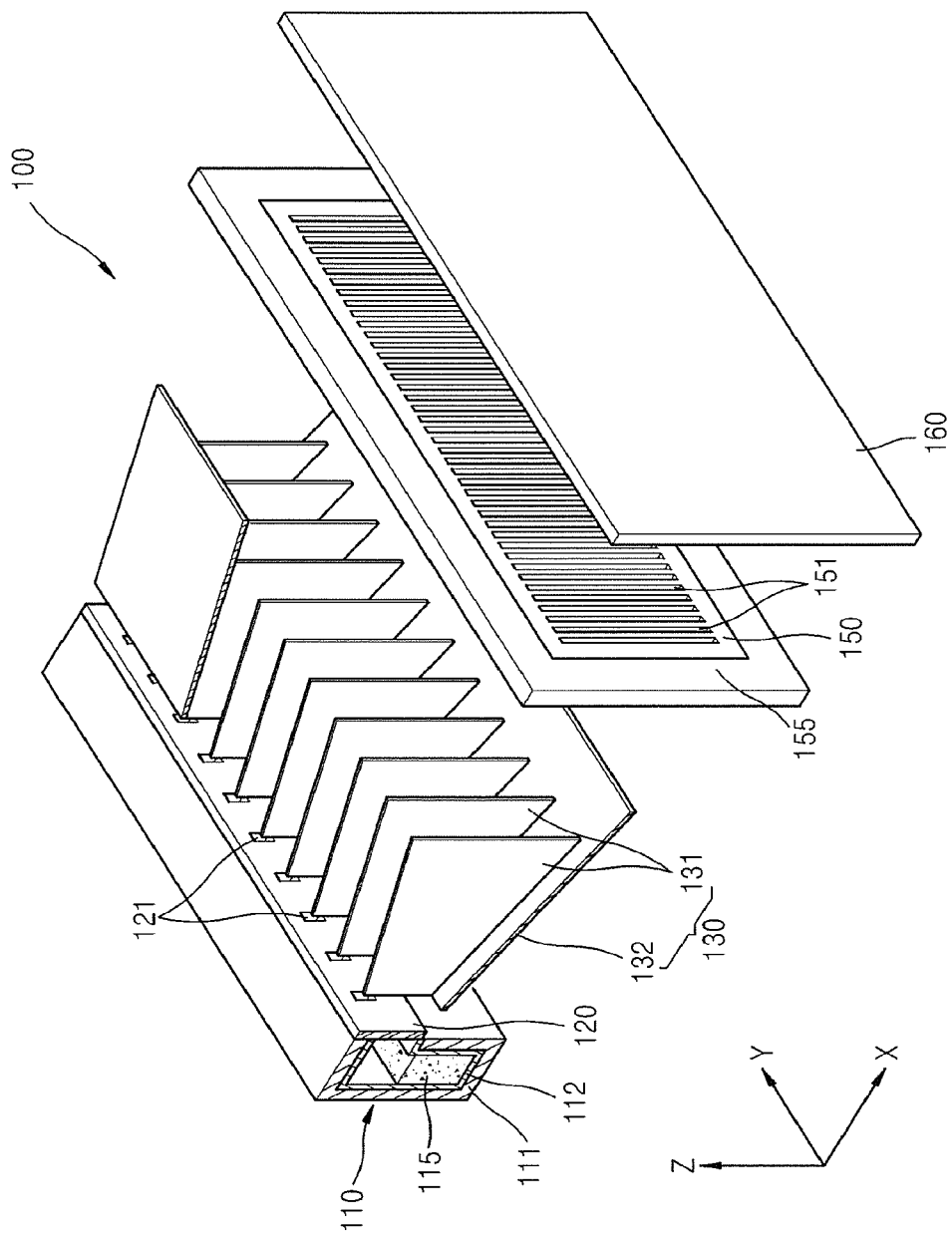
FIG. 1 is a schematic perspective view of a thin film deposition apparatus according to an embodiment of the present invention.

Reference will now be made in detail to the present embodiments of the present invention, examples of which are illustrated in the accompanying drawings, wherein like reference numerals refer to the like elements throughout. The embodiments are described below in order to explain the present invention by referring to the figures. Moreover, it is to be understood that where is stated herein that one film or layer is "formed on" or "disposed on" a second layer or film, the first layer or film may be formed or disposed directly on the second layer or film or there may be intervening layers or films between the first layer or film and the second layer or film. Further, as used herein, the term "formed on" is used with the same meaning as "located on" or "disposed on" and is not meant to be limiting regarding any particular fabrication process.

Figure 2:
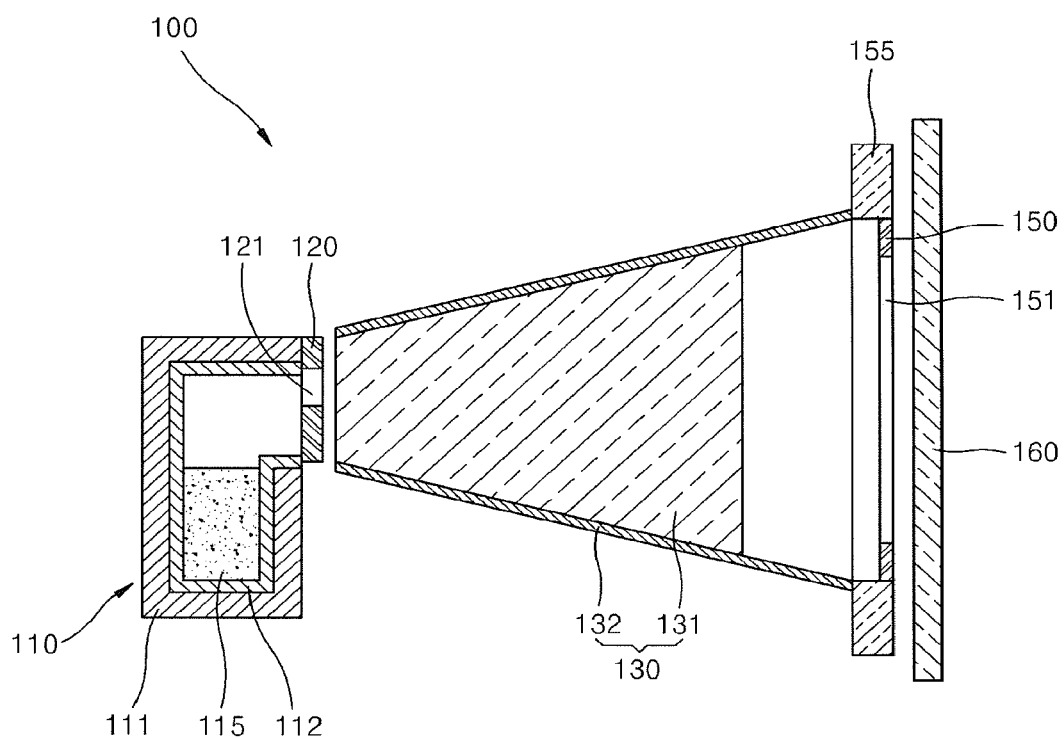
FIG. 2 is a schematic side view of the thin film deposition apparatus of FIG. 1.
Figure 3:
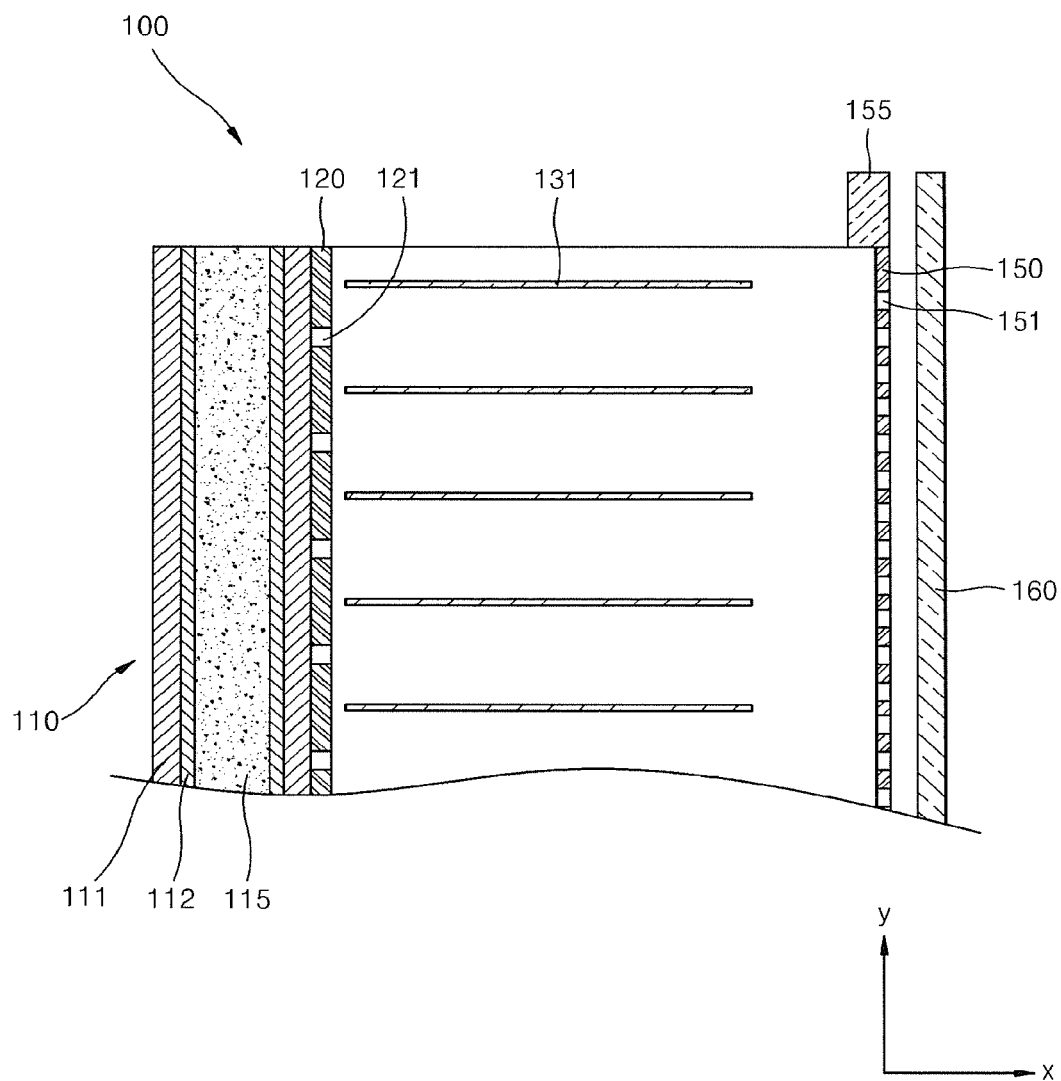
FIG. 3 is a schematic plan view of the thin film deposition apparatus of FIG. 1.

FIG. 1 is a schematic perspective view of a thin film deposition apparatus 100 according to an embodiment of the present invention. FIG. 2 is a schematic side view of the thin film deposition apparatus 100. FIG. 3 is a schematic plan view of the thin film deposition apparatus 100.

Referring to FIGS. 1, 2 and 3, the thin film deposition apparatus 100 includes a deposition source 110, a first nozzle 120, a barrier wall assembly 130, a second nozzle 150, and a second nozzle frame 155. A substrate 160 upon which a deposition material 115 is deposited is also shown. According to other aspects of the present invention, the thin film deposition apparatus 100 may include additional and/or different components, such as in the examples described below.

Although a chamber is not illustrated in FIGS. 1, 2 and 3 for convenience of explanation, all the components of the thin film deposition apparatus 100 may be disposed within a chamber that is maintained at an appropriate degree of vacuum. The chamber is maintained at an appropriate vacuum in order to allow a deposition material to move in a substantially straight line.

In particular, in order to deposit a deposition material 115 that is emitted from the deposition source 110 and is discharged through the first nozzle 120 and the second nozzle 150, on a substrate 160 in a desired pattern, the chamber should be maintained in a high-vacuum state as in a deposition method using a fine metal mask (FMM). In addition, the temperatures of the barrier wall assembly 130 and the second nozzle 150 should be sufficiently lower than the temperature of the deposition source 110. In this regard, the temperatures of the barrier wall assembly 130 and the second nozzle 150 may be about 100° C. or less than the deposition source 110. This is so the deposition material 115 that has collided against the barrier wall assembly 130 does not vaporize again. In addition, thermal expansion of the second nozzle 150 may be minimized when the temperature of the second nozzle 150 is sufficiently low. The barrier wall assembly 130 faces the deposition source 110 which is at a high temperature. The temperature of a portion of the first barrier wall assembly 130 close to the deposition source 110 rises by a maximum of about 167° C. Thus a partial-cooling apparatus may be further included if needed. Accordingly, the barrier wall assembly 130 may include a cooling member. This will be described later in detail.

The substrate 160 is disposed in the chamber. The substrate 160 may be a substrate for flat panel displays. A large substrate, such as a mother glass, to manufacture a plurality of flat panel displays, may be used as the substrate 160. Other substrates may also be employed. The substrate 160 may also be considered as a target for the deposition material 115.

The deposition source 110 that contains and heats the deposition material 115 is disposed in an opposite side of the chamber to that in which the substrate 160 is disposed. As the deposition material 115 contained in the deposition source 110 is vaporized, the deposition material 115 is deposited on the substrate 160. The deposition source 110 includes a crucible 111 that is filled with the deposition material 115, and a heater 112 that heats the crucible 111 to vaporize the deposition material 115, which is contained in the crucible 111, towards a side of the crucible 111, and in particular, towards the first nozzle 120.

The first nozzle 120 is disposed at a side of the deposition source 110 facing the substrate 160. The first nozzle 120 includes a plurality of first slits 121 arranged at equal intervals in a Y-axis direction. The deposition material 115 that is vaporized in the deposition source 110 passes through the first nozzle 120 towards the substrate 160.

The barrier wall assembly 130 is disposed at a side of the first nozzle 120. The barrier wall assembly 130 includes a plurality of barrier walls 131, and a barrier wall frame 132 that constitutes an outer wall of the barrier walls 131. The plurality of barrier walls 131 may be arranged parallel to each other at equal intervals in a Y-axis direction. Each of the barrier walls 131 may be arranged parallel to an XZ plane in FIG. 1, i.e., perpendicular to the Y-axis direction. The plurality of barrier walls 131 arranged as described above partition the space between the first nozzle 120 and the second nozzle 150, which is to be described later. In the thin-layer deposition apparatus 100, the deposition space is divided by the barrier walls 131 into sub-deposition spaces that respectively correspond to the first slits 121 through which the deposition material 115 is discharged.

The barrier walls 131 may be respectively disposed between adjacent first slits 121. Each of the first slits 121 may be disposed between two adjacent barrier walls 131. The first slits 121 may be respectively located at the midpoint between two adjacent barrier walls 131. As described above, since the barrier walls 131 partition the space between the first nozzle 120 and the second nozzle 150, the deposition material 115 discharged through each of the first slits 121 is not mixed with the deposition material 115 discharged through the other first slits 121, and passes through second slits 151, so as to be deposited on the substrate 160. The barrier walls 131 guide the deposition material 115, which is discharged through the first slits 121, so as not to flow in the Y-axis direction.

The barrier wall frame 132, which forms upper and lower outer walls surrounding the barrier walls 131, retain the positions of the barrier walls 131, and guides the deposition material 115 discharged through the first slits 121, so as not to flow in a Z-axis direction.

The barrier wall assembly 130 may be constructed to be detachable from the thin film deposition apparatus 100. A conventional FMM deposition method has low deposition efficiency. As used herein, deposition efficiency refers to the ratio of a deposition material deposited on a substrate to the deposition material vaporized from a deposition source. The conventional FMM deposition method has a deposition efficiency of about 32%. Thus, in the conventional FMM deposition method, about 68% of organic deposition material remains adhered to a deposition apparatus and is not deposited on the substrate, and thus it is not easy to reuse the deposition material.

In order to overcome these problems, in the thin film deposition apparatus 100, the deposition space is enclosed via the barrier wall assembly 130, so that the deposition material 115 that was not deposited on the substrate 160 remains mostly within the barrier wall assembly 130. Thus, when a large amount of the deposition material 115 lies in the barrier wall assembly 130 after a long deposition process, the barrier wall assembly 130 may be detached from the thin film deposition apparatus 100 and then placed in a separate deposition material recycling apparatus to recover the deposition material 115. Due to the structure of the thin film deposition apparatus 100, a reuse rate of the deposition material 115 is increased, so that the deposition efficiency is improved, thereby reducing the manufacturing costs.

In addition, the barrier wall assembly 130 may be disposed to be separated from the first nozzle 120 by a predetermined distance in order to prevent heat transfer from the deposition source 110 to the barrier wall assembly 130, and thus to suppress a temperature rise of the barrier wall assembly 130. The separation of the barrier wall assembly 130 from the first nozzle 120 also provides a space that makes it easier to install a member (not shown) that blocks radiant heat from the first nozzle 120. In particular, a space is provided for a member that blocks radiant heat from a surface of the first nozzle 120 close to the first slits 121. The separation interval between the barrier wall assembly 130 and the first nozzle 120 may be set according to processing conditions.

The second nozzle 150 and the second nozzle frame 155 are disposed between the deposition source 110 and the substrate 160. The second nozzle frame 155 may be formed in a lattice shape, similar to a window frame. The second nozzle 150 is bound inside the second nozzle frame 155. The second nozzle 150 includes a plurality of second slits 151 arranged at equal intervals in the Y-axis direction. The deposition material 115 that is vaporized in the deposition source 110 passes through the first nozzle 120 and the second nozzle 150 towards the substrate 160.

In the thin film deposition apparatus 100, the total number of second slits 151 may be greater than the total number of first slits 121. In addition, there may be a greater number of second slits 151 than first slits 121 disposed between two adjacent barrier walls 131.

At least one first slit 121 may be disposed between each two adjacent barrier walls 131. A plurality of second slits 151 may be disposed between each two adjacent barrier walls 131. The space between the first nozzle 120 and the second nozzle 150 is partitioned by the barrier walls 131 into sub-deposition spaces that correspond to the first slits 121, respectively. Thus, the deposition material 115 discharged from each of the first slits 121 passes through a plurality of second slits 151 disposed in the sub-deposition space corresponding to the first slit 121, and is then deposited on the substrate 160.

The second nozzle 150 may be manufactured by etching, which is the same method as used in a conventional method of manufacturing an FMM, and in particular, a striped FMM. In the conventional FMM deposition method, the size of the FMM has to be equal to the size of a substrate. The size of the conventional FMM therefore has to be increased as the substrate becomes larger. It is neither straightforward to manufacture a large FMM nor to extend an FMM to be accurately aligned with a pattern. However, in the thin film deposition apparatus 100, deposition may be performed while the thin film deposition apparatus 100 is moved in a direction of the substrate 160 or while the substrate 160 is moved in the direction of the thin film deposition apparatus 100. For example, deposition may be performed while the thin film deposition apparatus 100 is moved in the Z-axis direction within the chamber or while the thin film deposition apparatus 100 is fixedly located within the chamber and the substrate 160 is moved in the Z-axis direction. Once the thin film deposition apparatus 100 has completed deposition at a current location, either the thin film deposition apparatus 100 or the substrate 160 is moved relative to each other in the Z-axis direction for further continuous deposition. Thus, in the thin film deposition apparatus 100, the second nozzle 150 may be significantly smaller than an FMM used in a conventional deposition method. In the thin film deposition apparatus 100, the lengths of the second nozzle 150 in the Y-axis direction and the Z-axis direction may be less than the length of the substrate 160.

As described above, since the second nozzle 150 may be formed to be significantly smaller than an FMM used in a conventional deposition method, it is relatively easy to manufacture the second nozzle 150. The second nozzle 150, which is smaller than an FMM used in a conventional deposition method, is more convenient in all processes, including etching and subsequent other processes, such as precise extension, welding, moving, and cleaning processes, compared to the conventional deposition method using the larger FMM. This is more advantageous for a relatively large display device.

The barrier wall assembly 130 and the second nozzle 150 are separated from each other by a predetermined distance. The barrier wall assembly 130 and the second nozzle 150 may be separated from each other for several reasons.

First of all, the second nozzle 150 and the second nozzle frame 155 should be aligned with the substrate 160 to be accurate in position and to have a constant interval therebetween, and thus require high-precision control. Thus, in order to make it easy to control parts that may require high-precision control, the second nozzle 150 and the second nozzle frame 155 are separated from the deposition source 110, the first nozzle 120 and the barrier wall assembly 130, which are relatively heavy parts not requiring precise control. The temperature of the barrier wall assembly 130 may increase to 100° C. or higher due to the deposition source 110 whose temperature is high. Thus, in order to prevent the heat of the barrier wall assembly 130 from being conducted to the second nozzle 150, the barrier wall assembly 130 and the second nozzle 150 are separated from each other.

In the thin film deposition apparatus 100, the deposition material 115 adhered to the barrier wall assembly 130 is mostly reused, whereas the deposition material 115 adhered to the second nozzle 150 may not be reused. Thus, when the barrier wall assembly 130 is separated from the second nozzle 150, it may be straightforward to recover the deposition material 115 to be reused.

In addition, a calibration plate (not shown) may be further installed in order to ensure uniformity of a thin film over the entire substrate 160. When the barrier walls 131 are separated from the second nozzle 150, it is very easy to install the calibration plate. Finally, a partition (not shown) may also be installed in order to prevent deposition of the deposition material 115 on the second nozzle 150 after deposition onto the substrate 160 has been completed and before another target is subjected to deposition. This may extend a nozzle exchange cycle. It is straightforward to install the partition between the barrier walls 131 and the second nozzle 150.

Figure 4:
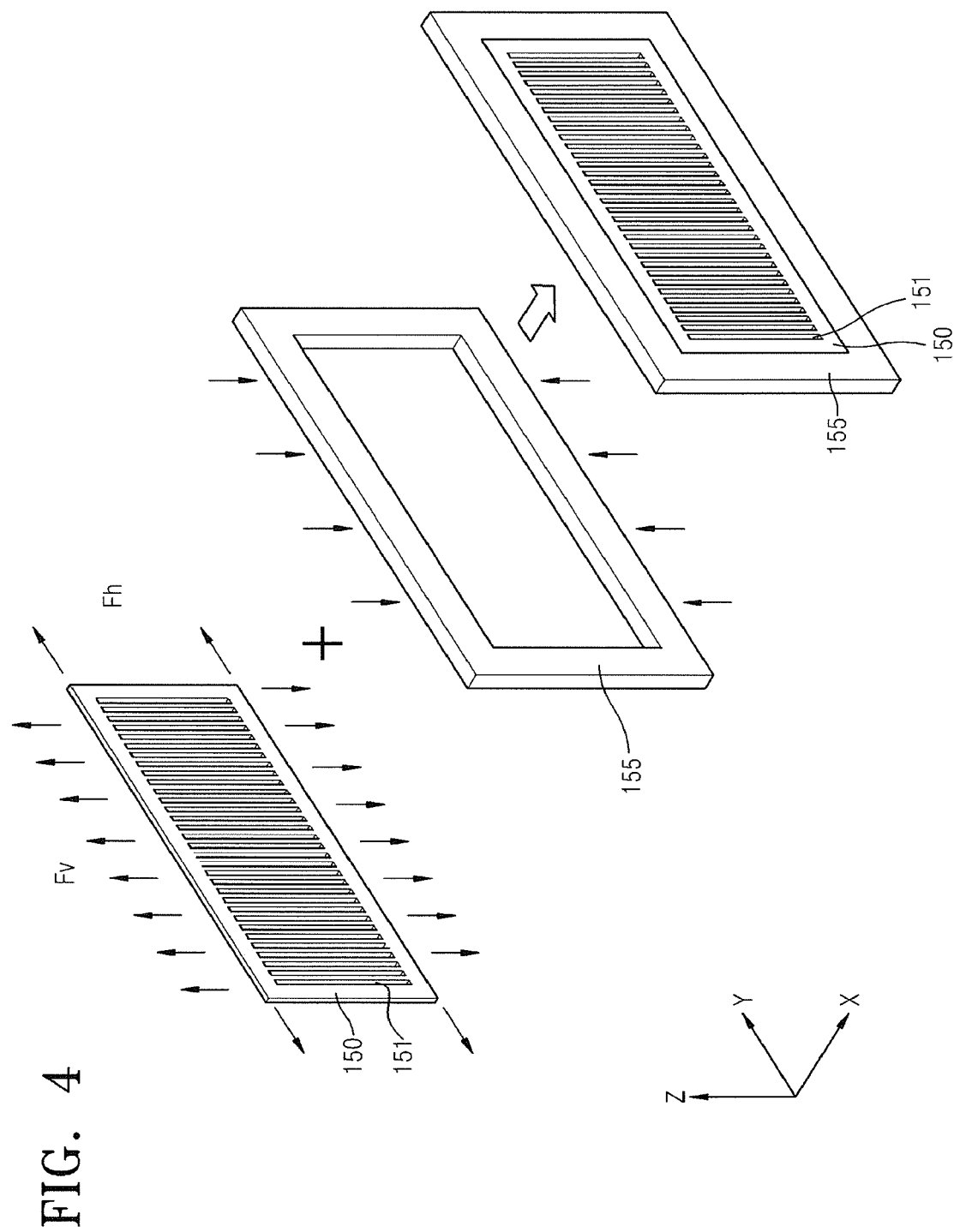
FIG. 4 is a schematic perspective view illustrating a binding structure of a second nozzle and a second nozzle frame, according to an embodiment of the present invention.

FIG. 4 is a schematic perspective view illustrating a binding structure of the second nozzle 150 and the second nozzle frame 155, according to an embodiment of the present invention. The second nozzle frame 155 may be formed in a lattice shape, similar to a window frame. The second nozzle 150 including the plurality of second slits 151 is bound inside the second nozzle frame 155. In the thin film deposition apparatus 100, the second nozzle 150 is bound to the second nozzle frame 155 such that a tensile force is exerted on the second nozzle 150 by the second nozzle frame 155.

In particular, a degree of pattern precision of the second nozzle 150 may be affected by a manufacturing error and a thermal expansion error of the second nozzle 150. In order to minimize manufacturing errors of the second nozzle 150, a counter force technique used to precisely extend an FMM and weld the FMM to a frame may be used. This will now be described in detail below.

Initially, as illustrated in FIG. 4, an external tensile force is applied to the second nozzle 150 so that the second nozzle 150 is stretched outwards. Next, a compression force is applied to the second nozzle frame 155 in an opposite direction to the direction in which the external tensile force is applied to the second nozzle 150, such that the compression force is in equilibrium with the external tensile force applied to the second nozzle 150. The second nozzle 150 is then bound to the second nozzle frame 155 by, for example, welding edges of the second nozzle 150 to the second nozzle frame 155. Finally, the second nozzle 150 and the second nozzle frame 155 are relieved from all the external forces applied thereto to reach equilibrium, so that only a tensile force is exerted on the second nozzle 150 by the second nozzle frame 155. When such precise extension, compression, and welding techniques as described above are used, the second nozzle 150 may be manufactured with a manufacturing error of 2 μm or less.

In the thin film deposition apparatus 100, the temperature of the second nozzle frame 150 may be maintained constant. In particular, the second nozzle 150, which is disposed to face the deposition source 110 whose temperature is high, is always exposed to radiant heat from the deposition source 110, so that the temperature of the second nozzle 150 is increased to some extent, for example, by about 5 to 15° C. However, when the temperature of the second nozzle 150 is increased, the second nozzle 150 may expand, thus deteriorating a degree of pattern precision of the second nozzle 150.

In order to overcome this problem, the second nozzle frame 155 may be used, and the temperature of the second nozzle frame 155, which supports the second nozzle 150 such that a tensile force is exerted on the second nozzle 150, is maintained constant, thereby preventing pattern errors due to a temperature increase of the second nozzle 150. The second nozzle 150 may be, for example, a stripe type nozzle.

The thermal expansion (pattern error) of the second nozzle 150 in a horizontal direction (Y-axis direction) is affected by the temperature of the second frame nozzle 155. Thus, if the temperature of the second nozzle frame 155 is maintained constant, such an error in the pattern of the second nozzle 150 caused due to the thermal expansion does not occur even when the temperature of the second nozzle 150 rises. In addition, the second nozzle 150 thermally expands in a vertical direction (Z-axis direction). However, the vertical direction of the second nozzle 150 is a scanning direction that is irrelevant to the degree of pattern precision of the second nozzle 150.

The second nozzle frame 155 does not directly face the deposition source 110 in a vacuum condition, and thus is not exposed to the radiant heat from the deposition source 110. In addition, since the second nozzle frame 155 is not connected to the deposition source 110, there is no thermal conduction therebetween. Thus, the temperature of the second nozzle frame 155 is unlikely to rise. Even if the temperature of the second nozzle frame 155 rises slightly, for example, by 1 to 3° C., the temperature of the second nozzle frame 155 may be easily maintained constant by using a thermal shield or a radiation fin. This will be described later in detail.

As described above, when the second nozzle frame 155 exerts a tensile force on the second nozzle 150 and the temperature of the second nozzle frame 155 is maintained constant, the thermal extension problem with the second nozzle 150 no longer affects a problem of pattern precision of the second nozzle 150. Thus, the degree of pattern precision of the second nozzle 150 may be further improved. In other words, as described above, when precise extension, compression, and welding techniques are used, the second nozzle 150 may be manufactured with a manufacturing error of 2 μm or less. In addition, an error in the pattern of the second nozzle 150 caused due to the thermal expansion of the second nozzle 150, which occurs as the temperature of the second nozzle 150 rises, may be prevented by supporting the second nozzle 150 such that a tensile force is exerted thereon and by maintaining the temperature of the second nozzle frame 155 to be constant. Thus, the second nozzle 150 may be manufactured with an error of less than 2 μm, which is attributed to a manufacturing error (<2) of the second nozzle 150 and a thermal expansion error (~0) of the second nozzle 150.

Figure 5A:
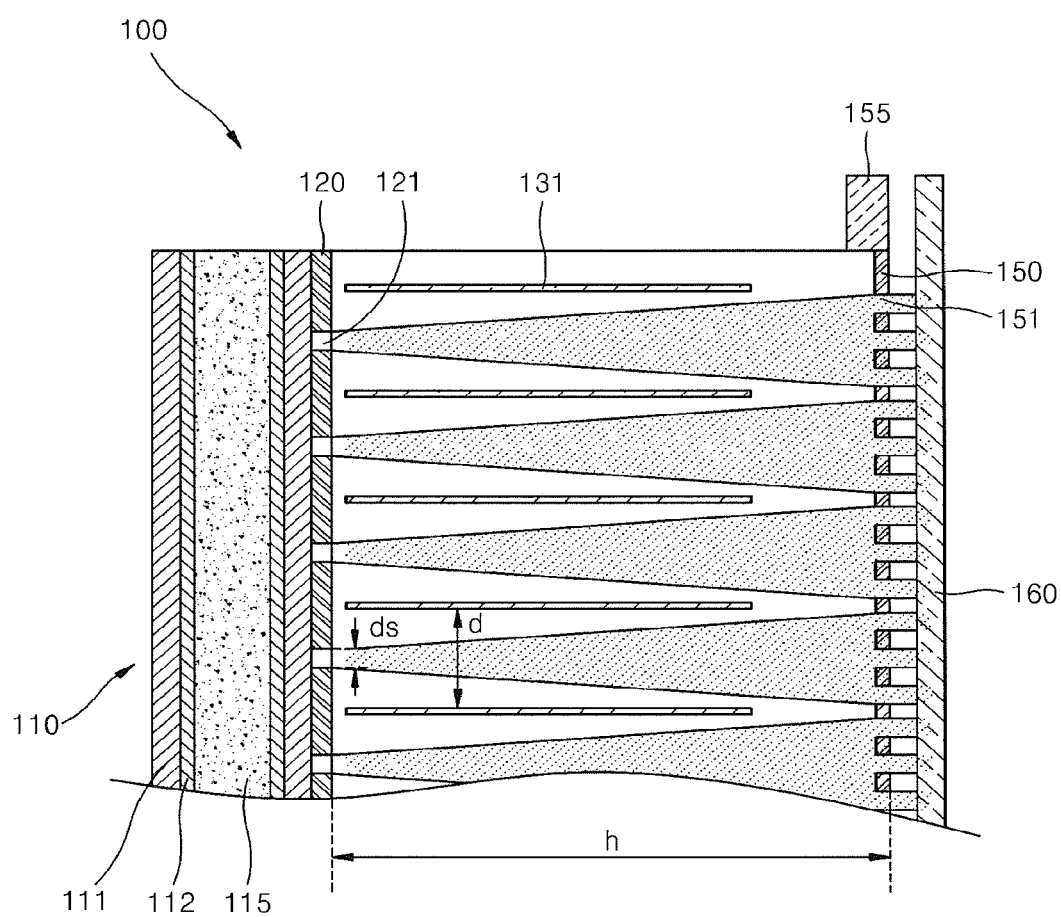
FIG. 5A is a schematic view illustrating deposition of a deposition material in the thin film deposition apparatus of FIG. 1, according to an embodiment of the present invention.
Figure 5B:
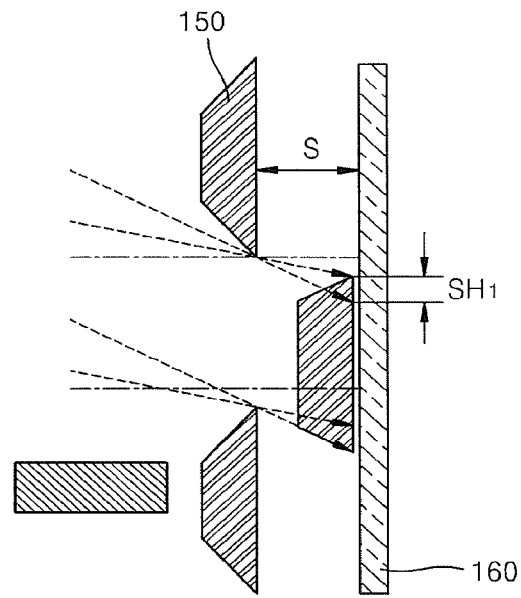
FIG. 5B illustrates a shadow zone of a thin film deposited on a substrate when a deposition space is partitioned by barrier walls, as illustrated in FIG. 5A.
Figure 5C:
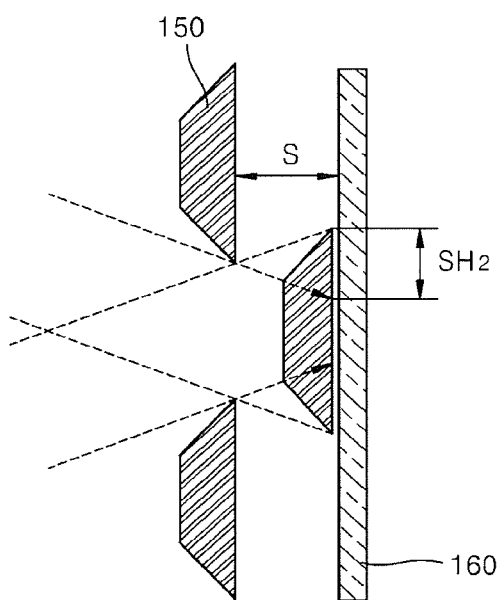
FIG. 5C illustrates a shadow zone of a thin film deposited on the substrate when the deposition space is not partitioned.

FIG. 5A is a schematic view illustrating deposition of the deposition material 115 in the thin film deposition apparatus 100, according to an embodiment of the present invention. FIG. 5B illustrates a shadow zone of a thin film deposited on the substrate 160 when the deposition space is partitioned by the barrier walls 131. FIG. 5C illustrates a shadow zone of a thin film deposited on the substrate 160 when the deposition space is not partitioned.

Referring to FIG. 5A, the deposition material 115 that is vaporized in the deposition source 110 is deposited on the substrate 160 by being discharged through the first nozzle 120 and the second nozzle 150. Since the space between the first nozzle 120 and the second nozzle 150 is partitioned by the barrier walls 131, the deposition material 115 discharged through each of the first slits 121 of the first nozzle 120 is not mixed with the deposition material 115 discharged through the other adjacent first slits 121 due to the barrier walls 131.

When the space between the first nozzle 120 and the second nozzle 150 is partitioned by the barrier walls 131, the width SH1 of the shadow zone formed on the substrate 160 is thus determined by:

$$SH_1 = S*ds/h \quad (1),$$

where S denotes a distance between the second nozzle 150 and the substrate 160, ds denotes a width of the first slits 121 close to the deposition source 110, and h denotes a distance between the deposition source 110 and the second nozzle 150.

However, when the space between the first nozzle 120 and the second nozzle 150 is not partitioned by the barrier walls 131, as illustrated in FIG. 5C, the deposition material 115 is discharged through the second nozzle 150 in a wider range of angles than in the case of FIG. 5B. This is because the deposition material 115 discharged through the plurality of first slits 121, not just through a first slit 121 in a partitioned space, is deposited on the substrate 160 through the second slits 151. Thus, a width SH2 of a shadow zone formed on the substrate 160 is much greater than when the deposition space is partitioned by the barrier walls 131. The width SH2 of the shadow zone formed on the substrate 160 is determined by:

$$SH_2 = S*2d/h \quad (2),$$

where S denotes a distance between the second nozzle 150 and the substrate 160, d denotes an interval between adjacent barrier walls, and h denotes a distance between the deposition source 110 and the second nozzle 150.

Referring to Equations 1 and 2, $d_s$, which is the width of the first slits 121, is a few to tens times smaller than d, which is the interval between the adjacent barrier walls, and thus the shadow zone may have a smaller width when the space between the first nozzle 120 and the second nozzle 150 is partitioned by the barrier walls 131. The width $SH_2$ of the shadow zone formed on the substrate 160 may be reduced by any of the following: (1) reducing the interval d between the adjacent barrier walls 131, (2) reducing the distance s between the second nozzle 150 and the substrate 160, or (3) increasing the distance h between the deposition source 110 and the second nozzle 150.

As described above, the shadow zone formed on the substrate 160 may be reduced by installing the barrier walls 131. Thus, the second nozzle 150 can be separated from the substrate 160.

Thus, in the thin film deposition apparatus 100, the second nozzle 150 may be separated from the substrate 160 by a predetermined distance. In a conventional deposition method using an FMM, deposition is performed with the FMM in close contact with a substrate in order to prevent formation of a shadow zone on the substrate. However, when the FMM is used in close contact with the substrate, the contact may cause defects. In order to overcome this problem, in the thin film deposition apparatus 100, the second nozzle 150 is disposed to be separated from the substrate 160 by a predetermined distance. This may be implemented by installing the barrier walls 131 to reduce the width of the shadow zone formed on the substrate 160.

As described above, according to aspects of the present invention, a defect caused due to the contact between a substrate and an FMM, which occurs in a conventional deposition method, may be prevented. In addition, since it is unnecessary to use the FMM in close contact with the substrate during a deposition process, the manufacturing speed may be improved.

Figure 6:
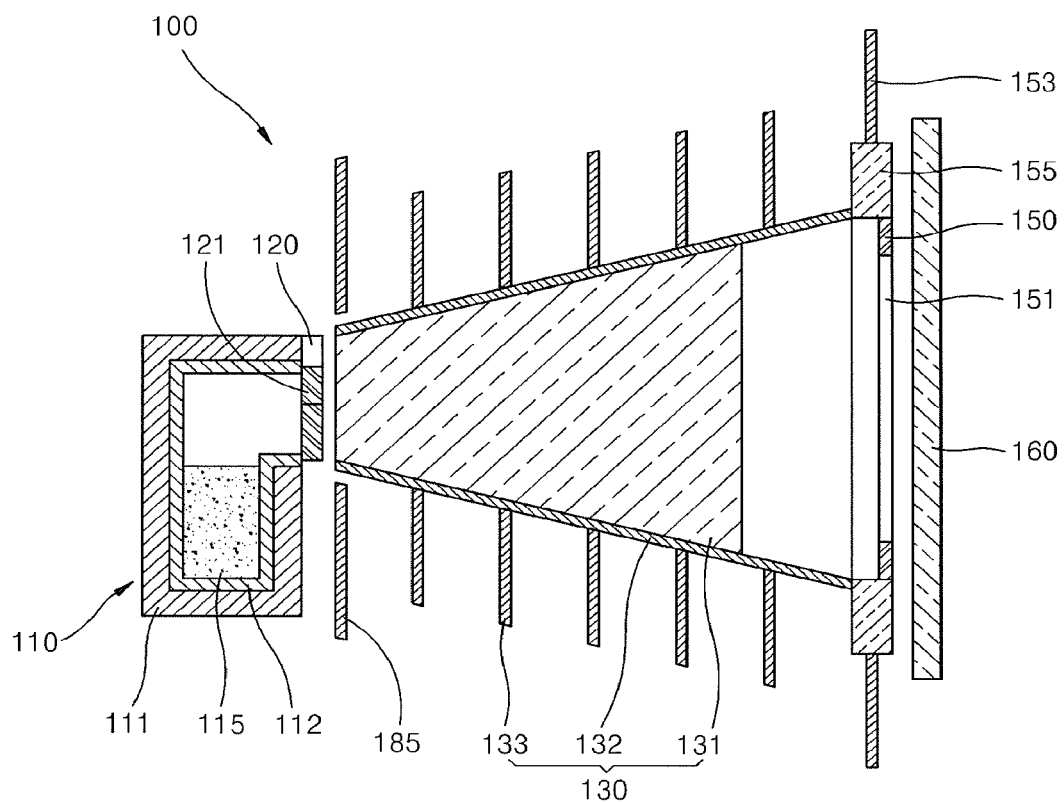
FIG. 6 is a schematic view of a thin film deposition apparatus further including a cooling member, according to another embodiment of the present invention.

FIG. 6 is a schematic view of a thin film deposition apparatus including a cooling member, according to another embodiment of the present invention. As described above, the barrier wall assembly 130 may further include a cooling member. In particular, the temperature of the barrier wall assembly 130 should be maintained to be considerably lower than the temperature of the deposition source 110. To do so, the first barrier wall assembly 130 may further include a cooling member. The barrier wall frame 132 may include a cooling fin 133, which is an example of the cooling member. The cooling fin 133 may be formed to protrude from an outer circumference of the barrier wall frame 132 in order to radiatively cool the heat of the barrier wall assembly 130. Alternatively, although not illustrated, a water-cooling method may be applied, whereby a pipe is installed in the barrier wall assembly 130, and a coolant is flowed through the pipe.

In addition, the second nozzle frame 155 may further include a radiation fin 153. A thermal shield 185 may be further disposed between the deposition source 110 and the second nozzle frame 155.

The second nozzle frame 155 does not directly face the deposition source 110 in a vacuum condition, and thus is not exposed to the radiant heat from the deposition source 110. In addition, since the second nozzle frame 155 is not connected to the deposition source 110, there is no thermal conduction therebetween. Thus, the temperature of the second nozzle frame 155 is unlikely to rise. However, the temperature of the second nozzle frame 155 is still likely to rise slightly by about 1 to 3°. Such a temperature rise may be prevented via the radiation fin 153, so that the temperature of the second nozzle frame 155 may be maintained constant. The radiation fin 153 may be formed to protrude from an outer surface of the second nozzle frame 155 in order to radiatively cool the second nozzle frame 155. In addition, the heat radiated from the deposition source 110 towards the second nozzle frame 155 may be blocked by installing the thermal shield 190 between the deposition source 110 and the second nozzle frame 155, so that the temperature of the second nozzle frame 155 may be maintained constant.

Figure 7:
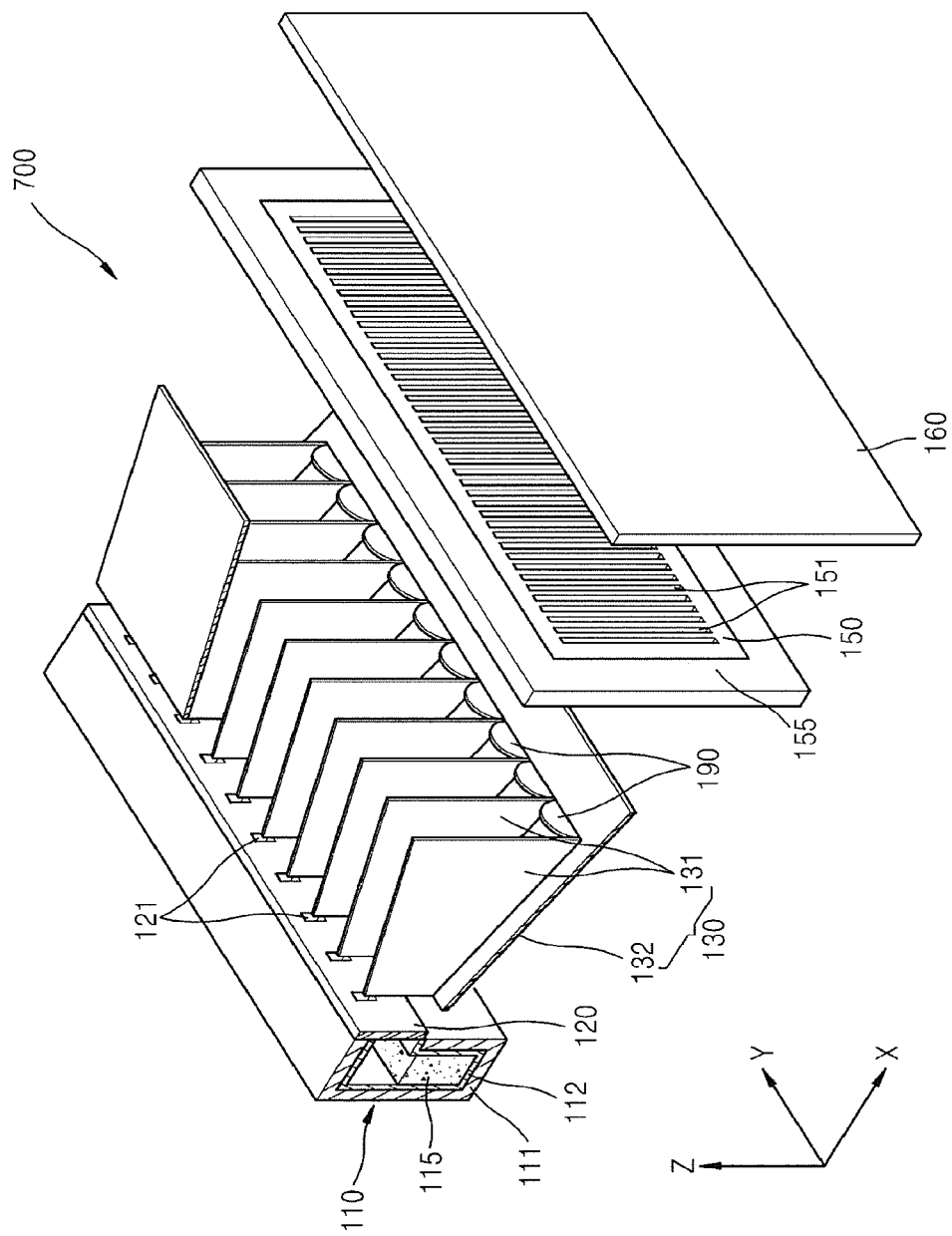
FIG. 7 is a schematic perspective view of a thin film deposition apparatus according to another embodiment of the present invention.

FIG. 7 is a schematic perspective view of a thin film deposition apparatus 700 according to another embodiment of the present invention. Referring to FIG. 7, the thin film deposition apparatus 700 includes a deposition source 110, a first nozzle 120, a barrier wall assembly 130, a second nozzle 150, and a second nozzle frame 155. A substrate 160 upon which a deposition material 115 is deposited is also shown. The thin film deposition apparatus 700 may further include a plurality of calibration plates 190. The thin film deposition apparatus 700 of FIG. 7 is different from the thin film deposition apparatus 100 of FIG. 1 in that the calibration plates 190 are further included for deposition uniformity of a film formed on the substrate 160. The calibration plates 190 will now be described in detail.

Figure 8:
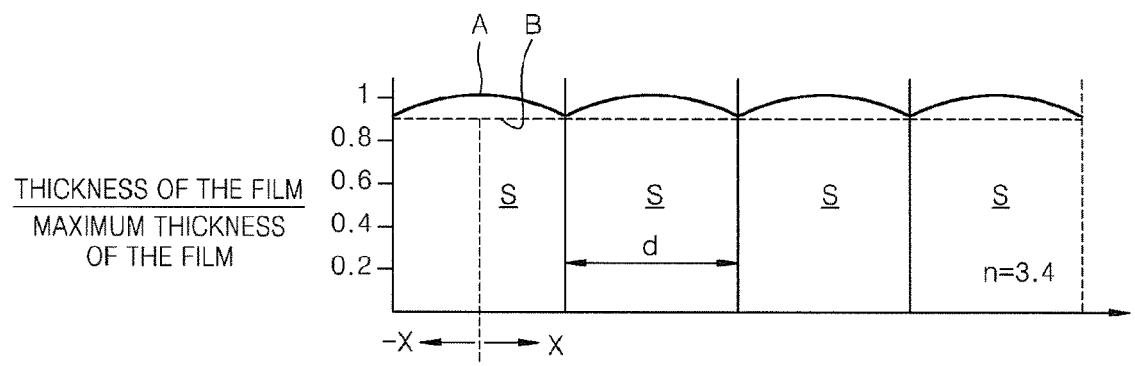
FIGS. 8 and 9 are graphs schematically comparing a distribution of a deposition material of a film formed on a substrate when a thin film deposition apparatus having no calibration plates is used with when a thin film deposition apparatus having calibration plates is used, according to embodiments of the present invention.

FIG. 8 is a graph schematically comparing a distribution of a deposition material of a film formed on a substrate using a thin film deposition apparatus having no calibration plates with a thin film deposition apparatus having calibration plates, according to embodiments of the present invention. FIG. 8 illustrates a case where the amounts or deposition coefficients of a deposition material discharged from apertures (namely, first slits) are identical to each other. In FIG. 5, S denotes each sub-deposition space, and d denotes a distance between each adjacent barrier walls 131. In FIG. 8, S denotes sub-deposition spaces and d denotes the distance between adjacent barrier walls.

In FIG. 8, a line A represents a distribution of the deposition material of the film formed by the thin film deposition apparatus having no calibration plates, and a line B represents a distribution of the deposition material of the film formed by the thin film deposition apparatus having calibration plates.

Referring to FIG. 8, according to the cosine rule, the greatest amount of organic material is discharged in an area directly facing each first slit in each sub-deposition space S, that is, in the central area of each sub-deposition space S, and the amount of organic material discharged decreases toward the barrier walls. Accordingly, the film formed by the thin film deposition apparatus including no calibration plates has a profile indicated by line A. In each of the In other words, as for each of the sub-deposition spaces S, the film has a profile whose center is convex. As for the entire surface of the film formed on the substrate, the film has an irregular surface formed of repeating convex portions and concave portions.

In this case, a relationship between the distance between a center and a location in each sub-deposition space S and the thickness of the film on the location may be easily deduced through an experiment. In most cases, the relationship may be expressed with a $\cos''(\theta)$ function.

To improve uniformity of the thickness of the film in each of the sub-deposition spaces S, the calibration plates 190 of FIG. 7 may be used. Referring to FIG. 7, the calibration plate 190 is disposed between each two adjacent barrier walls 131 so as to have a circular arc or cosine curve shape. The calibration plates 190 disposed and shaped as described above may partially block the deposition material 115 that moves from the first slits 121 to the second slits 151.

In detail, since portions of the film formed by the thin film deposition apparatus having no calibration plates and defined by each sub-deposition space S have a convex central portion, a part of the deposition material that moves toward the center of each sub-deposition space S needs to be blocked in order to make the thickness of the deposition film uniform in each sub-deposition space S should be blocked. Accordingly, a part of the deposition material is blocked by disposing the calibration plates 190 in the middle of a deposition material moving path. Since the calibration plates 190 are each formed in a circular arc or cosine curve shape, the deposition material collides with the center portions of the calibration plates 190 more than with the other portions thereof because of their protrusion and thus is more blocked. In other words, the deposition material collides with the edge portions of the calibration plates 190 less than with the center portions thereof and thus is less blocked. In this case, the calibration plates 190 may be designed in such a manner that the uniform thickness of a formed film is the same as a thickness of a portion of the film in each edge portion of each sub-deposition space S, which is the smallest from among thicknesses of the other portions of the film.

As described above, owing to the installation of the calibration plates 190 in the deposition material moving path, the film formed by the thin film deposition apparatus may have a profile indicated by the line B of FIG. 8. In other words, each calibration plate 190 is designed to have a relatively large height in an area through which a relatively large amount of deposition material passes, in order to block a relatively large amount of deposition material. Likewise, each calibration plate 190 is designed to have a relatively small height in an area through which a relatively small amount of deposition material passes, in order to block a relatively small amount of deposition material. In this way, the amount of deposition material deposited is corrected so that the thickness of the formed film is uniform over a substrate.

When the thin film deposition apparatus having calibration plates (see FIG. 7) according to an embodiment of the present invention is used, the uniformity of the thickness of a thin film formed on a substrate is maintained within an error range of 1 to 2%, and thus, the quality and reliability of a product including the substrate on which the thin film is formed may improve.

Figure 9:
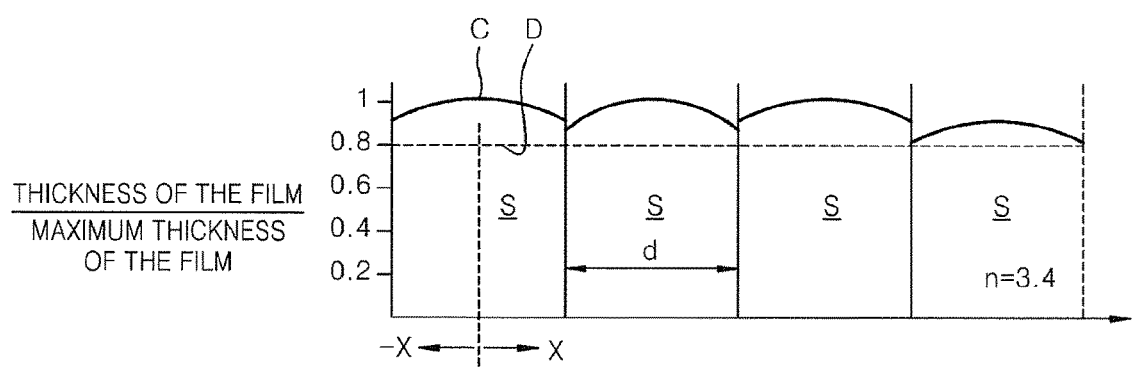

FIG. 9 is a graph schematically comparing a distribution of a deposition material of a film formed on a substrate using a thin film deposition apparatus having no calibration plates with a thin film deposition apparatus having calibration plates, according to embodiments of the present invention.

In FIG. 9, a line C represents a distribution of a deposited material of a film formed by the thin film deposition apparatus having no calibration plates, and a line D represents a distribution of a deposition material of a film formed by a thin film deposition apparatus having calibration plates.

Referring to FIG. 9, according to the cosine rule, the greatest amount of deposition material is discharged in an area directly facing each first slit in each sub-deposition space S, that is, in the central area of each sub-deposition space S, and the amount of deposition material discharged decreases toward the barrier walls. However, if a plurality of first slits through which a deposition material is discharged are included as in a thin film deposition apparatus according to an embodiment of the present invention, then the first slits may respectively have different deposition material discharge amounts or coefficients since the internal temperature of a deposition source is not constant, and a center portion and an edge portion of the deposition source have different shapes. Accordingly, the film formed by the thin film deposition apparatus having no calibration plates has a profile indicated by the line C. In each of the In other words, as for each of the sub-deposition spaces S, the film has a profile whose center is convex. As for the entire surface of the film formed on the substrate, a maximum thickness of the film varies in each sub-deposition spaces S.

In this case, a relationship between the distance between a center and a location in each sub-deposition space S and the thickness of the deposited film on the location may be easily deduced through an experiment. In most cases, the relationship may be expressed with a $\cos''(\theta)$ function.

FIG. 9 is different from FIG. 8 in that since a maximum thickness of the deposited film varies in each sub-deposition space S, the calibration plates 190 are differently formed for each sub-deposition space S. In other words, in a sub-deposition space S having a relatively thick film, that is, the left-most sub-deposition space S of FIG. 9, the calibration plate 190 is made relatively large so as to block more deposition material. On the other hand, in a sub-deposition space S having a relatively thin film, that is, the right-most sub-deposition space S of FIG. 9, the calibration plate 190 is made small to so as to block less deposition material. In this case, the calibration plates 190 may be designed in such a manner that the thickness of a film formed across the substrate is the same as a minimum thickness of the film in a particular sub-deposition space S, which is the thinnest from among the portions of the film in the other sub-deposition spaces S.

As described above, owing to the installation of the calibration plates 190 in the deposition material moving path, the film formed by the thin film deposition apparatus may have a profile indicated by the line D of FIG. 9. In other words, the calibration plates 190 make the thickness of a portion of a film formed in each sub-deposition space S uniform and also make the thickness of the entire film formed on the substrate uniform.

When the thin film deposition apparatus having calibration plates (see FIG. 7) according to an embodiment of the present invention is used, the uniformity of the thickness of a thin film formed on the substrate is maintained within an error range of 1% to 2%, and thus the quality and reliability of a product including the substrate 160 on which the thin film is formed may improve.

Figure 10:
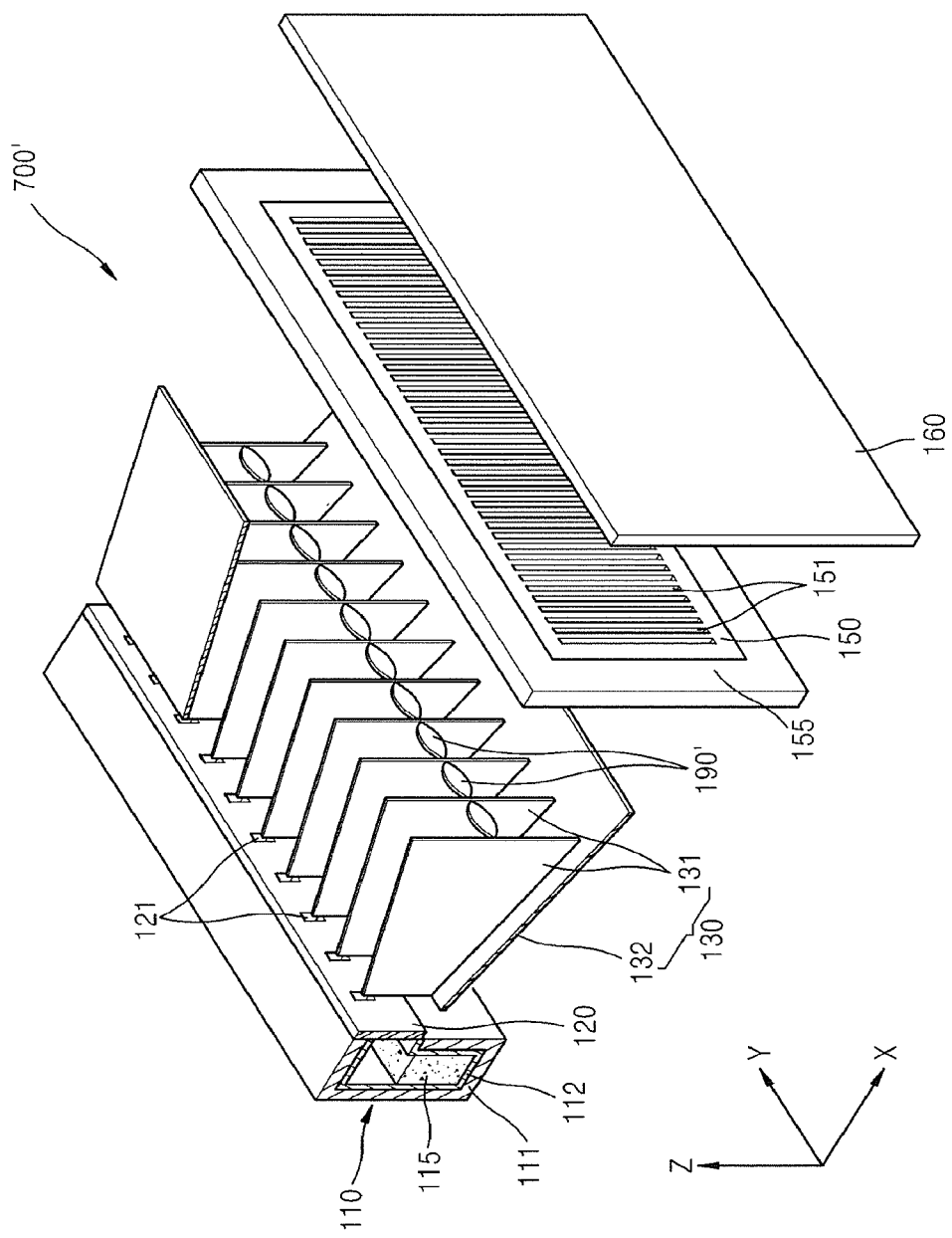
FIG. 10 is a schematic perspective view of another embodiment of the thin film deposition apparatus of FIG. 7, according to the present invention.

FIG. 10 is a schematic perspective view of another embodiment of the thin film deposition apparatus 700' of FIG. 7, according to aspects of the present invention. The only difference between the thin film deposition apparatus 700 of FIG. 7 and the thin film deposition apparatus 700' of FIG. 10 is the shape and position of a plurality of calibration plates 190'. Thus, a detailed description of the elements denoted by the same reference numerals as used in the embodiment of FIG. 7 will not be provided here.

Referring to FIG. 10, the thin film deposition apparatus 700' includes a deposition source 110, a first nozzle 120, a barrier wall assembly 130, and a second nozzle 150. A substrate 160 upon which a deposition material 115 is deposited is also shown. The thin film deposition apparatus 700' further includes the plurality of calibration plates 190'.

The calibration plates 190' are disposed at a central portion of the first barrier wall assembly 130 instead of a lower portion thereof. Each of the calibration plates 190' may have a shape including a combination of circular arcs or cosine curves arranged in the Z-axis direction. Although not shown, the calibration plates 190' may be installed not only in the first barrier wall assembly 130 but also in a second barrier wall assembly (not shown). The calibration plates 190' may be formed at various locations on the first barrier wall assembly 130, for example, in the lower portion, the center portion, and the upper portion of the first barrier wall assembly 130. The shape of each calibration plate 190' may be not only a circular arc, a cosine curve, a combination of circular arcs arranged in the Z-axis direction, or a combination of cosine curves arranged in the Z-axis direction but also may be any shape as long as it can secure the uniformity of a film over the entire surface of the substrate 160.

Figure 11:
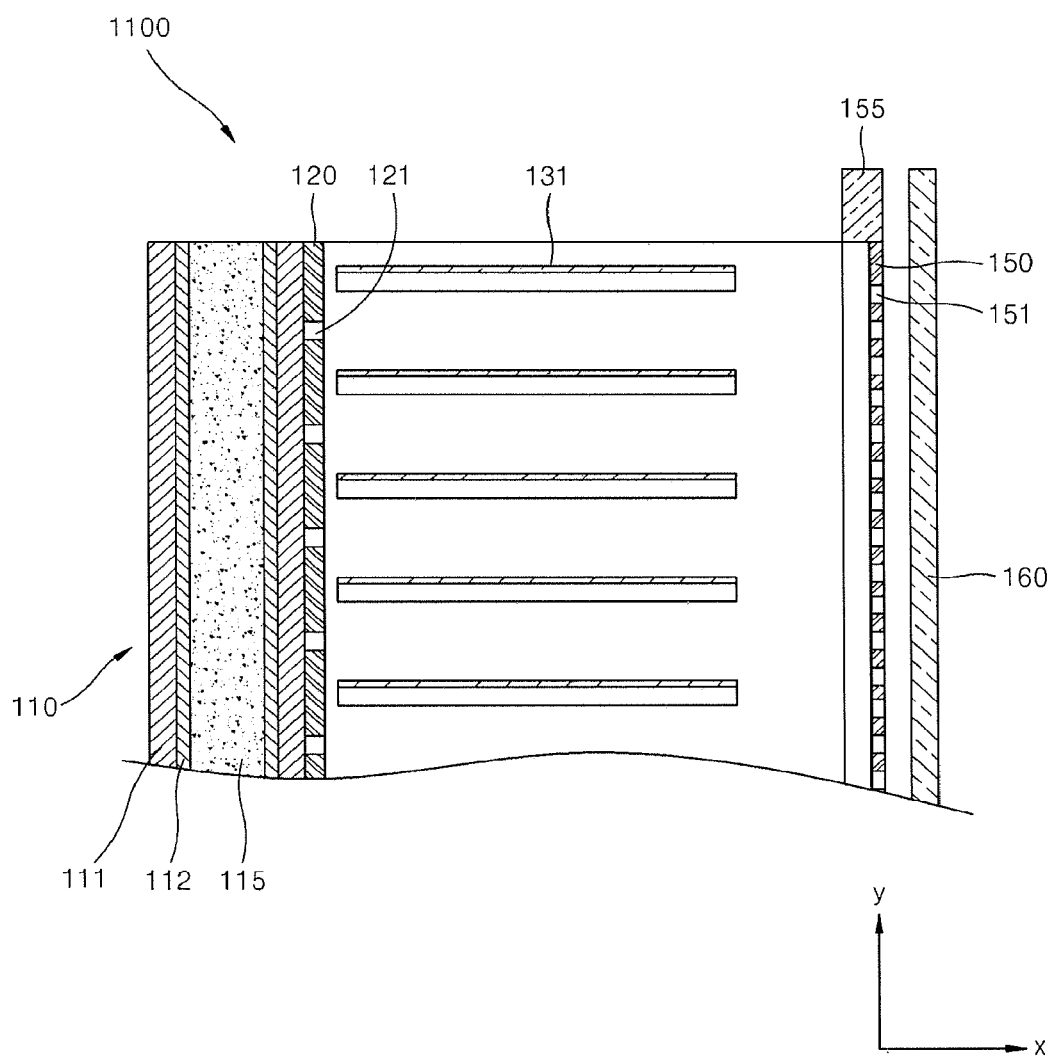
FIG. 11 is a schematic perspective view of a thin film deposition apparatus according to another embodiment of the present invention.
Figure 12:
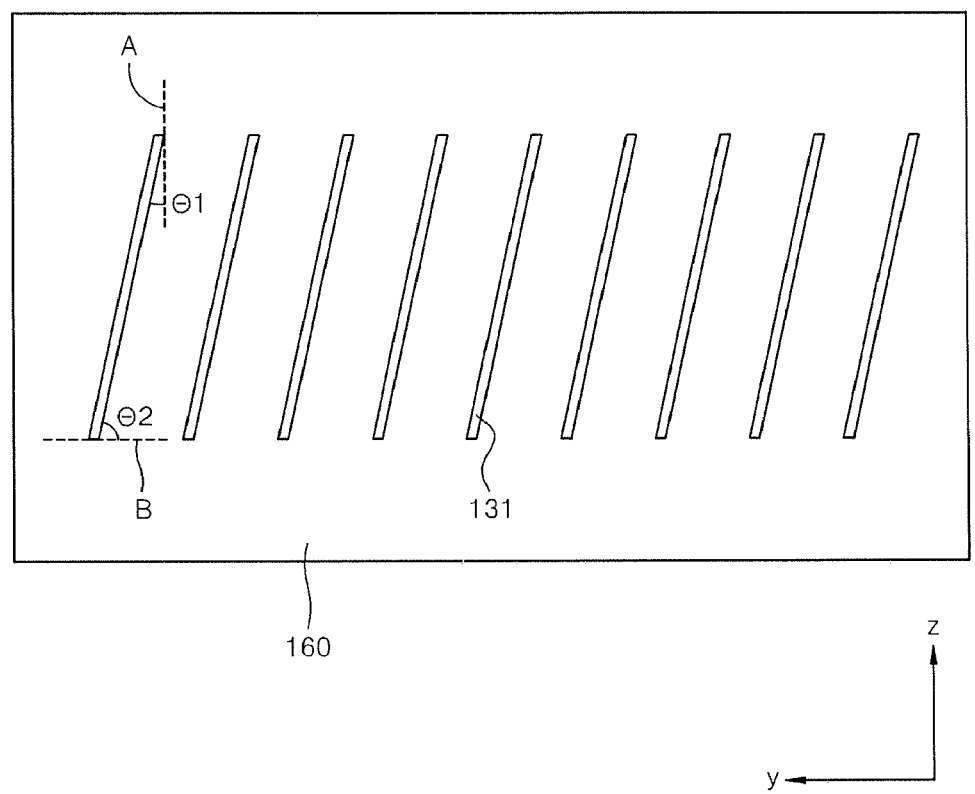
FIG. 12 is a cross-sectional view of the thin film deposition apparatus of FIG. 11 cut along a Y-Z plane.

FIG. 11 is a schematic perspective view of a thin film deposition apparatus 1100 according to another embodiment of the present invention. FIG. 12 is a cross-sectional view of the thin film deposition apparatus 1100 of FIG. 11 cut along a Y-Z plane.

Referring to FIGS. 11 and 12, the thin film deposition apparatus 1100 includes a deposition source 110, a first nozzle 120, a barrier wall assembly 130, and a second nozzle 150. A substrate 160 upon which a deposition material 115 is deposited is also shown. The thin film deposition apparatus 1100 is different from those according to the previous embodiments in that a plurality of barrier walls 131 are disposed to be inclined.

Specifically, the barrier walls 131 may be arranged to be inclined in a Y-axis direction. In FIG. 12, A represents a direction in which the second nozzles 150 are arranged. The direction A may be a Z-axis direction. The direction A may also be a direction in which the thin film deposition apparatus 1100 is moved. B represents a direction in which second slits 151 are arranged. The direction B may be the Y-axis direction.

Each of the barrier walls 131 may be arranged to be inclined by a predetermined angle θ1 to the direction A. The predetermined angle θ1 may be an acute angle, for example, about 1° to 10°.

According to another embodiment of the present invention, the barrier walls 131 may be arranged to be inclined by a predetermined angle θ2 to the direction B. That is, the barrier walls 131 may be arranged not to be perpendicular to the direction B. The predetermined angle θ2 may be an acute angle, for example, about 80° to about 89°.

When the barrier walls 131 are arranged to be inclined by the predetermined angle θ1 or θ2 to the direction A or B, the thickness uniformity of a thin film deposited on the substrate 160 may be improved. This will be described later in detail.

Figure 13A:
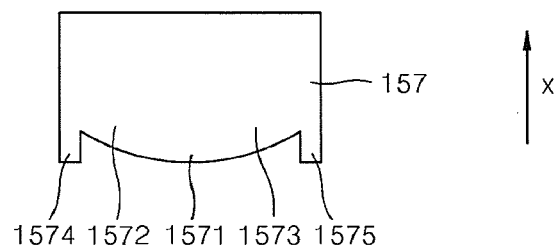
FIGS. 13A to 13C are schematic views illustrating the thicknesses of thin films deposited by a conventional thin film deposition apparatus and a thin film deposition apparatus according to an embodiment of the present invention.
Figure 13B:
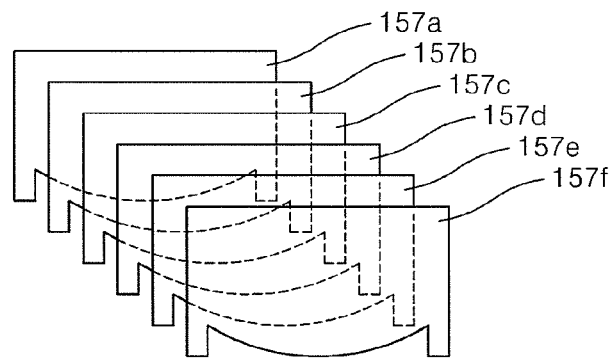
Figure 13C:
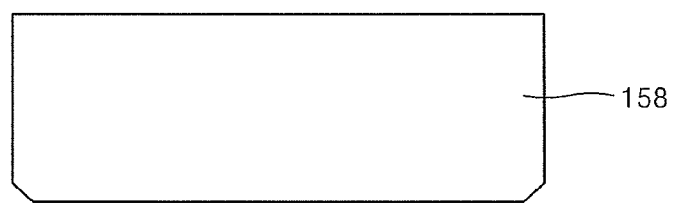

FIGS. 13A to 13C are schematic views illustrating the thicknesses of thin films formed by a conventional thin film deposition apparatus and a thin film deposition apparatus according to an embodiment of the present invention. FIG. 13A illustrates the thicknesses of portions of a thin film 157 formed when barrier walls are arranged to be perpendicular to a direction in which second slits are arranged, i.e., a Y-axis direction, in a conventional thin film deposition apparatus. Specifically, FIG. 13A illustrates the thicknesses of the portions of the thin film 157 formed through a space between the first nozzle and the second nozzle partitioned by the adjacent barrier walls. Referring to FIG. 13A, the thickness of a central portion 1571 of the thin film 157 formed through the second slits is greater than the thicknesses of peripheral portions 1572 and 1573 of the thin film 157, whereas the thicknesses of circumferential portions 1574 and 1575 of the thin film 157 are greater than those of the peripheral portions 1572 and 1573 of the thin film 157. This is because a deposition material discharged through each of the adjacent first slits is mixed with the deposition material discharged through the other adjacent first slits during a deposition process. Thus, the thickness of the thin film 157 formed through the space between the first nozzle and the second nozzle partitioned by the adjacent barrier walls is non-uniform as shown in FIG. 13A.

However, in the thin film deposition apparatus 1100 of FIG. 11, the barrier walls 131 are arranged to be inclined with respect to the moving direction of the thin film deposition apparatus 1100 as described above. Thus, when deposition is performed while the thin film deposition apparatus 100 or the substrate 160 is moved in one direction, e.g., the Z-axis direction), as shown in FIG. 13B, thin films 157a, 157b, 157c, 157c, 157d, 157e, and 157f overlap with one another. As a result, the thickness of an overall thin film 158 including the overlapping thin films 157a through 157f formed through the space between the first nozzle 120 and the second nozzle 150 partitioned by the adjacent barrier walls 131 is uniform, as shown in FIG. 13C.

Accordingly, a thin film having a uniform thickness may be formed simply by arranging the barrier walls 131 to be inclined without having to use an additional correction plate, thereby simplifying a process of manufacturing the thin film deposition apparatus 1100 and reducing manufacturing costs thereof. The additional correction plate maintains the thickness uniformity of the deposited thin films by disturbing deposition of the deposition material 115, and thus, the deposition efficiency is reduced. However, according to the current embodiment, the thickness uniformity of the thin film is maintained simply by arranging the barrier walls 131 to be inclined without having to use an additional calibration plate, such that the deposition efficiency of the deposition material 115 may be improved.

Figure 14:
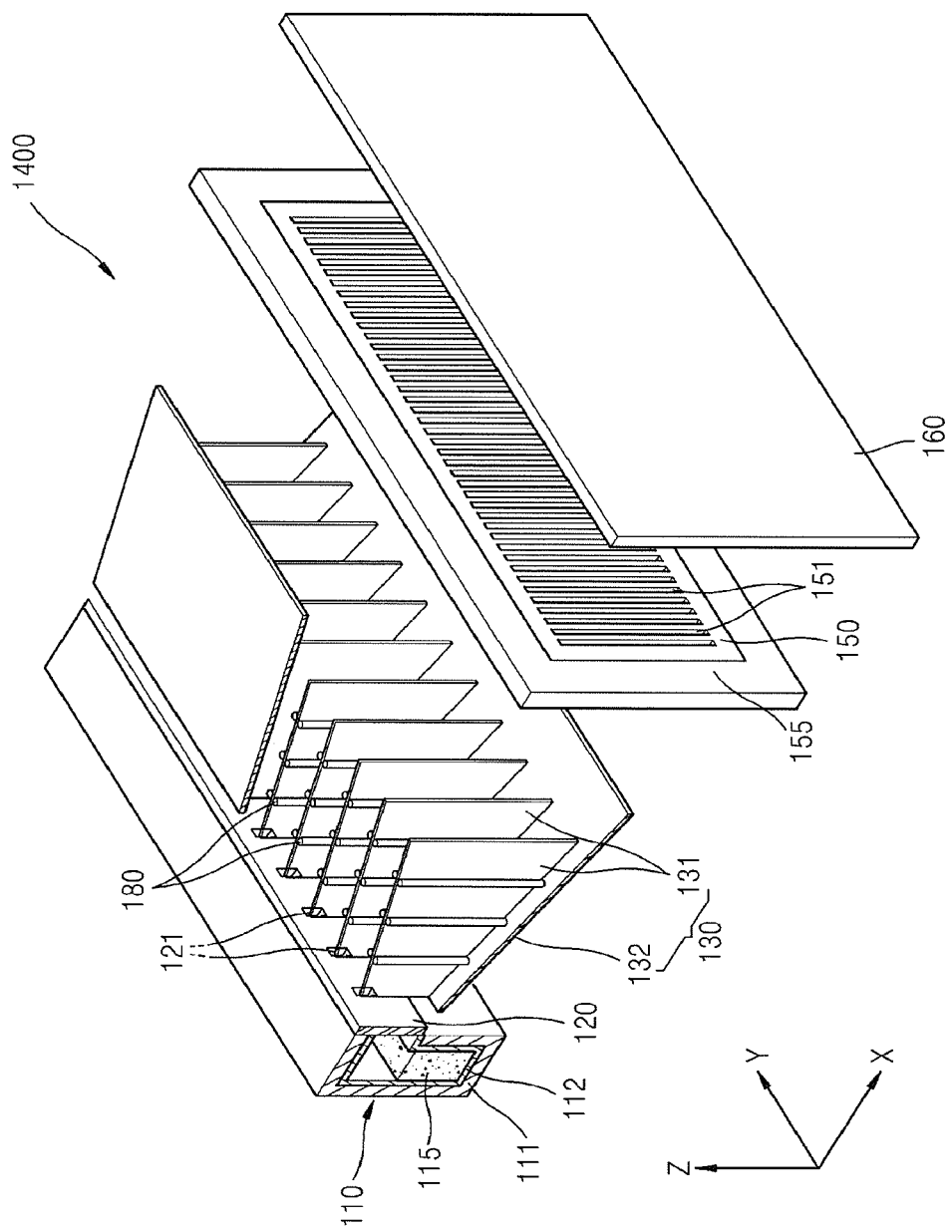
FIG. 14 is a schematic perspective view of a thin film deposition apparatus according to another embodiment of the present invention.
Figure 15:
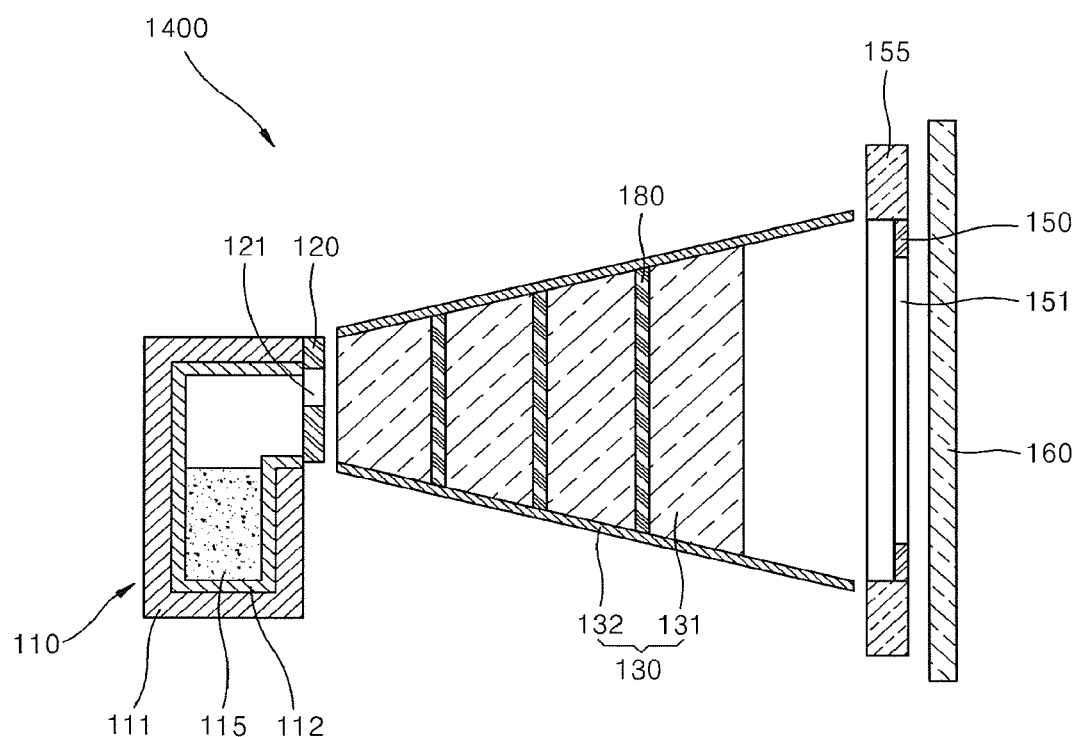
FIG. 15 is a schematic side view of the thin film deposition apparatus of FIG. 14.
Figure 16:
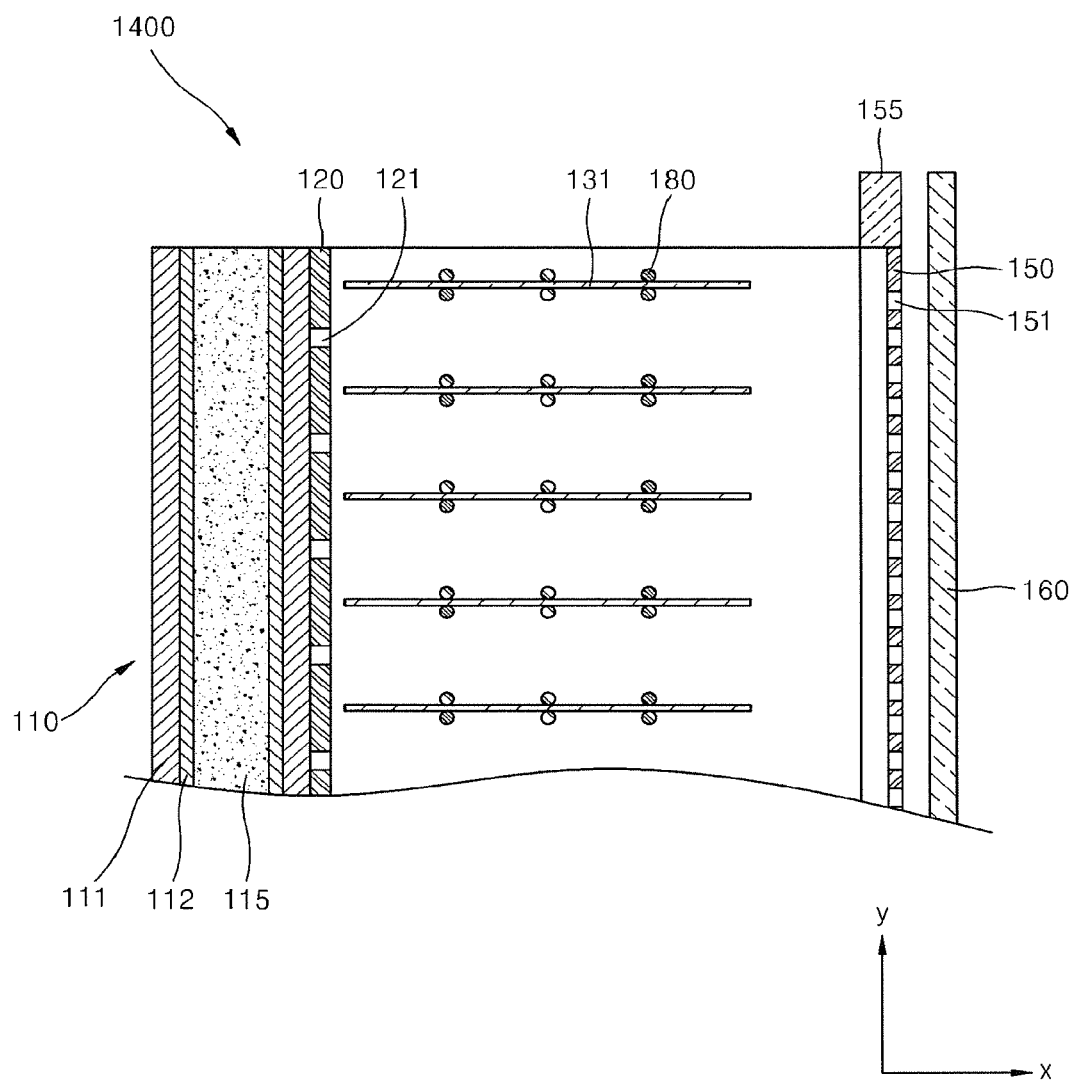
FIG. 16 is a schematic plan view of the thin film deposition apparatus of FIG. 14.

FIG. 14 is a schematic perspective view of a thin film deposition apparatus 1400 according to another embodiment of the present invention. FIG. 15 is a schematic side view of the thin film deposition apparatus 1400 of FIG. 14. FIG. 16 is a schematic plan view of the thin film deposition apparatus 1400 of FIG. 14.

Referring to FIGS. 14 to 16, the thin film deposition apparatus 1400 includes a deposition source 110, a first nozzle 120, a barrier wall assembly 130, and a second nozzle 150. A substrate 160 upon which a deposition material 115 is deposited is also shown. The thin film deposition apparatus 1400 is different from those according to the previous embodiments in that a plurality of radiation members 180 are further included.

In detail, the radiation members 180 may be disposed on barrier walls 131. The radiation members 180 may radiatively dissipate the heat of the barrier walls 131. The radiation members 180 may decrease the temperature of the second nozzle 150 by maintaining the barrier walls 131 at a predetermined temperature and radiatively dissipating the heat of the barrier walls 131. As illustrated in FIGS. 14 to 16, the radiation members 180 may contact external surfaces of the barrier walls 131. The radiation members 180 may be arranged on one external surface of each of the barrier walls 131 or on two opposite external surfaces of each of the barrier walls 131. The radiation members 180 may be cooling pipes. The radiation members 180 may extend in parallel in a Z-axis direction.

Figure 17:
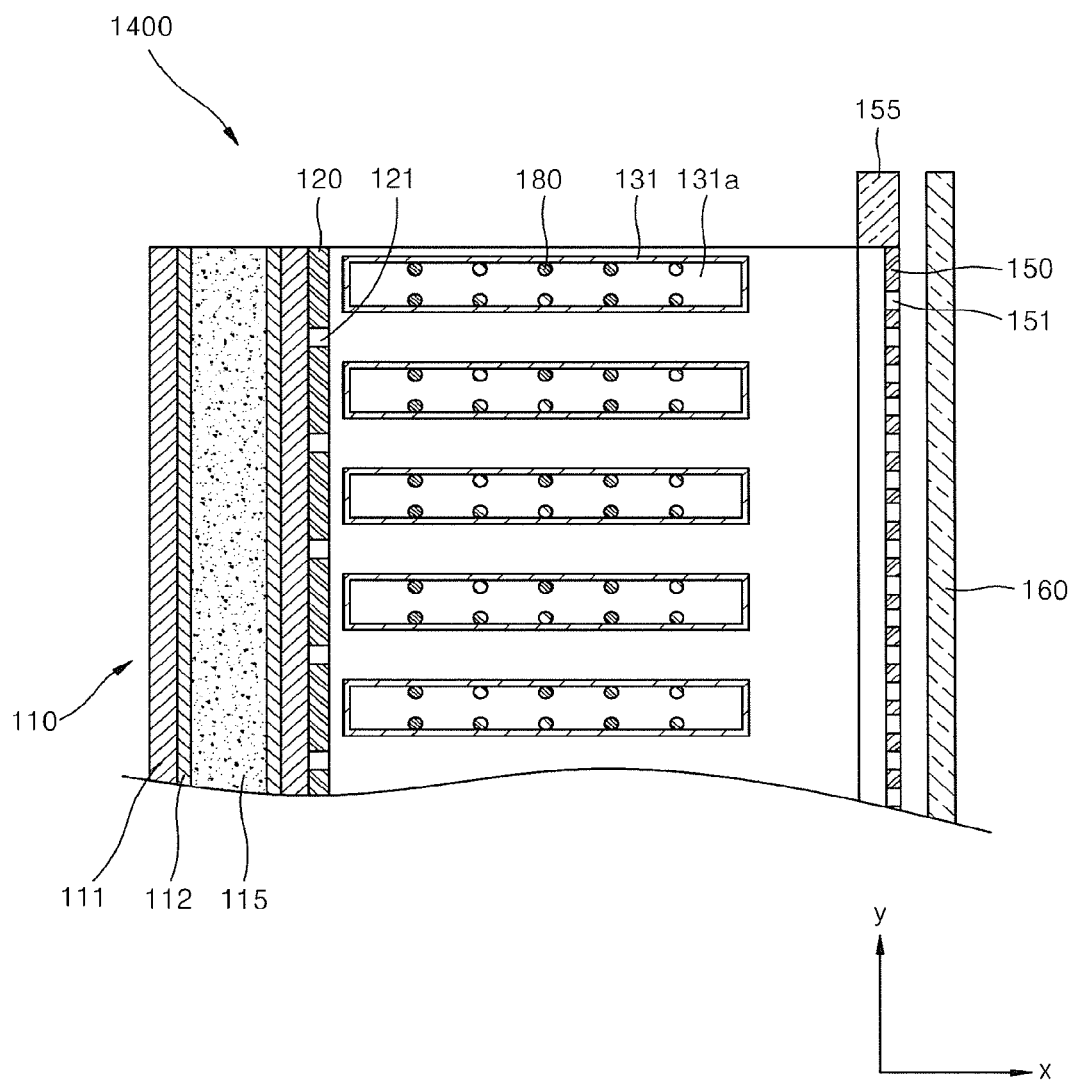
FIG. 17 is a schematic plan view of another embodiment of barrier walls included in the thin film deposition apparatus of FIG. 14, according to the present invention.

FIG. 17 is a schematic plan view of another embodiment of the barrier walls 131 included in the thin film deposition apparatus 1400 of FIG. 14, according to other aspects of the present invention. Referring to FIG. 17, the barrier walls 131 may include cavities 131a formed therein. Radiation members 180 may be disposed inside the barrier walls 131. In this regard, the radiation members 180 may contact internal surfaces of the barrier walls 131. If the radiation members 180 are disposed on the internal surfaces of the barrier walls 131, it is easy to recover the deposition material 115 adsorbed onto the barrier wall assembly 130 and to clean the inside of the barrier wall assembly 130. Although not shown in FIG. 17, the radiation members 180 may be disposed on the external surfaces of the barrier walls 131 or on both the internal and external surfaces thereof.

Figure 18:
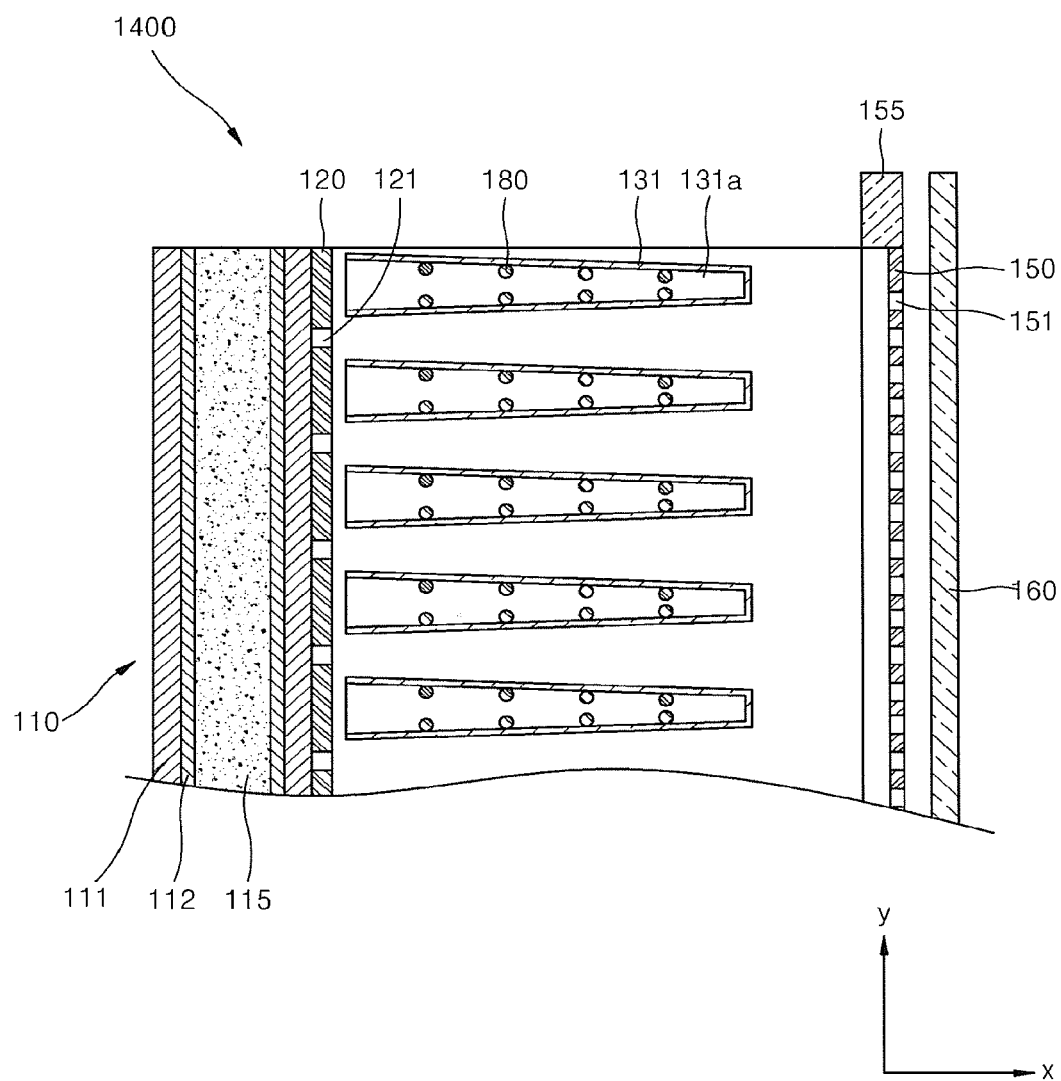
FIG. 18 is a schematic plan view of another embodiment of the barrier walls included in the thin film deposition apparatus of FIG. 14, according to the present invention.

FIG. 18 is a schematic plan view of another embodiment of the barrier walls 131 included in the thin film deposition apparatus 1400 of FIG. 14, according to aspects of the present invention. Referring to FIG. 18, each of the barrier walls 131 may be shaped to be tapered toward the second nozzle 150. Each of the barrier walls 131 may include a cavity 131a formed therein. The radiation members 180 may be disposed within the barrier walls 131. In this regard, the radiation members 180 may contact internal surfaces of the barrier walls 131. Although not shown in FIG. 18, the radiation members 180 may be disposed on external surfaces of the barrier walls 131 or on both the internal and external surfaces thereof.

Figure 19:
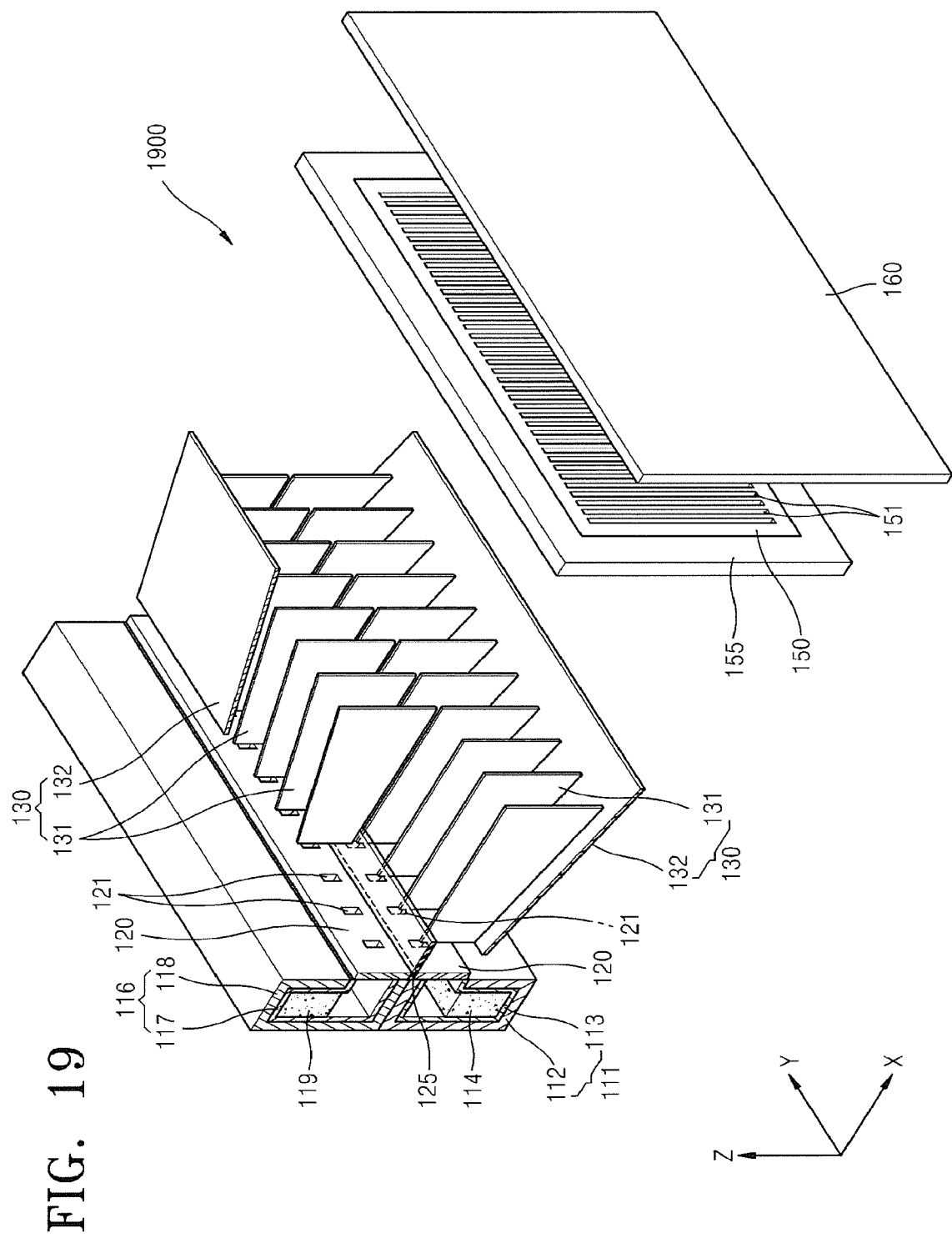
FIG. 19 is a schematic perspective view of a thin film deposition apparatus according to another embodiment of the present invention.
Figure 20:
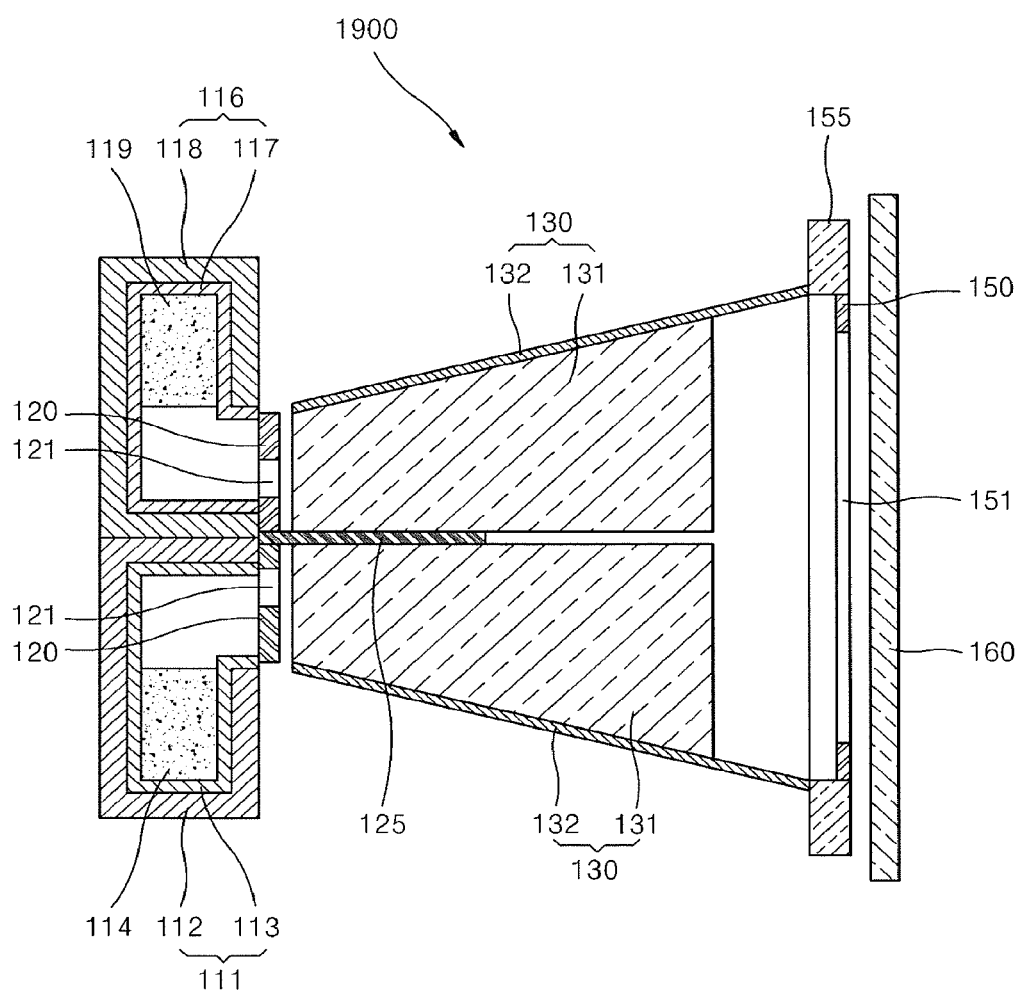
FIG. 20 is a schematic side view of the thin film deposition apparatus of FIG. 19.
Figure 21:
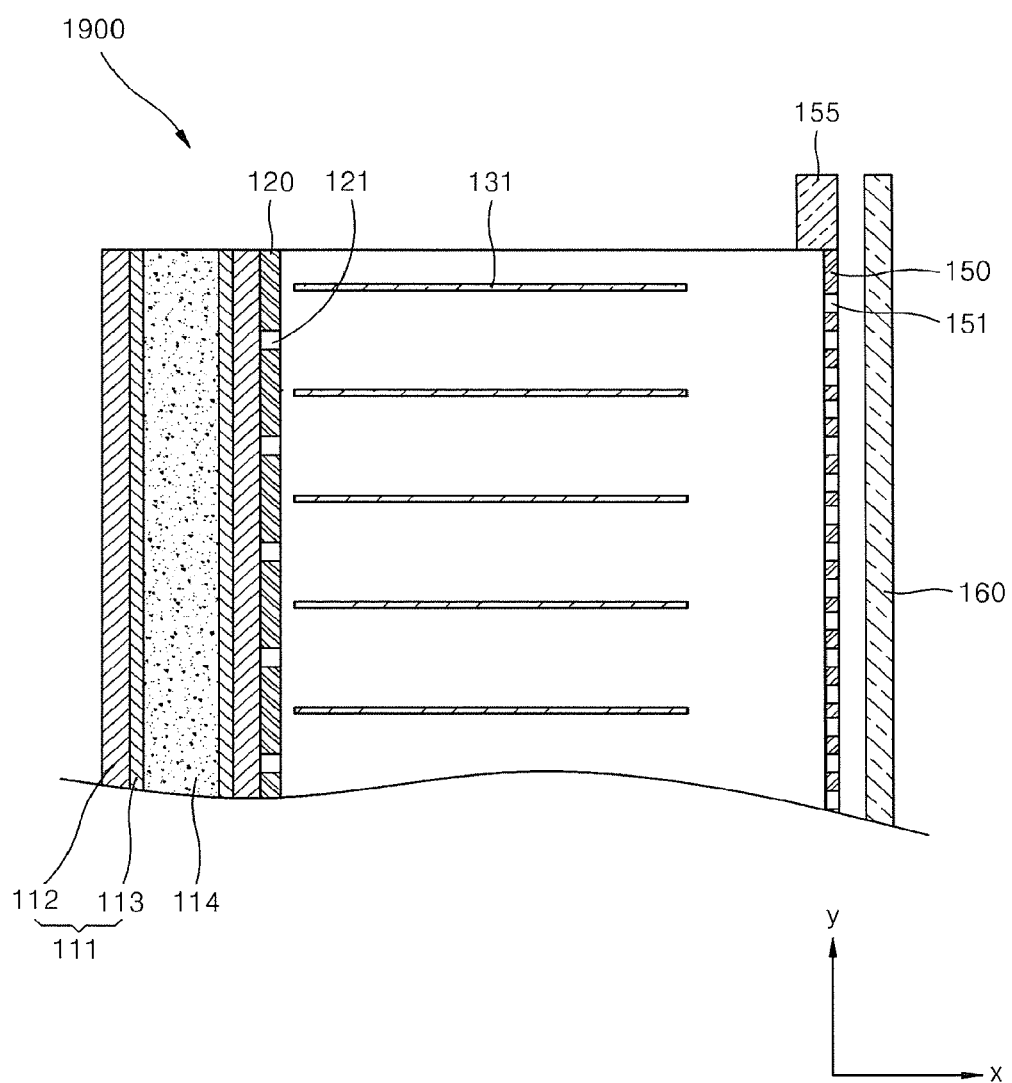
FIG. 21 is a schematic plan view of the thin film deposition apparatus of FIG. 19.

FIG. 19 is a schematic perspective view of a thin film deposition apparatus 1900 according to another embodiment of the present invention. FIG. 20 is a schematic side view of the thin film deposition apparatus 1900 of FIG. 19. FIG. 21 is a schematic plan view of the thin film deposition apparatus 1900 of FIG. 19.

Referring to FIGS. 19 to 21, the thin film deposition apparatus 1900 includes a first deposition source 111, a second deposition source 116, first nozzles 120, a barrier wall assembly 130, a second nozzle 150, and a second nozzle frame 155. A substrate 160 upon which a host material 114 and a dopant material 119 are deposited is also shown.

In particular, the first deposition source 111 that contains and heats the host material 114 and the second deposition source 116 that contains and heats the dopant material 119 are disposed in an opposite side of the chamber to that in which the substrate 160 is disposed. As the host material 114 and the dopant material 119 are vaporized in the first and second deposition sources 111 and 116, respectively, the host material 114 and the dopant material 119 are deposited on the substrate 160. The first deposition source 111 includes a crucible 112 that is filled with the host material 114, and a heater 113 that heats the crucible 112 to vaporize the host material 114, which is contained in the crucible 112, towards a side of the crucible 112, and particularly, towards the first nozzles 120. The second deposition source 116 includes a crucible 117 that is filled with the dopant material 119, and a heater 118 that heats the crucible 117 to vaporize the dopant material 119, which is contained in the crucible 117, towards a side of the crucible 117, and particularly, towards the first nozzles 120.

The host material 114 and the dopant material 119 are simultaneously deposited on the substrate 160.

The first nozzles 120 are disposed at a side of the first deposition source 111 and the second deposition source 116, and particularly, at the side of the first deposition source 111 and the second deposition source 116 facing the substrate 160. The first nozzles 120 include a plurality of first slits 121 that may be arranged at equal intervals in a Y-axis direction. The host material 114 vaporized in the first deposition source 111 and the dopant material 119 vaporized in the second deposition source 116 pass through the first nozzles 120 towards the substrate 160.

A separation member 125 is disposed between the first nozzles 120 to control the mixing amounts of the host material 114 vaporized in the first deposition source 111 and the dopant material 119 vaporized in the second deposition source 116.

Referring to FIGS. 19 and 20, an upper first nozzle 120 is disposed at a side of the first deposition source 111, a lower nozzle 120 is disposed at a side of the second deposition source 116, and the separation member 125 is disposed between the upper and lower first nozzles 120; however, the present invention is not limited thereto. That is, one first nozzle 120 may be used, wherein the first nozzle 120 includes two rows of first slits 121, one end of which is connected to the separation member 125. The first nozzle 120 may also have various other shapes.

Also, the barrier walls 131 are divided into two separate portions respectively disposed at a side of the first deposition source 111 and a side of the second deposition source 116, and the separation member 125 is disposed between the two portions of the barrier walls 131, but the present invention is not limited thereto. That is, the barrier walls 131 may be integrally formed with each other and have a groove into which the separation member 125 is inserted, and may also have various other shapes.

The first deposition source 111 and the second deposition source 116 of the thin film deposition apparatus 1900 according to an embodiment of the present invention will now be described in more detail.

As described above, the thin film deposition apparatus 1900 includes the first deposition source 111 to deposit the host material 114 and the second deposition source 116 to deposit the dopant material 119. Thus the host material 114 and the dopant material 119 may be simultaneously deposited on the substrate 160. Since the sublimation temperatures of the host material 114 and the dopant material 119 are different from each other, a plurality of deposition sources and first nozzles are required in order simultaneously deposit the host material 114 and the dopant material 119. In this regard, the first deposition source 111 in which the host material 114 is vaporized has to be insulated from the second deposition source 116 in which the dopant material 119 is also vaporized in order to inhibit whichever of the first and second deposition sources 111 and 116 has a lower sublimation temperature from being heated by the other deposition source having a higher sublimation temperature.

Figure 22:
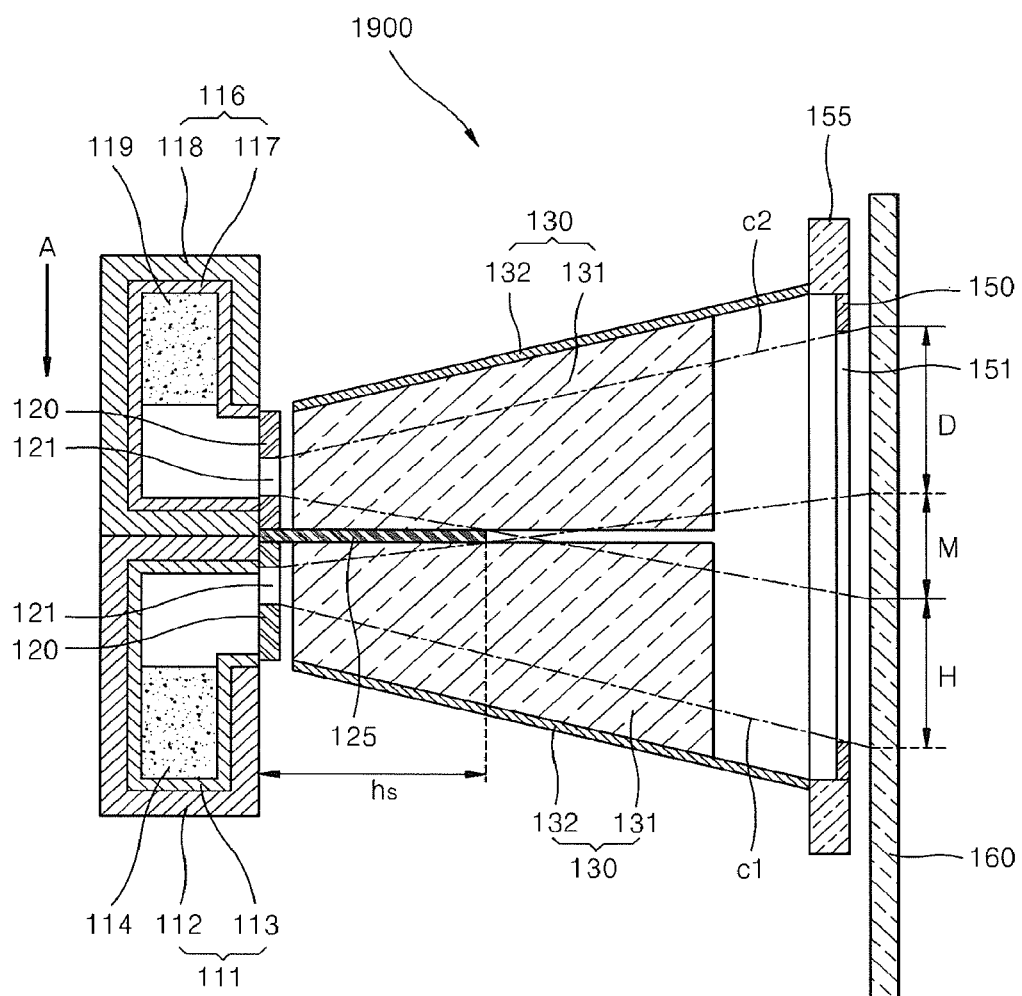
FIG. 22 is a schematic view illustrating a process of manufacturing a thin film by using the thin film deposition apparatus of FIG. 19, according to an embodiment of the present invention.
Figure 23:
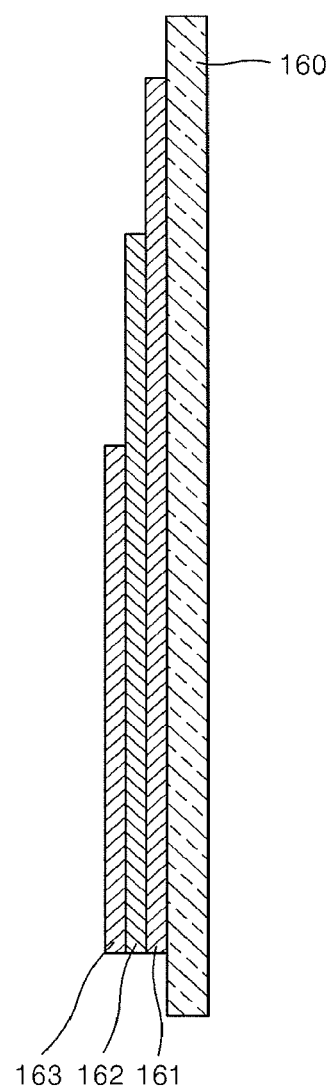
FIG. 23 illustrates thin films formed on a substrate according to the process of FIG. 22, according to an embodiment of the present invention.

FIG. 22 is a schematic view illustrating a process of manufacturing a thin film by using the thin film deposition apparatus 1900 of FIG. 19, according to an embodiment of the present invention. FIG. 23 illustrates thin films formed on a substrate according to the process of FIG. 22, according to an embodiment of the present invention.

Referring to FIGS. 22 and 23, deposition is performed while the entire thin film deposition apparatus 1900 that includes the first deposition source 111 to deposit the host material 114 and the second deposition source 116 to deposit the dopant material 119 is moved relative to the substrate 160 in the direction of an arrow A along the Z-axis. However, the present invention is not limited to this, and the substrate 160 may be moved while the thin film deposition apparatus 100 is fixed.

The first deposition source 111 deposits the host material 114 on the substrate 160 by discharging the host material 114 to form a first discharge region C1 having a fan-shape with a predetermined angle. The second deposition source 116 deposits the dopant material 119 on the substrate 160 by discharging the dopant material 119 to form a second discharge region C2 having a fan-shape with a predetermined angle. In this regard, since the first discharge region C1 and the second discharge region C2 overlap with each other in a predetermined portion of the space between the first nozzles 120 and the second nozzle 150, the substrate 160 includes an area, corresponding to a host deposition region H, in which only the host material 114 is deposited, an area, corresponding to an overlap region M, in which the host material 114 and the dopant material 119 are mixed, and an area, corresponding to a dopant deposition region D, in which only the dopant material 119 is deposited.

In this regard, the width of the overlap region M may be determined by a length $h_s$ of the separation member 125 in the X-axis direction. That is, if the length $h_s$ of the separation member 125 increases, the width of the overlap region M decreases. On the other hand, if the length $h_s$ of the separation member 125 decreases, the width of the overlap region M increases. In other words, the width of the overlap region M may be controlled by the length $h_s$ of the separation member 125.

As described above, deposition is performed while the entire thin film deposition apparatus 100 that includes the first deposition source 111 to deposit the host material 114 and the second deposition source 116 to deposit the dopant material 119 is moved relative to the substrate 160 in the direction of the arrow A along the Z-axis. In this regard, initially, the first deposition source 111 and the second deposition source 116 perform deposition outside the uppermost portion of the substrate 160. Then, as the thin film deposition apparatus 100 is moved in the direction of the arrow A along the Z-axis, the deposition material is sequentially deposited in the host deposition region H, the overlap region M, and the dopant deposition region D.

Thus, a first thin film 161 that is formed of only the host material 114 is formed in an area of the substrate 160 corresponding to the host deposition region H of. Subsequently, a second thin film 162 that is formed as a mixture layer of the host material 114 and the dopant material 119 is formed on the first thin film 161 since the overlap region M passes the area of the substrate 160 on which the first thin film 161 is formed. Then, a third thin film 163 that is formed of only the dopant material 119 is formed on the second thin film 162 since the dopant deposition region D passes the area of the substrate 160 on which the first and second thin films 161 and 162 are formed.

Referring to FIG. 23, the first thin film 161, the second thin film 162, and the third thin film 163 may be simultaneously performed by moving the first deposition source 111 and the second deposition source 116 only once from the uppermost portion to the lowermost portion of the substrate 160. Thus, the manufacturing process is simply and quickly performed. Since the depositions of the first thin film 161, the second thin film 162, and the third thin film 163 are simultaneously performed, the chamber is not required to be exhausted between the depositions of the first thin film 161 and the second thin film 162, and between the depositions of the second thin film 162 and the third thin film 163.

The thicknesses of the first thin film 161, the second thin film 162, and the third thin film 163 may be determined by the area of the host deposition region H, the overlap region M, and the dopant deposition region D. Thus, the thicknesses are determined by the length $h_s$ of the separation member 125.

Although FIG. 23 illustrates that the first thin film 161, the second thin film 162, and the third thin film 163 are sequentially stacked in such an order, the present invention is not limited thereto. That is, the third thin film 163, the second thin film 162, and the first thin film 161 may be sequentially stacked in this order.

Examples of the host material 114 may include tris(8-hydroxy-quinolinato)aluminum (Alq3), 9,10-di(naphth-2-yl)anthracene (ADN), 3-tert-butyl-9,10-di(naphth-2-yl)anthracene (TBADN), 4,4'-bis(2,2-diphenyl-ethene-1-yl)-4,4'-dimethylphenyl (DPVBi), 4,4'-bis(2,2-diphenyl-ethene-1-yl)-4,4'-dimethylphenyl (p-DMDPVBi), tert(9,9-diarylfluorene)s (TDAF), 2-(9,9'-spirobifluorene-2-yl)-9,9'-spirobifluorene (BSDF), 2,7-bis(9,9'-spirobifluorene-2-yl)-9,9'-spirobifluorene (TSDF), bis(9,9-diarylfluorene)s (BDAF), 4,4'-bis(2,2-diphenyl-ethene-1-yl)-4,4'-di-(tert-butyl)phenyl (p-TDPVBi), 1,3-bis(carbazol-9-yl)benzene (mCP), 1,3,5-tris(carbazol-9-yl)benzene (tCP), 4,4',4"-tris(carbazol-9-yl)triphenylamine (TcTa), 4,4'-bis(carbazol-9-yl)biphenyl (CBP), 4,4'-bis(9-carbazolyl)-2,2'-dimethyl-biphenyl (CBDP), 4,4'-bis(carbazol-9-yl)-9,9-dimethyl-fluorene (DMFL-CBP), 4,4'-bis(carbazol-9-yl)-9,9-bis(9-phenyl-9H-carbazol)fluorene (FL-4CBP), 4,4'-bis(carbazol-9-yl)-9,9-di-tolyl-fluorene (DPFL-CBP), 9,9-bis(9-phenyl-9H-carbazol)fluorene (FL-2CBP), etc.

Examples of the dopant material 119 may include DPAVBi (4,4'-bis[4-(di-p-tolylamino)styryl]biphenyl), ADN (9,10-di(naph-2-tyl)anthracene), TBADN (3-tert-butyl-9,10-di(naph-2-tyl)anthracene), etc.

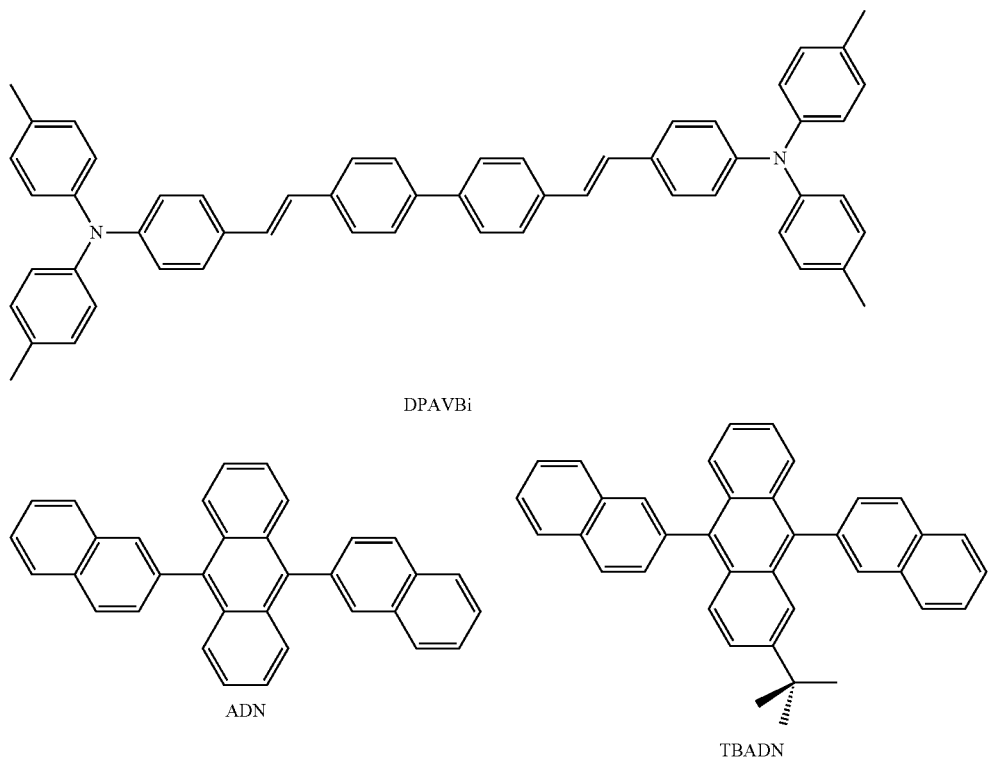

The second thin film 162 that is a mixture layer of the host material 114 and the dopant material 119 is formed by simultaneously depositing the host material 114 and the dopant material 119 by using the first and second deposition sources 111 and 116. The amount of the dopant material 119 may vary according to the material that is used to form the second thin film 161, but may be in the range of about 3 to 20 parts by weight based on 100 parts by weight of the material used to form the second thin film 162, i.e., the total weight of the host material 114 and the dopant material 119. If the amount of the dopant material 119 is not within the range described above, the emission properties of an organic light-emitting display device including the second thin film 162 may be deteriorated.

As described above, if the first thin film 161 formed of only the host material 114 and the third thin film 163 formed of only the dopant material 119 are respectively disposed on both sides of the second thin film 162 formed of the mixture of the host material 114 and the dopant material 119, then color coordinates, luminous efficiency, and lifetime characteristics of an organic light-emitting display device including the first to third thin films 161 to 163 may be improved and driving voltage may be reduced.

Figure 24:
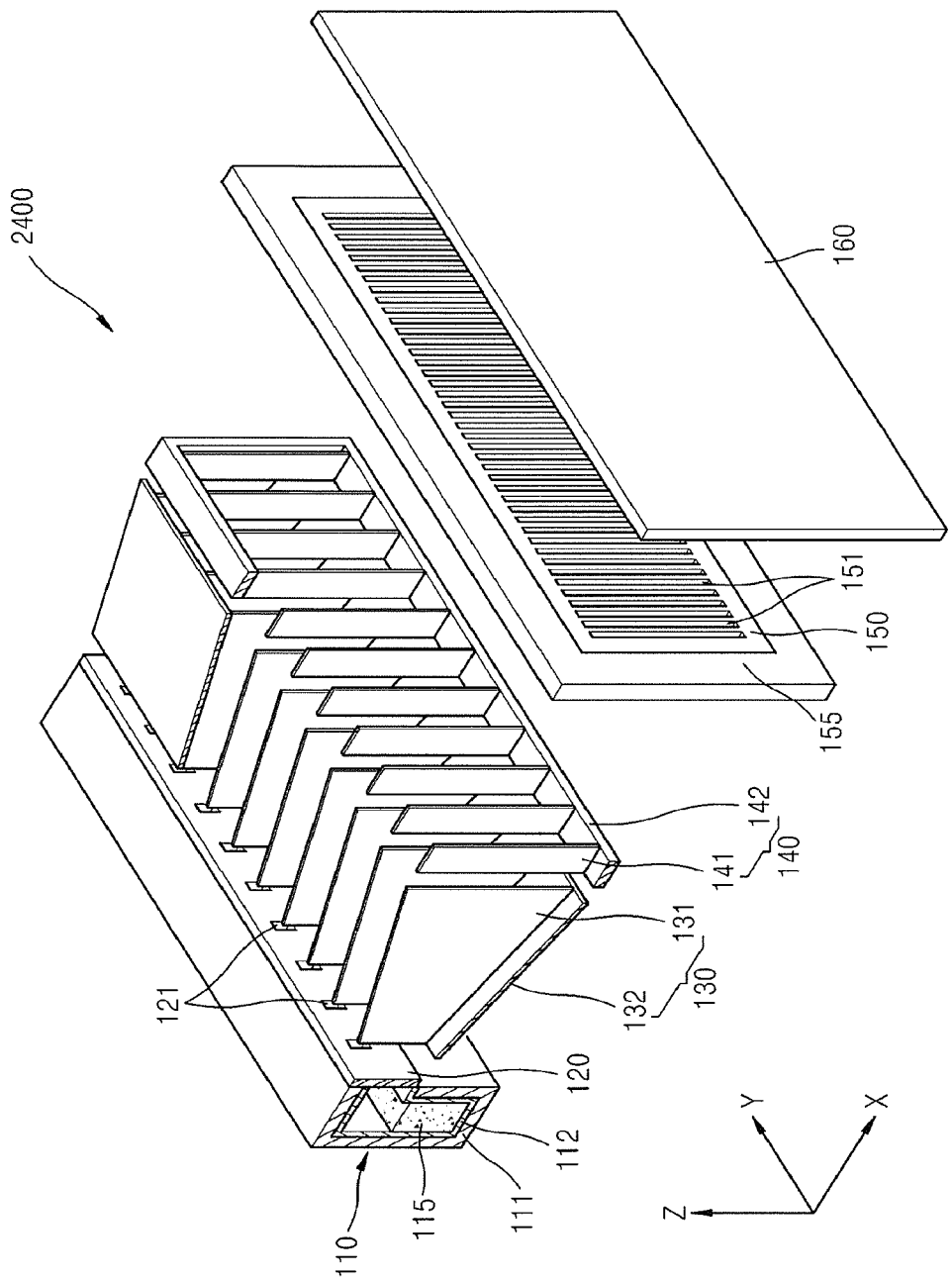
FIG. 24 is a schematic perspective view of a thin film deposition apparatus according to another embodiment of the present invention.
Figure 25:
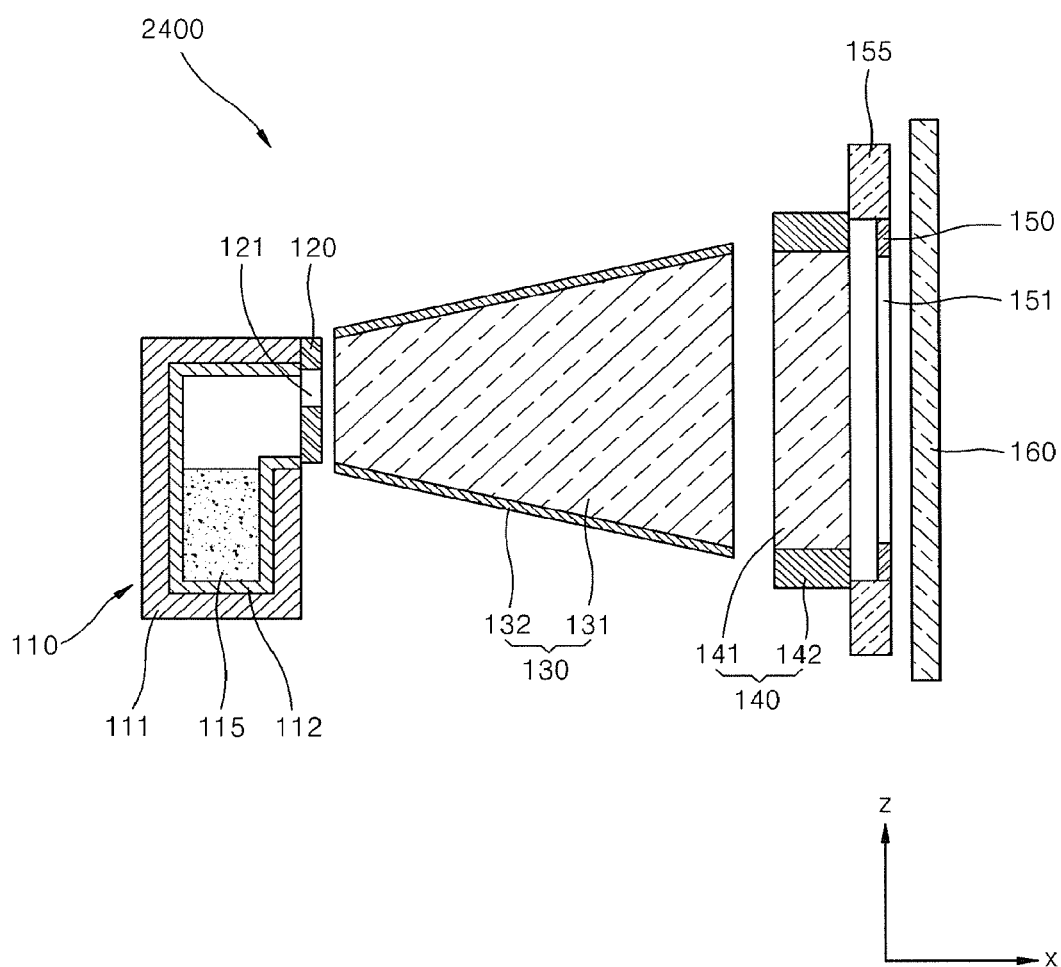
FIG. 25 is a schematic side view of the thin film deposition apparatus of FIG. 24.
Figure 26:
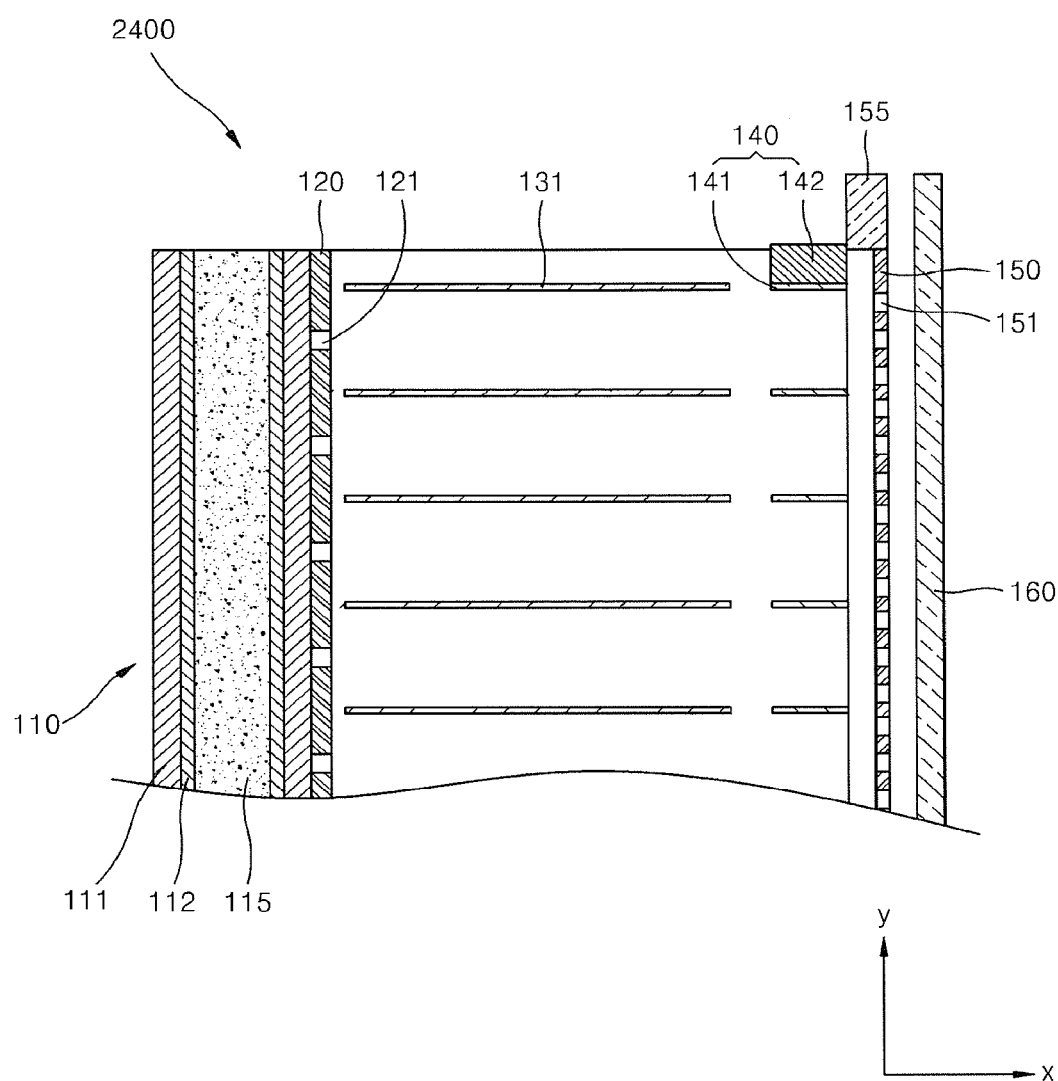
FIG. 26 is a schematic plan view of the thin film deposition apparatus of FIG. 1.

FIG. 24 is a schematic perspective view of a thin film deposition apparatus 2400 according to another embodiment of the present invention. FIG. 25 is a schematic side view of the thin film deposition apparatus 2400 of FIG. 24. FIG. 26 is a schematic plan view of the thin film deposition apparatus 2400 of FIG. 24.

Referring to FIGS. 24 to 26, the thin film deposition apparatus 2400 includes a deposition source 110, a first nozzle 120, a first barrier wall assembly 130, a second barrier wall assembly 140, a second nozzle 150, and a second nozzle frame 155. A substrate 160 upon which a deposition material 115 is deposited is also shown. According to other aspects of the present invention, the thin film deposition apparatus 100 may include additional and/or different components, such as in the examples described below.

Although a chamber is not illustrated in FIGS. 24 to 26 for convenience of explanation, all the components of the thin film deposition apparatus 2400 may be disposed within a chamber that is maintained at an appropriate degree of vacuum. The chamber is maintained at an appropriate vacuum in order to allow the deposition material 115 to move in a substantially straight line through the thin film deposition apparatus 2400.

The substrate 160 is disposed in the chamber. The deposition source 110 that contains and heats the deposition material 115 is disposed in an opposite side of the chamber to the side in which the substrate 160 is disposed. The deposition source 110 includes a crucible 111 and a heater 115.

The first nozzle 120 is disposed at a side of the deposition source 110 facing the substrate 160. The first nozzle 120 includes a plurality of first slits 121 that may be arranged at equal intervals in a Y-axis direction. The deposition material 115 that is vaporized in the deposition source 110 passes through the first nozzle 120 towards the substrate 160.

The first barrier wall assembly 130 is disposed at a side of the first nozzle 120. The first barrier wall assembly 130 includes a plurality of first barrier walls 131 and a first barrier wall frame 132 that covers an outer wall of the first barrier walls 131.

The second barrier wall assembly 140 is disposed at a side of the first barrier wall assembly 130. The second barrier wall assembly 140 includes a plurality of second barrier walls 141 and a second barrier wall frame 142 that covers an outer wall of the second barrier walls 141.

The second nozzle 150 and the second nozzle frame 155 are disposed between the deposition source 110 and the substrate 160. The second nozzle frame 155 may be formed in a lattice shape, similar to a window frame. The second nozzle 150 is bound inside the second nozzle frame 155. The second nozzle 150 includes a plurality of second slits 151 that may be arranged at equal intervals in the Y-axis direction.

The thin film deposition apparatus 2400 according to the current embodiment is different from the thin film deposition apparatuses 100, 700, 700', 1100, 1400, and 1900 according to the previous embodiments in that the first barrier wall assembly 130 and the second barrier wall assembly 140 are included.

Specifically, the plurality of first barrier walls 131 may be arranged parallel to each other in the Y-axis direction. The plurality of first barrier walls 131 may be arranged at equal intervals. In addition, each of the first barrier walls 131 may be formed to extend along an XZ plane in FIG. 24, i.e., perpendicular to the Y-axis direction.

The plurality of second barrier walls 141 may be arranged parallel to each other in the Y-axis direction. The plurality of second barrier walls 141 may be arranged at equal intervals. In addition, each of the second barrier walls 141 may be formed to extend along the XZ plane in FIG. 24, i.e., perpendicular to the Y-axis direction.

The first barrier walls 131 and second barrier walls 141 arranged as described above partition the deposition space between the first nozzle 120 and the second nozzle 150. In the thin film deposition apparatus 2400, the deposition space is divided by the first barrier walls 131 and second barrier walls 141 into sub-deposition spaces that respectively correspond to the first slits 121 through which the deposition material 115 is discharged.

The second barrier walls 141 may be disposed to correspond to the first barrier walls 131, respectively. In other words, the second barrier walls 141 and the first barrier walls 131 may be aligned with each other in parallel. That is, each pair of the corresponding first and second barrier walls 131 and 141 may be located on the same plane. Since the space between the first nozzle 120 and the second nozzle 150 is partitioned by the first barrier walls 131 and the second barrier walls 141 that are disposed parallel to each other, the deposition material 115 discharged through one of the first slits 121 is not mixed with the deposition material 115 discharged through the other first slits 121 and is deposited on the substrate 160 through the second slits 151. The first barrier walls 131 and the second barrier walls 141 guide the deposition material 115 discharged through the first slits 121 so as not to flow in the Y-axis direction.

Although the first barrier walls 131 and the second barrier walls 141 are respectively illustrated as having the same thickness in the Y-axis direction, aspects of the present invention are not limited thereto. The second barrier walls 141, which should be accurately aligned with the second nozzle 150, may be formed to be relatively thin, whereas the first barrier walls 131, which do not need to be precisely aligned with the second nozzle 150, may be formed to be relatively thick. This makes it easier to manufacture the thin film deposition apparatus 2400.

In the thin film deposition apparatus 2400, the first barrier wall assembly 130 and the second barrier wall assembly 140 may be disposed to be separated from each other by a predetermined distance. For example, the first barrier wall assembly 130 and the second barrier wall assembly 140 are separated from each other for the following reasons.

First, the second barrier walls 141 and the second nozzle 150 should be precisely aligned with each other, whereas it is unnecessary to precisely align the first barrier walls 131 and the second barrier walls 141. Thus, high-precision control may be easily achieved by separating a part required to be precisely controlled from a part not required to be precisely controlled.

Second, the second barrier walls 141 and the second nozzle 150 should be aligned with the substrate 160 to be accurate in position and to have a constant interval therebetween, and thus may require high-precision control. Thus, in order to make it easy to control such parts that require high-precision control, the second barrier wall assembly 140 and the second nozzle 150 are separated from the deposition source 110, the first nozzle 120, and the first barrier wall assembly 130, which are relatively heavy parts not requiring precise control.

Third, the temperature of the first barrier wall assembly 130 may increase to 100° C. or higher due to the high temperature of the deposition source 110. In order to prevent the heat of the first barrier wall assembly 130 from being conducted to the second barrier wall assembly 140 and the second nozzle 150, the first barrier wall assembly 130 and the second barrier wall assembly 140 are separated from each other.

Fourth, when the second nozzle 150 is separated from the chamber, it may be more straightforward to separate both the second nozzle 150 and the second barrier wall assembly 140 together than to separate only the second nozzle 150. In order to make it more straightforward to separate the second nozzle 150 and the second barrier wall assembly 140 together from the chamber, the first barrier wall assembly 130 and the second barrier wall assembly 140 are separated from each other.

Fifth, in the thin film deposition apparatus 2400, the deposition material 115 adhered to the first barrier wall assembly 130 is mostly reused, whereas the deposition material 115 adhered to the second barrier wall assembly 140 and the second nozzle 150 may not be reused. Thus, when the first barrier wall assembly 130 is separated from the second barrier wall assembly 140 and the second nozzle 150, it may be straightforward to recover the deposition material 115 to be reused.

A calibration plate (not shown; see the calibration plates 1900 of FIG. 7) may be further installed in order to ensure uniformity of a thin film over the entire substrate 160. When the first barrier wall assembly 130 is separated from the second barrier wall assembly 140, it is very straightforward to install the calibration plate.

Finally, a partition (not shown) may be further installed in order to prevent deposition of the deposition material 115 on the second nozzle 150 after deposition onto the substrate 160 has been completed and before another target is subjected to deposition. This may extend a nozzle exchange cycle. It is straightforward to install the partition between the first barrier walls 131 and the second barrier walls 141. To this end, the first barrier wall assembly 130 and the second barrier wall assembly 140 are separated from each other.

Figure 27:
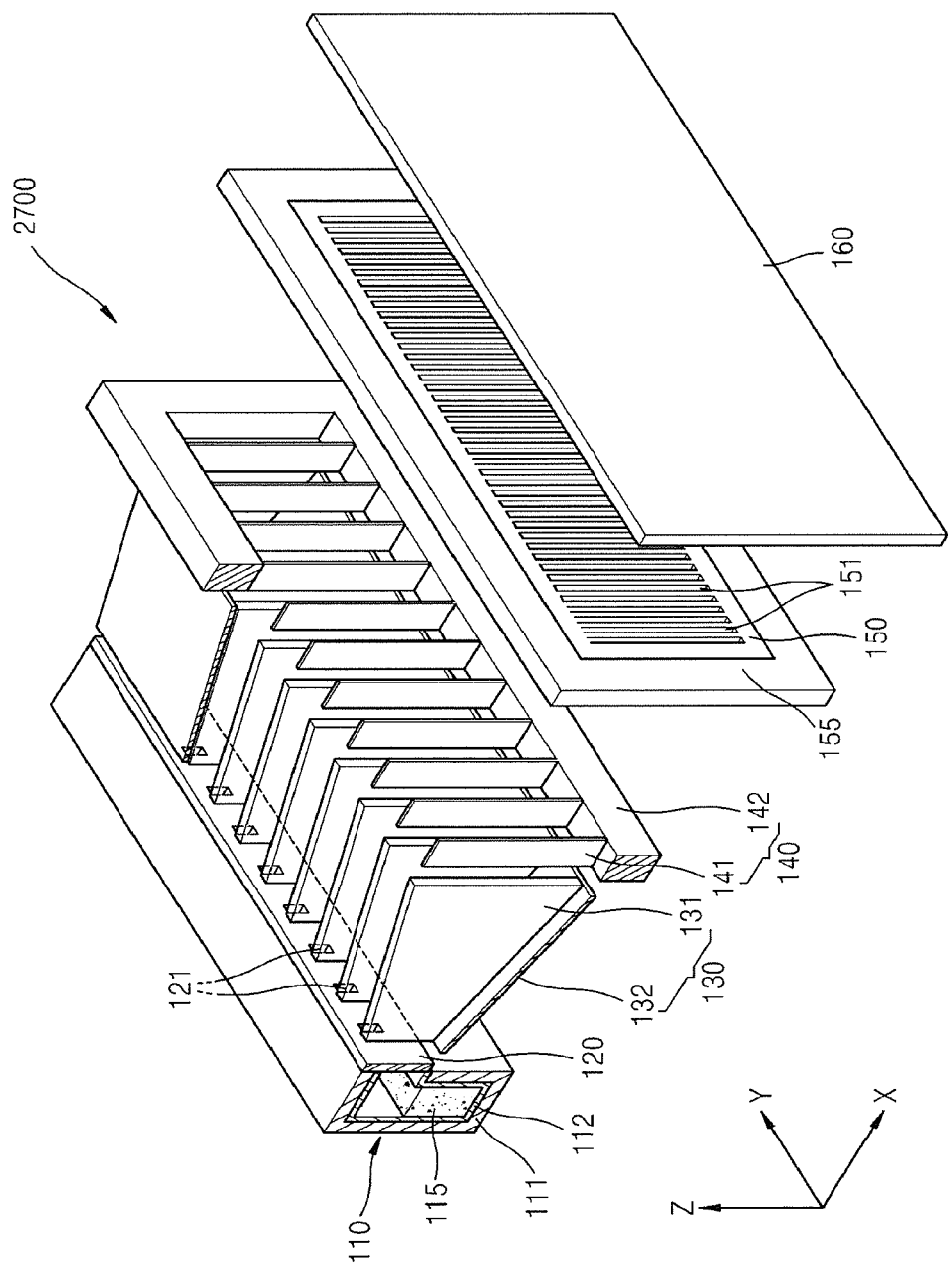
FIG. 27 is a schematic perspective view of a thin film deposition apparatus according to another embodiment of the present invention.
Figure 28:
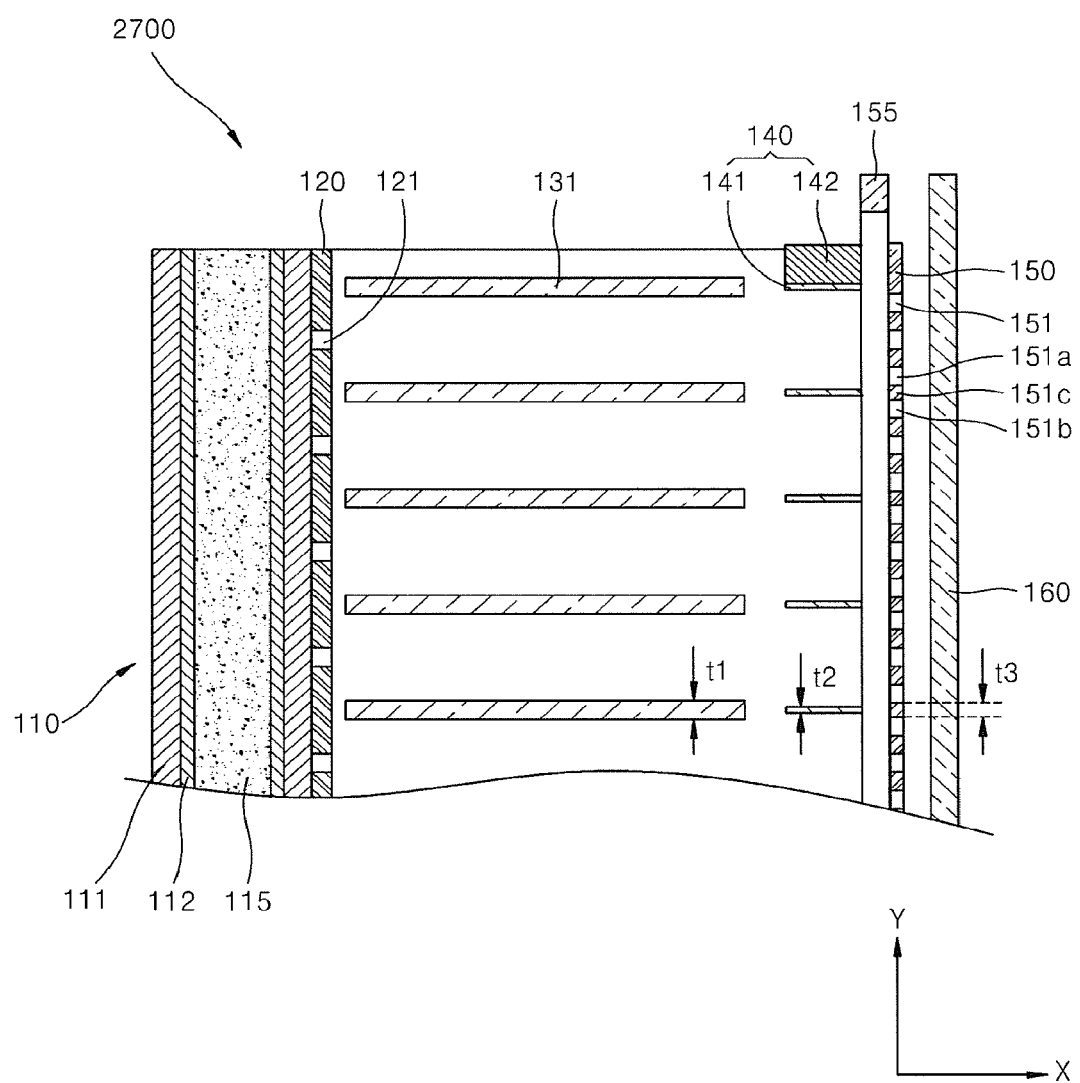
FIG. 28 is a schematic plan view of the thin film deposition apparatus of FIG. 27.

FIG. 27 is a schematic perspective view of a thin film deposition apparatus 2700 according to another embodiment of the present invention. FIG. 28 is a schematic plan view of the thin film deposition apparatus 2700 of FIG. 27.

Referring to FIGS. 27 and 28, the thin film deposition apparatus 2700 includes a deposition source 110, a first nozzle 120, a first barrier wall assembly 130, a second barrier wall assembly 140, a second nozzle 150, and a second nozzle frame 155. A substrate 160 upon which a deposition material 115 is deposited is also shown. The thin film deposition apparatus 2700 is different from those according to the previous embodiments in that a thickness of a plurality of first barrier walls 131 is greater than a thickness of a plurality of second barrier walls 141.

Referring to FIG. 28, a thickness t1 of each of the first barrier walls 131 may be greater than a thickness t2 of each of the second barrier walls 132. Specifically, the thickness t1 of each of the first barrier walls 131 in the Y-axis direction may be greater than the thickness t2 of each of the second barrier walls 141 in the Y-axis direction. In other words, the second barrier walls 141, which need to be precisely aligned with the second nozzle 150, may be formed to be relatively thin, whereas the first barrier walls 131, which do not need to be precisely aligned with the second nozzle 150, may be formed to be relatively thick. This makes it easier to manufacture the thin film deposition apparatus 2700. The first barrier walls 131 may be easily aligned with the second barrier walls 141 by forming the thickness t1 of each of the first barrier walls 131 to be greater than the thickness t2 of each of the second barrier walls 141.

The thickness t2 of each of the second barrier walls 141 may be less than a space 151c between two adjacent second slits 151a and 151b. Each of the second barrier walls 141 may be disposed in the space 151c between two adjacent second slits 151a and 151b. Each of the second barrier walls 141 may be located at the midpoint in the space 151c between two adjacent second slits 151a and 151b. Since the second slits 151 correspond to patterns that are to be deposited, respectively, pattern errors may occur if the second barrier walls 141 are aligned with the second slits 151. Thus, the thickness t2 of each of the second barrier walls 141 is formed to be less than the space 151c between two adjacent second slits 151a and 151b in order to precisely align the second barrier walls 141 with the second nozzle 150.

Also, the space 151c between two adjacent second slits 151a and 151b may be formed to be greater than the thickness t2 of each of the second barrier walls 141 in the Y-axis direction and to be less than the thickness t1 of each of the first barrier walls 131 in the Y-axis direction, thereby precisely aligning the first barrier walls 131, the second barrier walls 141, and the second nozzle 150 with one another.

Figure 29:
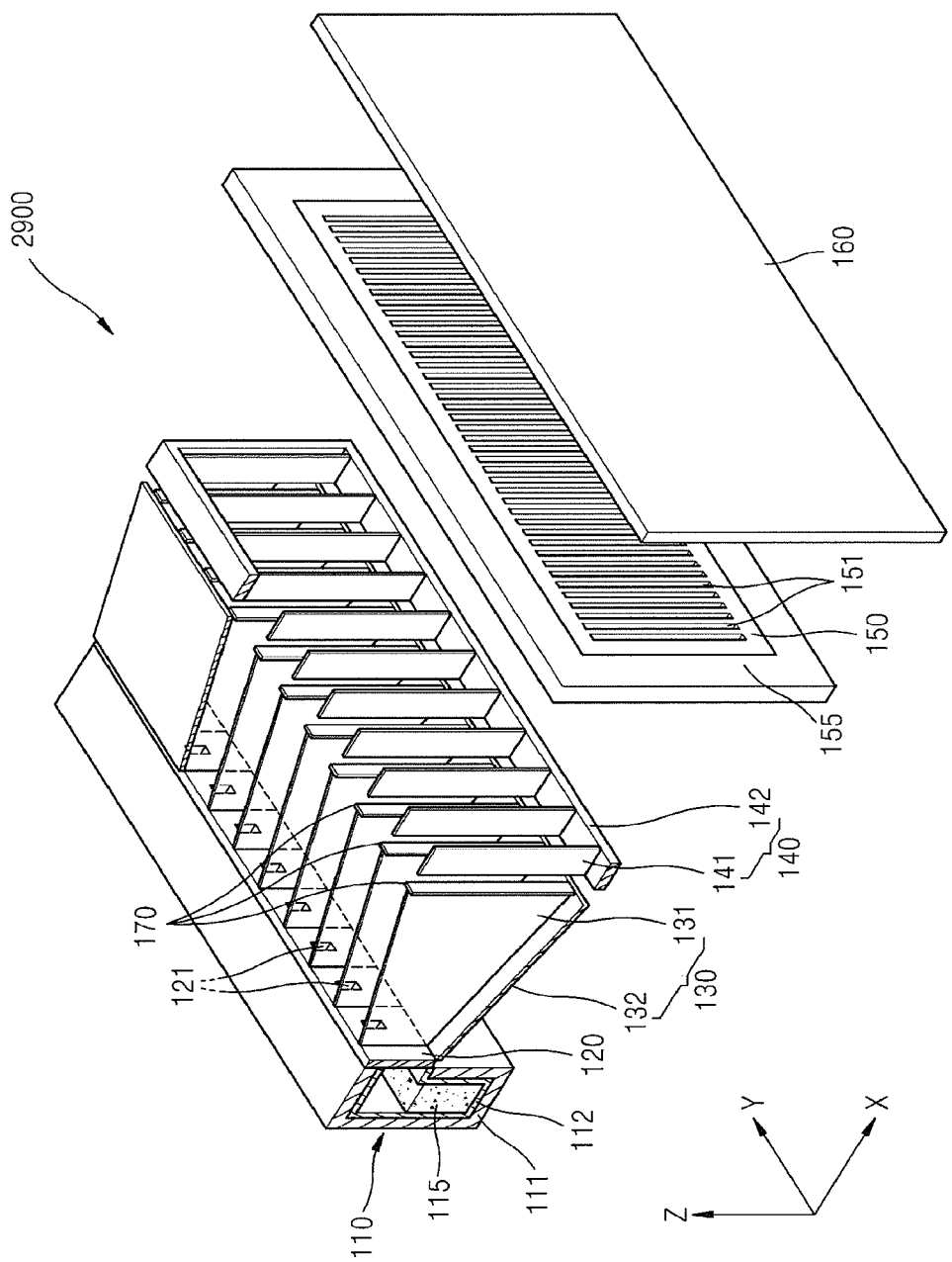
FIG. 29 is a schematic perspective view of a thin film deposition apparatus according to another embodiment of the present invention.
Figure 30:
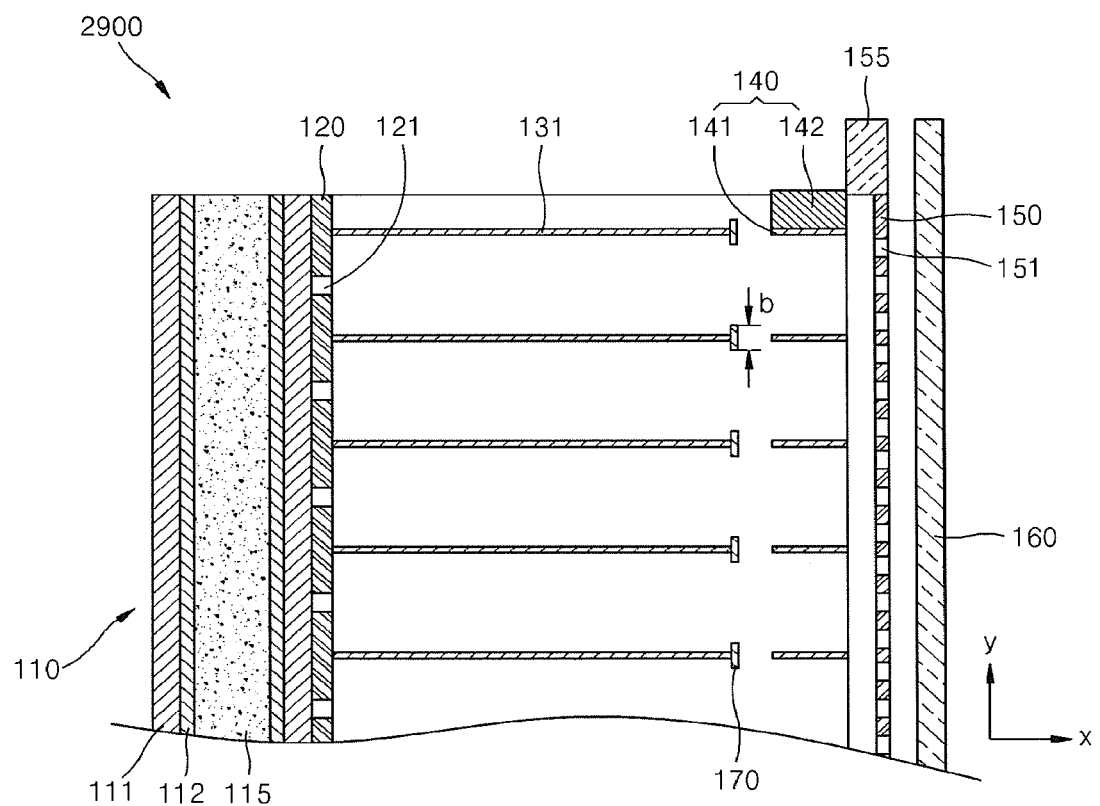
FIG. 30 is a schematic plan view of the thin film deposition apparatus of FIG. 29.

FIG. 29 is a schematic perspective view of a thin film deposition apparatus 2900 according to another embodiment of the present invention. FIG. 30 is a schematic plan view of the thin film deposition apparatus 2900 of FIG. 29.

Referring to FIGS. 29 and 30, the thin film deposition apparatus 2900 includes a deposition source 110, a first nozzle 120, a first barrier wall assembly 130, a second barrier wall assembly 140, and a second nozzle 150. A substrate 160 upon which a deposition material 115 is deposited is also shown. The thin film deposition apparatus 2900 is different from those according to the previous embodiments in that barriers 170 are further included between first barrier walls 131 and second barrier walls 141 that are separated apart from each other.

Each of the barriers 170 has a predetermined width b in the Y-axis direction and a predetermined length in a Z-axis direction, and is disposed on the end portion of a respective first barrier wall 131. The first barrier walls 131 and the second barrier walls 141 should be separated from each other by a predetermined distance for various reasons as described above. The predetermined distance is determined by the width b of the barriers 170.

Specifically, the deposition material 115 vaporized in the deposition source 110 is deposited on the substrate 160 by being discharged through the first nozzle 120 and the second nozzle 150. Since the space between the first nozzle 120 and the second nozzle 150 is partitioned by the first barrier wall assembly 130 and the second barrier wall assembly 140, the deposition material 115 discharged through each of the first slits 121 of the first nozzle 120 should not be mixed with the deposition material 115 discharged through the other adjacent first slits 121 due to the first barrier wall assembly 130 and the second barrier wall assembly 140. However, since the first barrier walls 131 are separated from the second barrier walls 141 by a distance w, the deposition material 115 discharged through each of the first slits 121 may be moved to other adjacent partitioned spaces.

However, in the thin film deposition apparatus 2700, since the barriers 170 having the predetermined width b are disposed on the end portions of the first barrier walls 131, the deposition material 115 discharged through each of the first slits 121 of the first nozzle 120 is not mixed with the deposition material 115 discharged through the other adjacent first slits 121 due to the first barrier walls 131, the barriers 170, and the second barrier walls 141. The width b of each of the barriers 170 may be adjusted by the distance w between the first barrier walls 131 and the second barrier walls 141. For example, as the distance w between the first barrier walls 131 and the second barrier walls 141 is reduced, the width b of the barriers 170 is also reduced. However, if the distance w between the first barrier walls 131 and the second barrier walls 141 is less than an appropriate distance, a calibration plate (not shown) is likely to collide with the first barrier walls 131 and the second barrier walls 141 when the calibration plate is installed to ensure the uniformity of a thin film formed on the substrate 160. Thus, the distance w may be maintained at the appropriate distance or greater.

Figure 31:
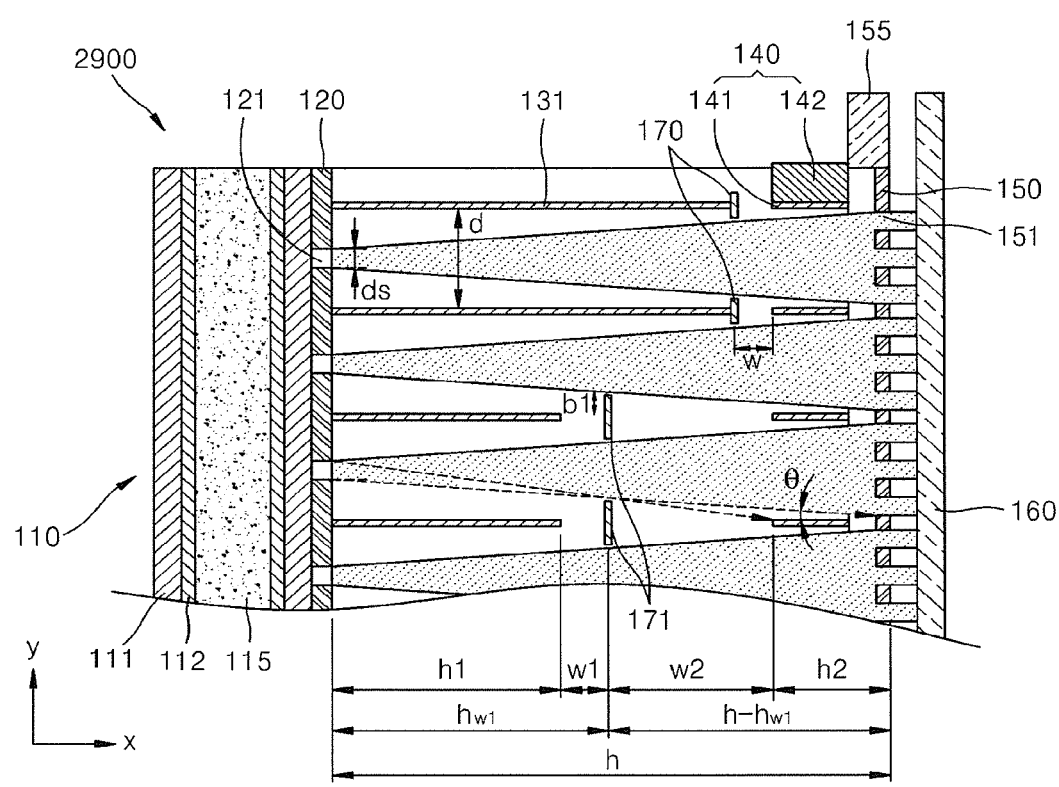
FIGS. 31 through 33 are schematic plan views of various embodiments of barriers included in the thin film deposition apparatus of FIG. 29, according to another embodiment of the present invention.
Figure 32:
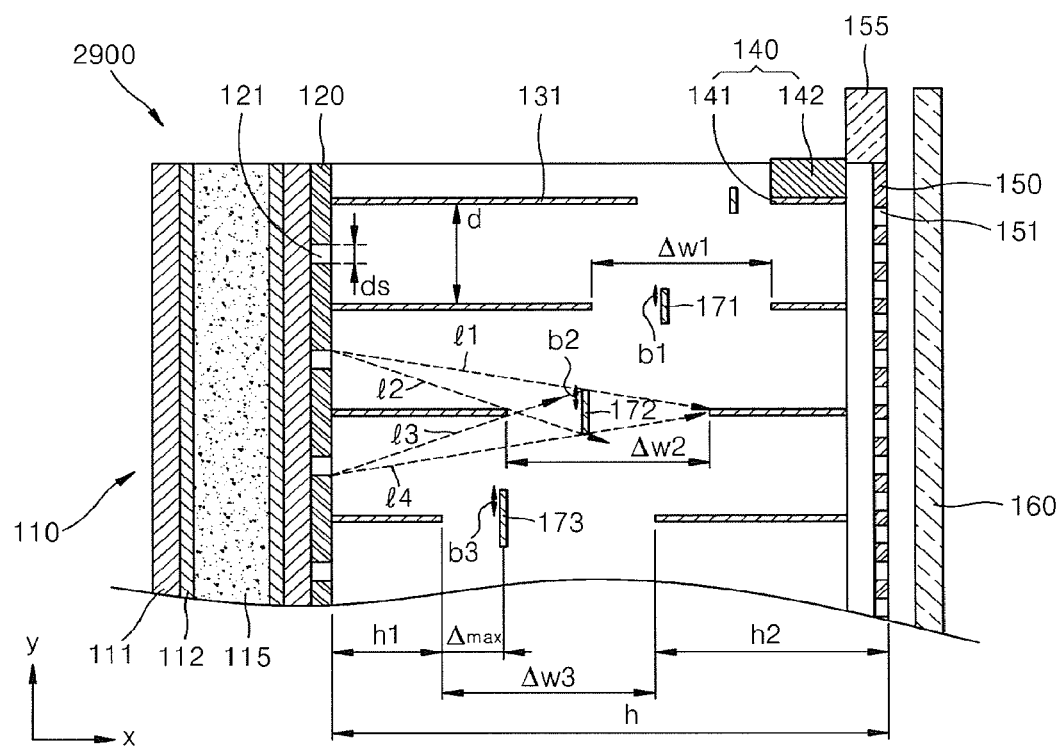
Figure 33:
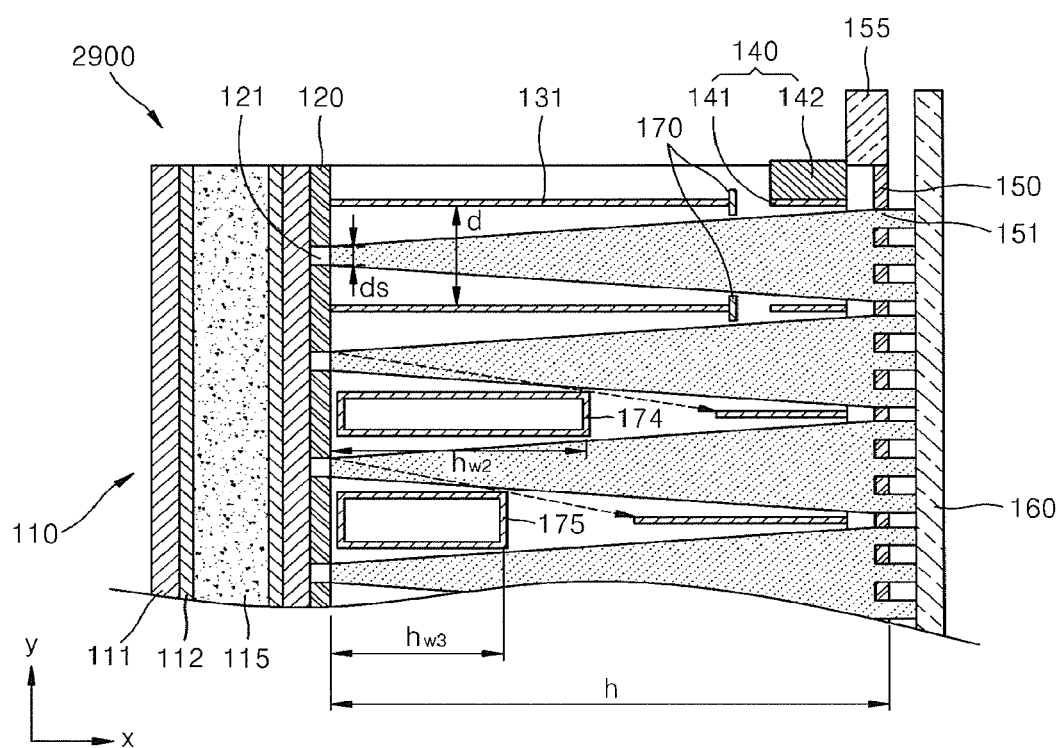

FIGS. 31 through 33 are schematic plan views of various embodiments of the barriers 170 included in the thin film deposition apparatus of FIG. 29, according to aspects of the present invention.

Referring to FIG. 31, some barriers 170 are adhered closely to the end portions of the first barrier walls 131; however, some other barriers 171 are disposed apart from the end portions of the first barrier walls 131 by a predetermined distance. The barriers 170 and 171 are installed to prevent the deposition material 115 discharged through each of the first slits 121 from being mixed with the deposition material 115 discharged through the other adjacent first slits 121. Since the barriers 170 are not necessarily adhered closely to the end portions of the first barrier walls 131, the barriers 170 and 171 may be disposed at any position between the first barrier walls 131 and the second barrier walls 141. In addition, although not illustrated in FIGS. 31 to 33, the barriers 170 and 171 may be disposed on end portions of the second barrier walls 141 facing the first barrier walls 131.

A half width b1 of each of the barriers 171 disposed apart from the first barrier walls 131 is determined by:

$$b1 < (h-hw1)\tan \theta = (h-hw1)(d-ds)/2h,$$

where h denotes a distance between the first nozzle 120 and the second nozzle 150, hw1 denotes a distance between the first nozzle 120 and the barrier 171, d denotes a distance between adjacent barrier walls 131, and ds denotes a width of the first slits 121.

Here, b1 is the maximum half-width of the barriers 171, and generally satisfies the following:

0<<half-width of the barrier<b1

In the thin film deposition apparatus 2900, the first barrier walls 131 and the second barrier walls 141 should be separated from each other for the above described reasons. It is not possible to reduce a length h2 of the second barrier walls 141 without a limitation, when considering a degree of precision in processing components, a degree of precision in aligning the components, and fine thermal expansion caused by a temperature rise. However, it is advantageous that the length h2 of the second barrier walls 141 is reduced as much as possible so that the second barrier walls 141 may be aligned with the substrate 160 with high precision and may be controlled precisely. If the maximum half-width 131 of the barriers 171 is calculated according to Equation 3, the value of hw1+w2 may be nearly the same as h such that the length h2 of the second barrier walls 141 may be designed to be sufficiently short.

FIG. 32 is a schematic plan view of barriers 171 to 173 which are separated from the first barrier walls 131 in the thin film deposition apparatus 2900 of FIG. 29, according to another embodiment of the present invention. Referring to FIG. 32, when distances $\Delta w1$, $\Delta w2$, and $\Delta w3$ between the first barrier walls 131 and the second barrier walls 141 vary, half-widths b1, b2, b3 of the barriers 171, 172, and 173 also vary. For example, as the distance between the first barrier walls 131 and the second barrier walls 141 increases ($\Delta w1 < \Delta w2 < \Delta w3$), the half-widths b1, b2, and b3 of the barriers 171, 172, and 173 also increase (b1<b2<b3).

Although in FIG. 32, the length h2 of the second barrier wall 141 corresponding to the barrier 173 is greater than the length h1 of the first barrier wall 131 opposite to the corresponding second barrier wall 141, FIG. 32 exemplarily shows the relation between the distances $\Delta w1$, $\Delta w2$, and $\Delta w3$ between the first barrier walls 131 and the second barrier walls 141 and the half-widths b1, b2, and b3 of the barriers 171, 172, and 173. As described above, the length h2 of the second barrier walls 141 may be designed to be as small as possible.

Referring to FIG. 32, when the maximum half-widths of the barriers 171, 172, and 173 are determined, a maximum separation distance Amax from the end portion of the first barrier walls 131 to the barriers 171, 172, and 173 may be calculated. For example, the maximum half-width b2 of the barrier 172 is determined by dotted lines l1, l2, l3, and l4, which denote paths of the deposition material 115 discharged through the first slits 121 adjacent to the first barrier wall 131. If the length h1 of the first barrier wall 131 is determined in this case, the maximum separation distance Amax from the end portion of the first barrier wall 131 to the barrier 173 may be calculated.

FIG. 33 is a schematic plan view of barriers 170, 174, and 175 formed integrally with the first barrier walls 131 included in the thin film deposition apparatus 2900, according to another embodiment of the present invention. Referring to FIG. 33, the first barrier walls 131 may be designed to have the same width as that of barriers 174 and 175. In this case, lengths hw2 and hw3 from the first nozzle 120 to one end of the barriers 174 and 175 may be the lengths of the first barrier walls 131.

In FIGS. 31 through 33, barriers having different shapes from each other are installed in one thin film deposition apparatus 2900; however, the present invention is not limited thereto. That is, the thin film deposition apparatus 2900 may include barriers having the same shapes as each other or barriers having different shapes from each other.

Although a few embodiments of the present invention have been shown and described, it would be appreciated by those of ordinary skill in the art that changes may be made in the embodiments without departing from the principles and spirit of the invention, the scope of which is defined in the claims and their equivalents.

What is claimed is:

1. A thin film deposition apparatus to form a thin film on a substrate, the thin film deposition apparatus comprising:
    a deposition source to discharge a deposition material;
    a first nozzle disposed at a side of the deposition source and including a plurality of first slits arranged in a first direction;
    a second nozzle disposed opposite to the first nozzle and including a plurality of second slits arranged in the first direction; and
    a barrier wall assembly including a plurality of barrier walls arranged in the first direction between the first nozzle and the second nozzle so as to partition a space between the first nozzle and the second nozzle into a plurality of sub-deposition spaces, wherein a number of the plurality of first slits is different from a number of the plurality of second slits, and a number of the plurality of barrier walls adjacent to the second nozzle is the same as that adjacent to the first nozzle and is different from the number of the plurality of second slits.

2. The thin film deposition apparatus of claim 1, further comprising a plurality of calibration plates disposed between the first nozzle and the second nozzle and blocking at least one portion of the deposition material discharged from the deposition source.

3. The thin film deposition apparatus of claim 1, wherein deposition is performed while the deposition source, the first nozzle, the second nozzle, and the barrier wall assembly are moved relative to the substrate, and
    the barrier walls are inclined with respect to a moving direction of the thin film deposition apparatus.

4. A thin film deposition apparatus to form a thin film on a substrate, the thin film deposition apparatus comprising:
    a deposition source to discharge a deposition material;
    a first nozzle disposed at a side of the deposition source and including a plurality of first slits arranged in a first direction;
    a second nozzle disposed opposite to the first nozzle and including a plurality of second slits arranged in the first direction; and
    a barrier wall assembly including a plurality of barrier walls arranged in the first direction between the first nozzle and the second nozzle so as to partition a space between the first nozzle and the second nozzle into a plurality of sub-deposition spaces, wherein a number of the plurality of first slits is different from a number of the plurality of second slits,
    wherein the barrier walls are inclined with respect to the first direction.

5. The thin film deposition apparatus of claim 1, further comprising a plurality of radiation members to cool the barrier walls.

6. The thin film deposition apparatus of claim 1, wherein the deposition source comprises:
    a first deposition source to discharge a host material; and
    a second deposition source disposed parallel to the first deposition source to discharge a dopant material.

7. The thin film deposition apparatus of claim 6, further comprising a separation member disposed between the first deposition source and the second deposition source, and limiting a range of the host material discharged from the first deposition source and the dopant material discharged from the second deposition source.

8. The thin film deposition apparatus of claim 1, wherein the number of the plurality of first slits is smaller than the number of the plurality of second slits.

9. The thin film deposition apparatus of claim 1, wherein a width of each of the plurality of first slits is different from a width of each of the plurality of second slits in the first direction.

10. The thin film deposition apparatus of claim 1, wherein some of the plurality of second slits are between ones adjacent to each other among the plurality of first slits.

11. A thin film deposition apparatus to form a thin film on a substrate, the thin film deposition apparatus comprising:
- a deposition source;
- a first nozzle and a second nozzle disposed at a side of the deposition source to face each other, wherein a plurality of slits are formed in the first and second nozzles in a first direction;
- a first barrier wall assembly including a plurality of first barrier walls arranged between the first nozzle and the second nozzle; and
- a second barrier wall assembly including a plurality of second barrier walls arranged between the first barrier walls and the second nozzle,
- wherein the second nozzle is separated from the substrate by a predetermined distance, and
- the deposition source, the first nozzle, the second nozzle, the first barrier wall assembly, and the second barrier wall assembly are movable relative to the substrate, and
- wherein a number of the plurality of slits formed in the first nozzle is different from a number of the plurality of slits formed in the second nozzle, and a number of the plurality of second barrier walls adjacent to the second nozzle is the same as a number of the plurality of first barrier walls adjacent to the first nozzle and is different from the number of the plurality of slits formed in the second nozzle.

12. The thin film deposition apparatus of claim 11, wherein a width of the second barrier walls in the first direction is less than an interval between two adjacent slits formed in the second nozzle.

13. The thin film deposition apparatus of claim 11, wherein an interval between two adjacent slits formed in the second nozzle is greater than a width of the second barrier walls in the first direction and is less than a width of the first barrier walls in the first direction.

14. The thin film deposition apparatus of claim 11, wherein each of the second barrier walls is located between two adjacent slits formed in the second nozzle.

15. The thin film deposition apparatus of claim 14, wherein each of the second barrier walls is located at a midpoint between two adjacent slits formed in the second nozzle.

16. The thin film deposition apparatus of claim 11, wherein the number of the plurality of slits formed in the first nozzle is smaller than the number of the plurality of slits formed in the second nozzle.

17. The thin film deposition apparatus of claim 11, wherein some of the plurality of slits formed in the second nozzle are between ones adjacent to each other among the plurality of slits formed in the first nozzle.

\* \* \* \* \*